US012575227B2

(12) United States Patent
Choi et al.

(10) Patent No.: US 12,575,227 B2
(45) Date of Patent: Mar. 10, 2026

(54) DISPLAY DEVICE COMPRISING A COMMON CONNECTION ELECTRODE UNDERNEATH THE PARTITION WALL

(71) Applicant: Samsung Display Co., LTD., Yongin-si (KR)

(72) Inventors: Jin Woo Choi, Seoul (KR); Min Woo Kim, Hwaseong-si (KR); Sung Kook Park, Suwon-si (KR); Jin Taek Park, Seoul (KR); Sung Eun Baek, Suwon-si (KR); Dae Ho Song, Hwaseong-si (KR); Hyung Il Jeon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 833 days.

(21) Appl. No.: 17/655,325

(22) Filed: Mar. 17, 2022

(65) Prior Publication Data

US 2022/0352424 A1     Nov. 3, 2022

(30) Foreign Application Priority Data

Apr. 30, 2021   (KR) ........................ 10-2021-0056296
Jan. 5, 2022   (KR) ........................ 10-2022-0001728

(51) Int. Cl.
*H10H 20/831*        (2025.01)
*H10H 20/01*         (2025.01)
        (Continued)
(52) U.S. Cl.
CPC ........ *H10H 20/8312* (2025.01); *H10H 20/01* (2025.01); *H10H 29/142* (2025.01);
        (Continued)

(58) Field of Classification Search
CPC ......... H10H 20/83–8316; H10H 29/37; H10H 29/39; H10H 29/49; H10H 29/8552; H10H 29/922; H10H 29/832–8322
See application file for complete search history.

(56) References Cited

U.S. PATENT DOCUMENTS 11,227,905 B2 *   1/2022   Kim ........................ H10K 59/32
2019/0115513 A1 *   4/2019   Im ........................ H10H 20/857
        (Continued)

FOREIGN PATENT DOCUMENTS

JP        2005-012206 A      1/2005
KR        20200069729 A      6/2020
KR     10-2022-0070141 A      5/2022

OTHER PUBLICATIONS

Baiquan Liu, Lei Wang, Hong Tao, Miao Xu, Jianhua Zou, Honglong Ning, Junbiao Peng, Yong Cao, Doping-free tandem white organic light-emitting diodes, Science Bulletin, vol. 62, Issue 17, 2017, pp. 1193-1200, ISSN 2095-9273, https://doi.org/10.1016/j.scib.2017.08. 021. (Year: 2017).*

*Primary Examiner* — Christine S. Kim
*Assistant Examiner* — Tyler J Wiegand
(74) *Attorney, Agent, or Firm* — Womble Bond Dickinson (US) LLP

(57)        ABSTRACT

A display device includes a substrate, a partition wall on the substrate, a pixel electrode located at each of a plurality of light emitting areas partitioned by the partition wall on the substrate, a light emitting element on the pixel electrode in each of the plurality of light emitting areas and extending in a thickness direction of the substrate, a common electrode on the light emitting element and the partition wall, and a common connection electrode located between the substrate and the partition wall. The common electrode may be in (Continued)

contact with an upper surface of the common connection electrode that is not covered by the partition wall.

16 Claims, 57 Drawing Sheets

(51) Int. Cl.
    *H10H 29/14*             (2025.01)
    *H10H 29/37*             (2025.01)
    *H10H 29/80*             (2025.01)

(52) U.S. Cl.
    CPC ........ *H10H 29/37* (2025.01); *H10H 29/8321*
            (2025.01); *H10H 20/032* (2025.01); *H10H*
                        *20/831* (2025.01)

(56)                   References Cited

U.S. PATENT DOCUMENTS

2021/0036073 A1\*   2/2021   Cho ..................... H10K 59/124
2021/0151422 A1\*   5/2021   Iguchi .................. H01L 25/167
2022/0165921 A1     5/2022   Choi et al.

\* cited by examiner

FIG. 1
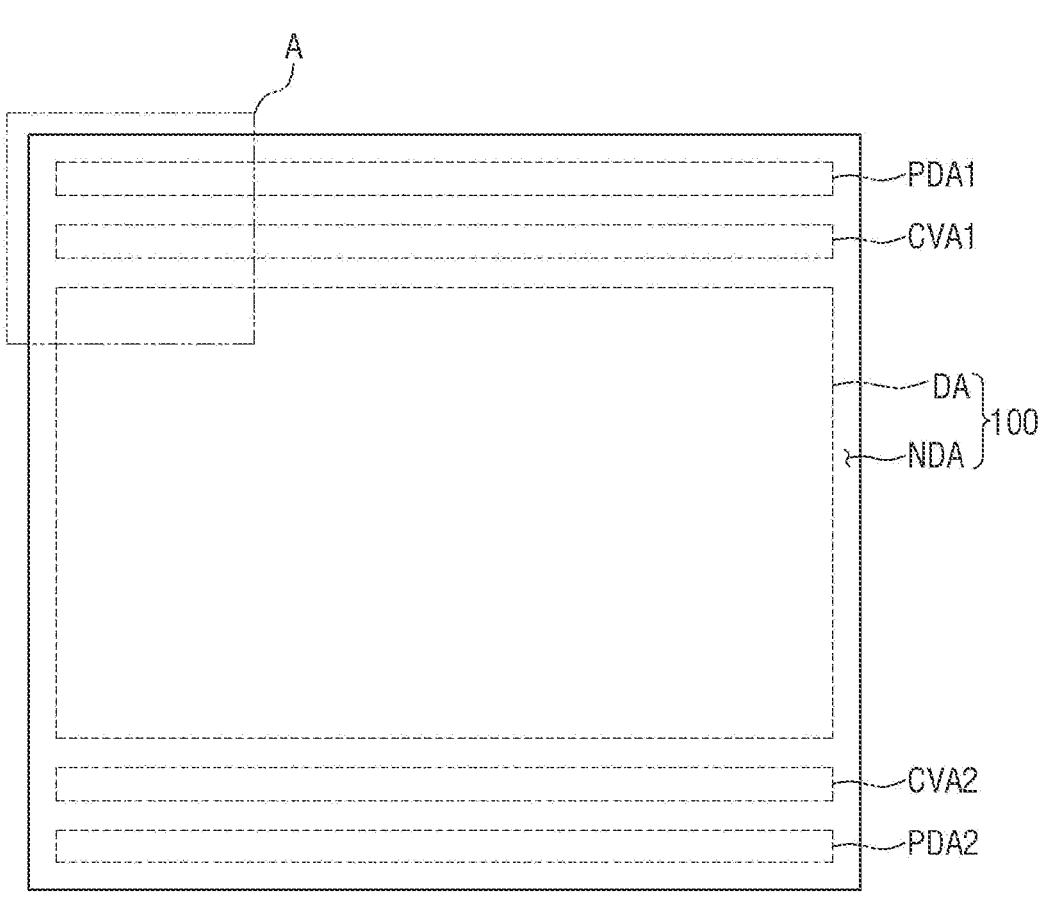
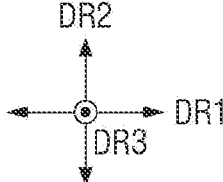

FIG. 2
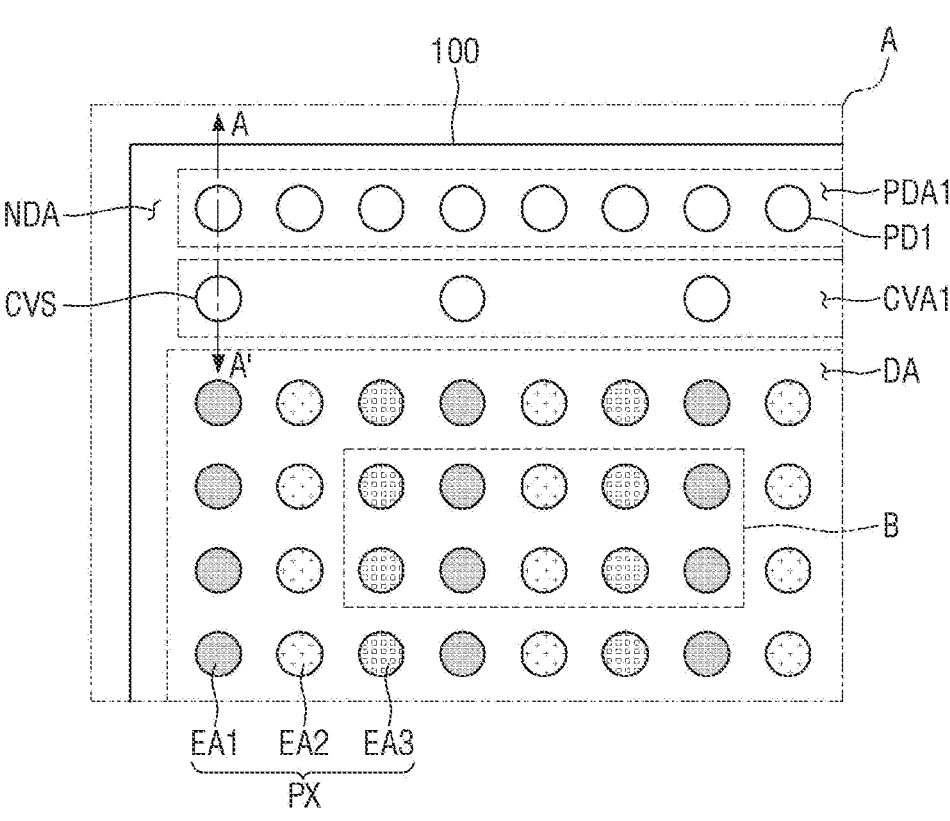
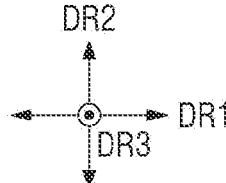

FIG. 5
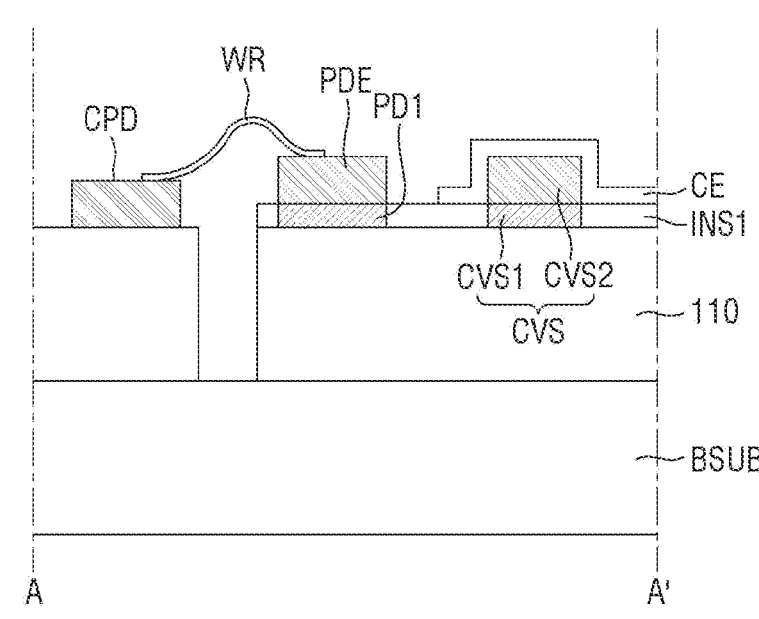
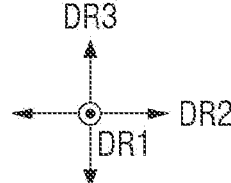

CCE: CCE1, CCE3
PW: PW1, PW2, PW3

FIG. 21

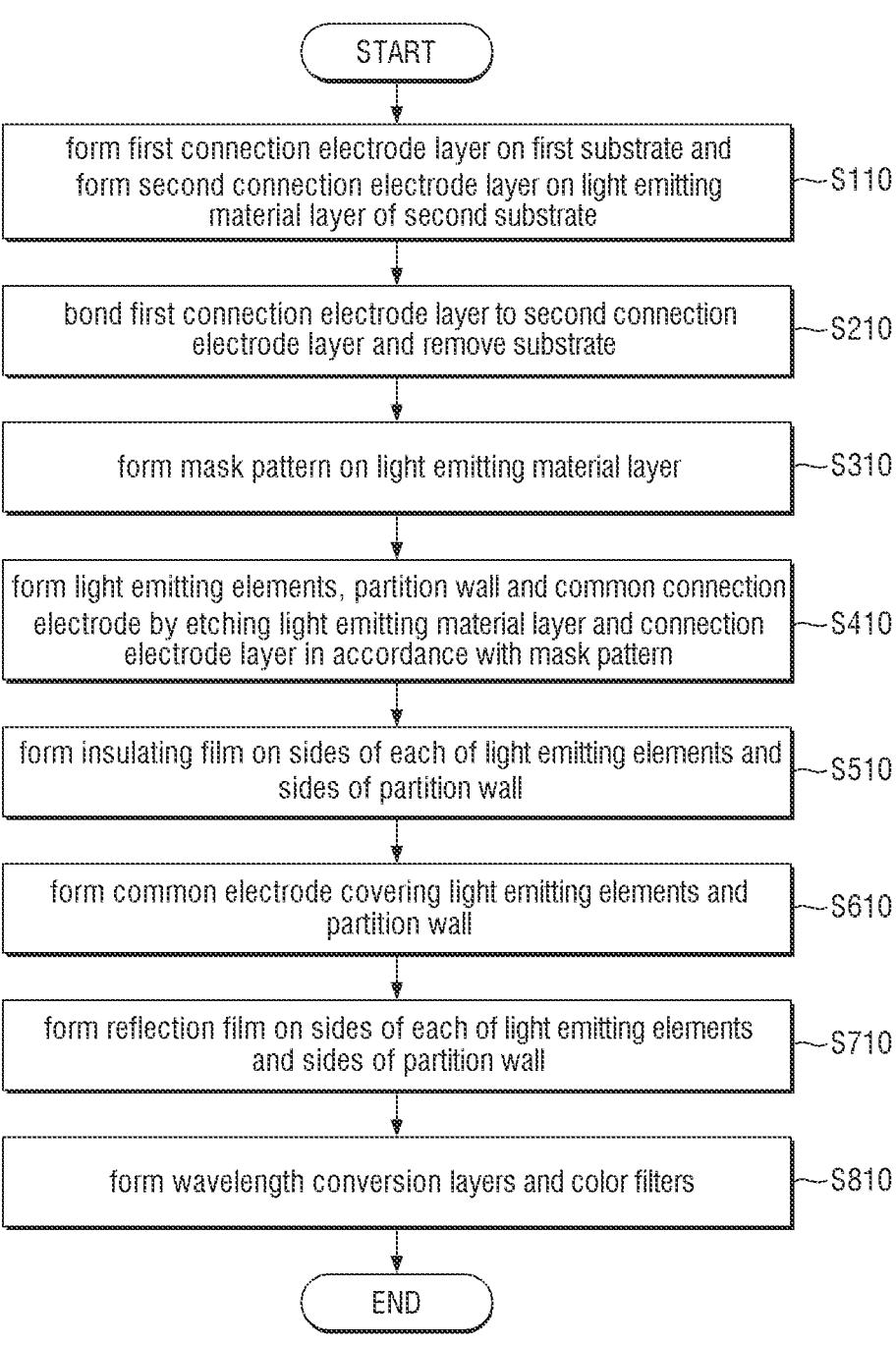

START form first connection electrode layer on first substrate and form second connection electrode layer on light emitting material layer of second substrate — S110 bond first connection electrode layer to second connection electrode layer and remove substrate — S210 form mask pattern on light emitting material layer — S310 form light emitting elements, partition wall and common connection electrode by etching light emitting material layer and connection electrode layer in accordance with mask pattern — S410 form insulating film on sides of each of light emitting elements and sides of partition wall — S510 form common electrode covering light emitting elements and partition wall — S610 form reflection film on sides of each of light emitting elements and sides of partition wall — S710 form wavelength conversion layers and color filters — S810

END

FIG. 42
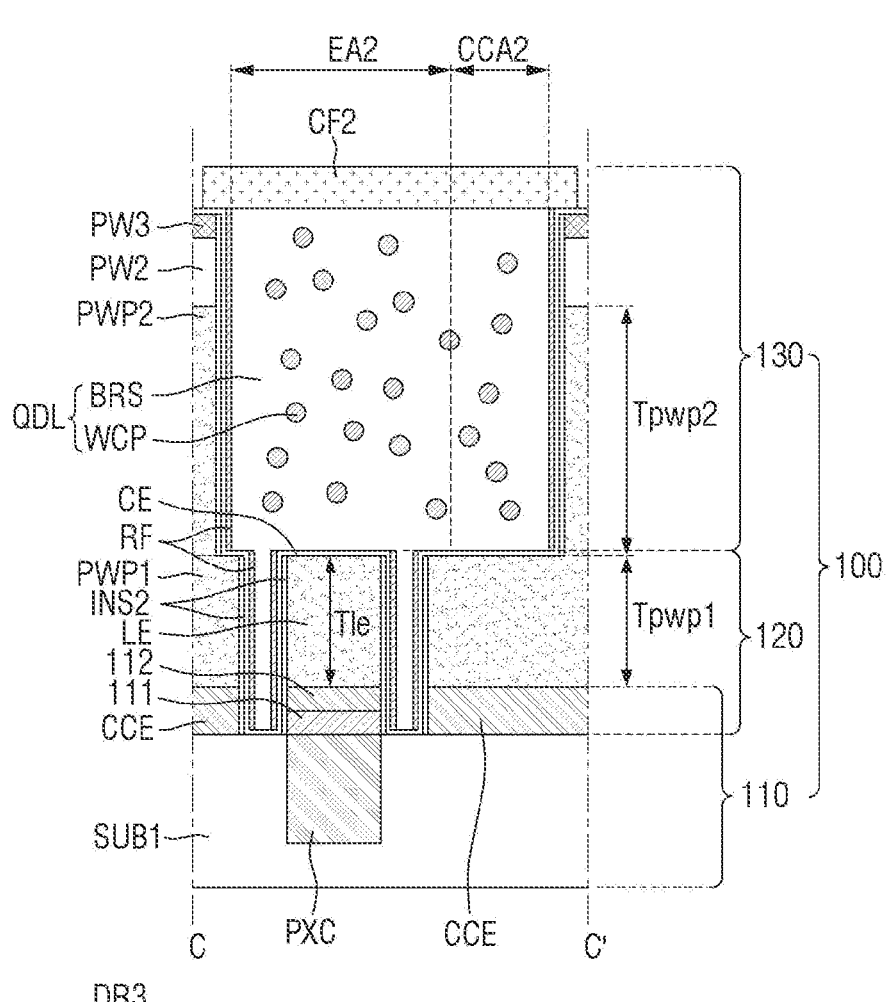
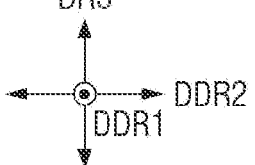
PW: PW1, PW2, PW3
PW1: PWP1, PWP2

PW: PW1, PW2, PW3

PW: PW1, PW2, PW3

PW: PW1, PW2, PW3
PW1: PWP1, PWP2

PW: PW1, PW2, PW3

DISPLAY DEVICE COMPRISING A COMMON CONNECTION ELECTRODE UNDERNEATH THE PARTITION WALL

CROSS-REFERENCE TO RELATED APPLICATION

This application claims priority to, and the benefit of, Korean Patent Application No. 10-2021-0056296 filed on Apr. 30, 2021, and No. 10-2022-0001728 filed on Jan. 5, 2022 in the Korean Intellectual Property Office (KIPO), the entire content of which is incorporated by reference herein.

BACKGROUND

1. Field

The present disclosure relates to a display device and a method for fabricating the same.

2. Description of the Related Arts

With the advancement of the information age, the demand for a display device for displaying an image has increased with various forms. The display device may be a flat panel display device such as a liquid crystal display device, a field emission display device and a light emitting display panel. The light emitting display device may include an organic light emitting display device including an organic light emitting diode element as a light emitting element, an inorganic light emitting display device including an inorganic semiconductor element as a light emitting element, or a micro light emitting diode element as a light emitting element.

Recently, a head mounted display including a light emitting display device has been developed. The head mounted display (HMD) is a glasses type monitor device of a virtual reality (VR) or augmented reality (AR), which is worn by a user in the form of glasses or helmet and forms a focus at a distance close to eyes of the user.

A high-resolution micro light emitting diode display panel including a micro light emitting diode element is applied to a head mounted display. The micro light emitting diode element may be disposed between a pixel electrode corresponding to an anode electrode and a common electrode corresponding to a cathode electrode. Also, in order to prevent light emitted from the micro light emitting diode element from being mixed with light emitted from another micro light emitting diode element adjacent thereto, a partition wall may be disposed between the micro light emitting diode elements.

SUMMARY

Aspects and features of embodiments of the present disclosure provide a display device and a method for fabricating the same, in which a common voltage may stably be applied to a common electrode even though the common electrode is disconnected due to a partition wall.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a substrate, a partition wall on the substrate, a pixel electrode located at each of a plurality of light emitting areas partitioned by the partition wall on the substrate, a light emitting element on the pixel electrode in each of the plurality of light emitting areas and extending in a thickness direction of the substrate, a common electrode on the light emitting element and the partition wall, and a common connection electrode located between the substrate and the partition wall. The common electrode may be in contact with an upper surface of the common connection electrode that is not covered by the partition wall.

A width of the common connection electrode overlapped with the partition wall in the thickness direction of the substrate may be wider than that of the partition wall.

The display device may further include a first insulating film located between the common connection electrode and the partition wall.

The display device may further include a conductive pattern located between the first insulating film and the partition wall.

The display device may further include a connection electrode located between the pixel electrode and the light emitting element.

The common connection electrode may include a same material as that of the connection electrode.

A thickness of the common connection electrode may be less than a thickness of the connection electrode.

The partition wall may include a first partition wall including a partial area including a same material as that of the light emitting element.

The light emitting element may include a first semiconductor layer on the connection electrode located between the pixel electrode and the light emitting element, an active layer on the first semiconductor layer, and a second semiconductor layer on the active layer.

The first partition wall may include a first sub-partition wall including a same material as that of the first semiconductor layer, a second sub-partition wall including a same material as that of the active layer, and a third sub-partition wall including a same material as that of the second semiconductor layer.

A thickness of the third sub-partition wall may be greater than a thickness of the second semiconductor layer.

The first partition wall may further include a fourth sub-partition wall on the third sub-partition wall, the fourth sub-partition wall including an undoped semiconductor material.

A thickness of the fourth sub-partition wall may be greater than a thickness of the second semiconductor layer.

The partition wall may include a second partition wall on the first partition wall and including an insulating material, and a third partition wall on the second partition wall, the third partition wall being conductive.

A thickness of the second partition wall may be greater than a thickness of the third partition wall.

The display device may further include a second insulating film on sides of the partition wall, sides of the light emitting element, sides of the common connection electrode, and sides of the pixel electrode.

According to one or more embodiments of the present disclosure, there is provided a display device including a first light emitting area emitting first light, a second light emitting area emitting second light, a third light emitting area emitting third light, a common connection area including a common connection electrode, a partition wall partitioning the first light emitting area, the second light emitting area, and the third light emitting area, a pixel electrode located at each of the first light emitting area, the second light emitting area and the third light emitting area, a light emitting element on the pixel electrode in each of the first light emitting area, the second light emitting area and the third light emitting area, and a common electrode on the light emitting element in each of the first light emitting area, the second light emitting area and the third light emitting area, the common electrode being in contact with an upper surface of the common connection electrode in the common connection area.

The common connection area may be protruded from each of the first light emitting area, the second light emitting area, and the third light emitting area.

The common connection area may include a hole exposing the common connection electrode by passing through the partition wall.

The common connection electrode may be located at edges of each of the first light emitting area, the second light emitting area, and the third light emitting area.

According to one or more embodiments of the present disclosure, there is provided a method for fabricating a display device, the method includes forming a first connection electrode layer on a first substrate, and forming a second connection electrode layer on a light emitting material layer of a second substrate, forming a connection electrode layer by bonding the first connection electrode layer to the second connection electrode layer, and removing the second substrate, forming a mask pattern on the light emitting material layer, and etching the light emitting material layer and the connection electrode layer in accordance with the mask pattern to form connection electrodes, light emitting elements, a common connection electrode, and a partition wall, forming an insulating film on sides of each of the light emitting elements, sides of the common connection electrode, and sides of the partition walls, and forming a common electrode on an upper surface of each of the light emitting elements and an upper surface of the common connection electrode that is not covered by the partition wall.

According to the aforementioned and other embodiments of the present disclosure, a common electrode may be in contact with an upper surface of a first common connection electrode and an upper surface of a light emitting element, which are exposed without being covered by an insulating film, at edges of each of a plurality of light emission areas. Therefore, even though the common electrode is disconnected on a side of a partition wall due to a great thickness and a narrow width of the partition wall, a common voltage may be stably supplied to the common electrode through the common connection electrode.

According to the aforementioned and other embodiments of the present disclosure, a common electrode may be in contact with an upper surface of a second common connection electrode and an upper surface of a light emitting element, which are exposed without being covered by an insulating film, in each of a plurality of common connection areas. In this case, the common electrode may be supplied with a common voltage through the common connection electrode. Therefore, even though the common electrode is disconnected on a side of a partition wall due to a great thickness and a narrow width of the partition wall, the common voltage may be stably supplied to the common electrode through the common connection electrode.

According to the aforementioned and other embodiments of the present disclosure, a common electrode may be in contact with an upper surface of a first portion of a first partition wall exposed without being covered by a second portion of the first partition wall in each of a plurality of common connection areas. In this case, the common electrode may be supplied with a common voltage through a common connection electrode and the first portion of the first partition wall. Therefore, even though the common electrode is disconnected on a side of a partition wall due to a great thickness and a narrow width of the partition wall, the common voltage may be stably supplied to the common electrode through the common connection electrode and the first portion of the first partition wall.

According to the aforementioned and other embodiments of the present disclosure, a common electrode may be in contact with an upper surface of a second common connection electrode and an upper surface of a light emitting element, which are exposed without being covered by an insulating film, in each of a plurality of common connection areas. In this case, the common electrode may be supplied with a common voltage through the common connection electrode. Therefore, even though the common electrode is disconnected on sides of a partition wall due to a great thickness and a narrow width of the partition wall, the common voltage may be stably supplied to the common electrode through the common connection electrode.

BRIEF DESCRIPTION OF THE DRAWINGS

The above and other embodiments and features of the present disclosure will become more apparent by describing embodiments thereof with reference to the attached drawings, in which:

FIG. 1 is a layout view of a display device according to one or more embodiments of the present disclosure;

FIG. 2 is a detailed layout view illustrating an area A of FIG. 1;

FIG. 5 is a cross-sectional view illustrating an example of a display panel taken along the line A-A' of FIG. 2;

FIG. 21 is a flow chart illustrating a method for fabricating a display device according to one or more embodiments of the present disclosure;

FIG. 42 is a cross-sectional view illustrating an example of a display panel taken along the line C-C' of FIG. 3;

DETAILED DESCRIPTION OF THE DISCLOSURE

Figure 3:
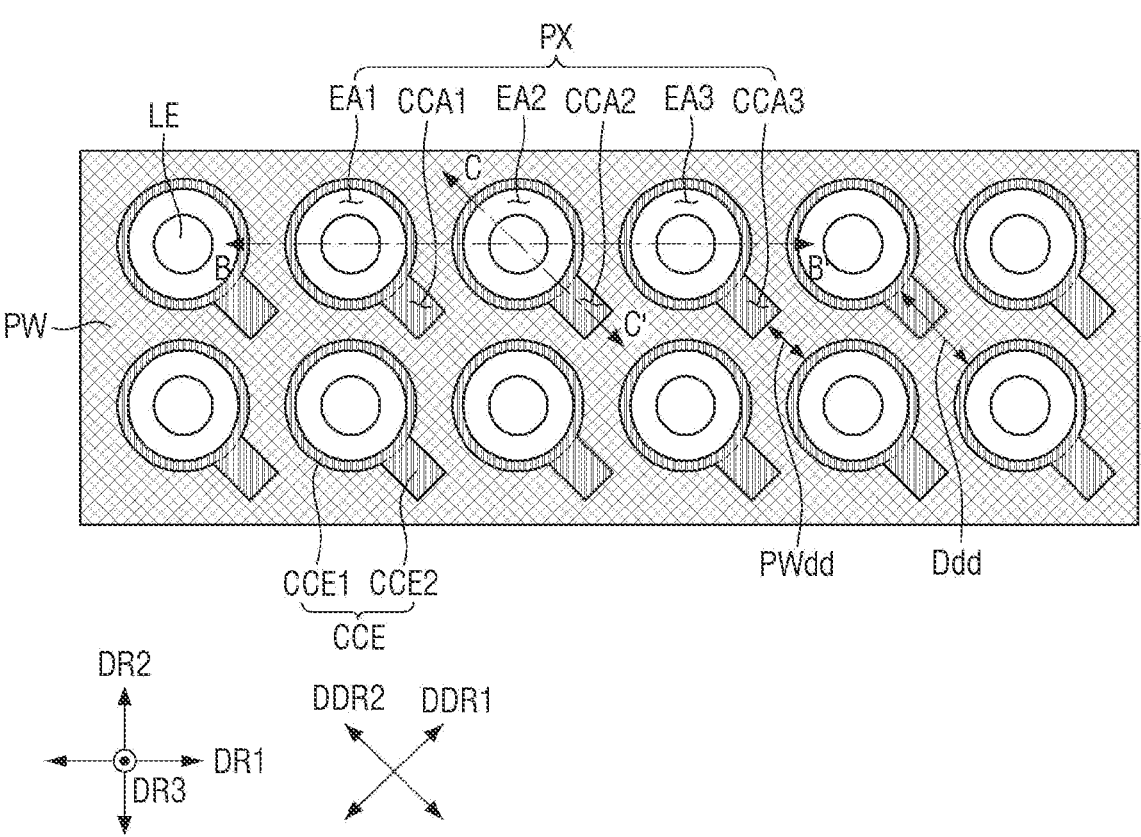
FIG. 3 is a layout view illustrating pixels of a display panel according to one or more embodiments of the present disclosure.

Aspects and features of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of embodiments of the present disclosure to those skilled in the art. Accordingly, processes, elements, and techniques that are not necessary to those having ordinary skill in the art for a complete understanding of the aspects and features of embodiments of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept as well as aspects and features of embodiments of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of some embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a layout view of a display device according to one or more embodiments of the present disclosure. FIG. 2 is a detailed layout view illustrating an area A of FIG. 1, and FIG. 3 is a layout view illustrating pixels of a display panel according to one embodiment of the present disclosure.

Although the display device according to one embodiment of the present disclosure is a micro light emitting diode display device (or nano light emitting diode display device) including a micro light emitting diode as a light emitting element LE in FIGS. 1 to 3, the present disclosure is not limited thereto.

Although the display device according to one or more embodiments of the present disclosure is a light emitting diode on Silicon (LEDoS) having light emitting diodes disposed on a semiconductor circuit board 110 (e.g., see FIG. 5) formed by a semiconductor process using a silicon wafer, as light emitting elements in FIGS. 1 to 3, it should be noted that the present disclosure is not limited thereto.

In addition, in FIGS. 1 to 3, a first direction DR1 indicates a horizontal direction of a display panel 100, a second direction DR2 indicates a vertical direction of the display panel 100, and a third direction DR3 indicates a thickness direction of the display panel 100 or a thickness direction of the semiconductor circuit board 110. In this case, "left," "right," "up," and "down," indicate directions when the display panel 100 is viewed from the plane. For example, "right" indicates one side of the first direction DR1, "left" indicates the other side of the first direction DR1, "upper" indicates one side of the second direction DR2, and "lower" indicates the other side of the second direction DR2. In addition, "upper" indicates one side of the third direction DR3, and "lower" indicates the other side of the third direction DR3.

Referring to FIGS. 1 to 3, the display device 10 according to one more embodiments includes a display panel 100 including a display area DA and a non-display area NDA.

The display panel 100 may have a rectangular plane shape having a long side of the first direction DR1 and a short side of the second direction DR2, but the plane shape of the display panel 100 is not limited thereto, and may have another polygonal shape in addition to the rectangular shape, a circular shape, an oval shape, or an irregular plane shape.

The display area DA may be an area where an image is displayed, and the non-display area NDA may be an area where an image is not displayed. The plane shape of the display area DA may follow the plane shape of the display panel 100. In the example of FIG. 1, the plane shape of the display area DA is a rectangular shape. The display area DA may be disposed in a central area of the display panel 100. The non-display area NDA may be disposed in the vicinity of the display area DA. The non-display area NDA may be disposed to be around (or surround) the display area DA.

The display area DA of the display panel 100 may include a plurality of pixels PX. The pixels PX may be defined as a minimum light emission unit capable of displaying white light.

Each of the plurality of pixels PX may include a plurality of light emitting areas EA1, EA2, and EA3 that emit light and a plurality of common connection areas CCA1, CCA2, and CCA3. In one or more embodiments of the present disclosure, each of the plurality of pixels PX includes three light emitting areas EA1, EA2, and EA3, but is not limited thereto. For example, each of the plurality of pixels PX may include four light emitting areas.

Each of the plurality of light emitting areas EA1, EA2, and EA3 may include a light emitting element LE for emitting first light. Although FIG. 3 illustrates that the light emitting element LE has a circular plane shape, the present disclosure is not limited thereto. For example, the light emitting element LE may have a polygonal shape including a rectangular shape, or an oval shape.

Figure 4:
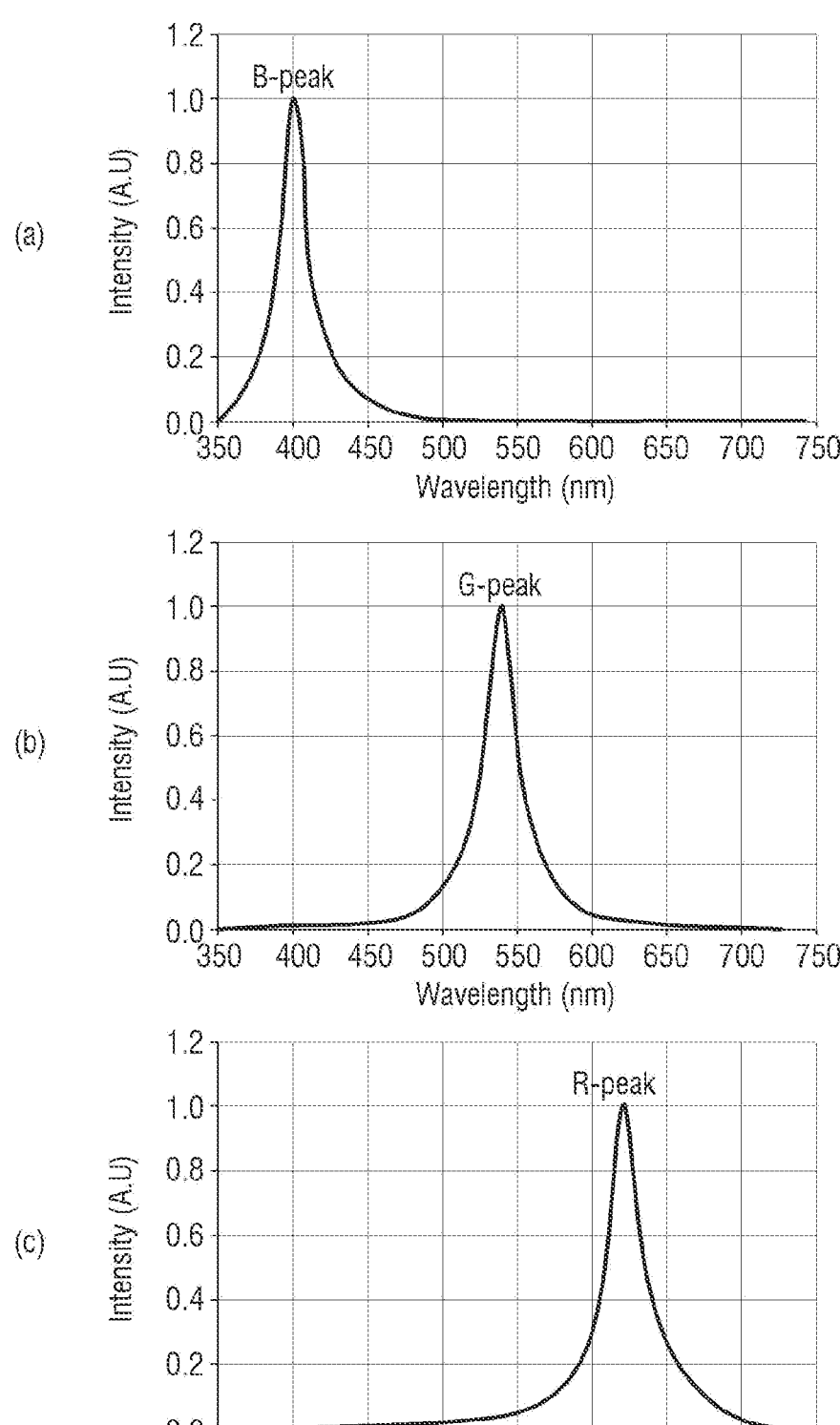
FIG. 4 is a graph illustrating an example of a main peak wavelength of first light, a main peak wavelength of second light, and a main peak wavelength of third light.

Each of the first light emitting areas EA1 indicates an area for emitting first light. Each of the first light emitting areas EA1 may output the first light output from the light emitting element LE as it is. The first light may be the light of a blue wavelength band. For example, a main peak wavelength (B-peak) of the first light may range from 370 nm to 460 nm, approximately, as shown in FIG. 4(a), but the present disclosure is not limited thereto.

Each of the second light emitting areas EA2 indicates an area for emitting second light. Each of the second light emitting areas EA2 may convert a portion of the first light output from the light emitting element LE into the second light and output the second light. The second light may be the light of a green wavelength band. For example, a main peak wavelength (G-peak) of the second light may range from 480 nm to 560 nm, approximately, as shown in FIG. 4(b), but the present disclosure is not limited thereto.

Each of the third light emitting areas EA3 indicates an area for emitting third light. Each of the third light emitting areas EA3 may convert a portion of the first light output from the light emitting element LE into the third light and output the third light. The third light may be the light of a red wavelength band. For example, a main peak wavelength (R-peak) of the third light may range from 600 nm to 750 nm, approximately, as shown in FIG. 4(c), but the present disclosure is not limited thereto.

The first light emitting areas EA1, the second light emitting areas EA2, and the third light emitting areas EA3 may alternately be arranged along the first direction DR1. For example, the first light emitting areas EA1, the second light emitting areas EA2, and the third light emitting areas EA3 may be disposed in the first direction DR1 in due order.

The first light emitting areas EA1 may be arranged along the second direction DR2. The second light emitting areas EA2 may be arranged along the second direction DR2. The third light emitting areas EA3 may be arranged along the second direction DR2.

The plurality of light emitting areas EA1, EA2, and EA3 and the plurality of common connection areas CCA1, CCA2, and CCA3 may be partitioned by a partition wall PW. The partition wall PW may be disposed to be around (or surround) the light emitting element LE. The partition wall PW may be spaced from the light emitting element LE. The partition wall PW may have a meshed plane shape, a net plane shape, or a lattice plane shape.

Although FIG. 3 illustrates that each of the plurality of light emitting areas EA1, EA2, and EA3 defined by the partition wall PW has a circular plane shape, the present disclosure is not limited thereto. For example, each of the plurality of light emitting areas EA1, EA2, and EA3 defined by the partition wall PW may have a polygonal plane shape including a rectangular shape or an oval plane shape.

Each of the plurality of common connection areas CCA1, CCA2, and CCA3 may be an area where a common connection electrode CCE and a common electrode CE are connected to each other. Although FIG. 3 illustrates that each of the plurality of common connection areas CCA1, CCA2, and CCA3 defined by the partition wall PW has a rectangular plane shape, the present disclosure is not limited thereto. Each of the common connection areas CCA1, CCA2, and CCA3 defined by the partition wall PW may have a polygonal plane shape including a rectangular shape or an oval plane shape.

Each of the plurality of common connection areas CCA1, CCA2, and CCA3 may be protruded from each of the plurality of light emitting areas EA1, EA2, and EA3 in a first diagonal direction DDR1 or a second diagonal direction DDR2. For example, each of the first common connection areas CCA1 may be protruded from the first light emitting area EA1 in the second diagonal direction DDR2. Each of the second common connection areas CCA2 may be protruded from the second light emitting area EA2 in the second diagonal direction DDR2. Each of the third common connection areas CCA3 may be protruded from the third light emitting area EA3 in the second diagonal direction DDR2. The first diagonal direction DDR1 may be the direction between the first direction DR1 and the second direction DR2, and the second diagonal direction DDR2 may be the direction orthogonal to the first diagonal direction DDR1.

In addition, although FIG. 3 illustrates that each of the plurality of common connection areas CCA1, CCA2, and CCA3 is protruded from each of the plurality of light emitting areas EA1, EA2, and EA3 in a left lower direction, the present disclosure is not limited thereto. For example, each of the plurality of common connection areas CCA1, CCA2, and CCA3 may be protruded from each of the plurality of light emitting areas EA1, EA2, and EA3 in a left upper direction, a right upper direction, or a right lower direction.

The common connection electrode CCE may have a meshed plane shape, a net plane shape, or a lattice plane shape. A width of the common connection electrode CCE in the first direction DR1 or the second direction DR2 may be wider than that of the partition wall PW. The partition wall PW may completely overlap the common connection electrode CCE in the third direction DR3. A portion of the common connection electrode CCE may overlap the partition wall PW in the third direction DR3.

Figure 6:
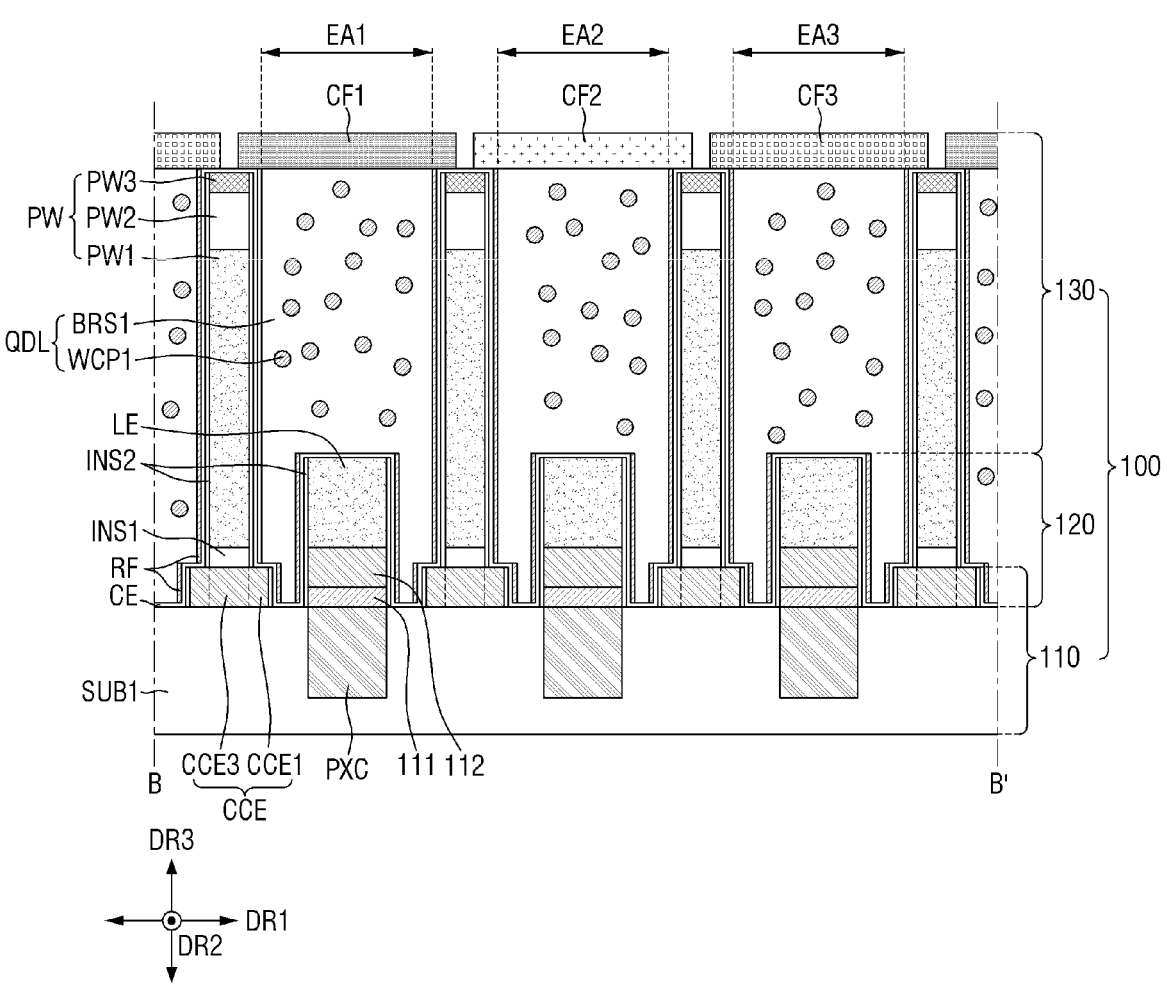
FIG. 6 is a cross-sectional view illustrating an example of a display panel taken along the line B-B' of FIG. 3.

The common connection electrode CCE may include a first common connection electrode CCE1, a second common connection electrode CCE2, and a third common connection electrode CCE3 (e.g., see FIGS. 3 and 6). The first common connection electrode CCE1 may be disposed in each of the plurality of light emitting areas EA1, EA2, and EA3, and the second common connection electrode CCE2 may be disposed on each of the plurality of common connection areas CCA1, CCA2, and CCA3. The third common connection electrode CCE3 may be defined as an area overlapped with the partition wall PW in the third direction DR3 (e.g., see FIG. 6). An upper surface of the first common connection electrode CCE1 and an upper surface of the second common connection electrode CCE2 are in contact with the common electrode CE, whereas the third common connection electrode CCE3 may not be in contact with the common electrode CE.

The first common connection electrode CCE1 may be disposed to be around (or surround) the light emitting element LE in each of the plurality of light emitting areas EA1, EA2, and EA3. The first common connection electrode CCE1 may be disposed at edges of each of the plurality of light emitting areas EA1, EA2, and EA3. The second common connection electrode CCE2 may be disposed in each of the plurality of common connection areas CCA1, CCA2, and CCA3. A maximum width of the first common connection electrode CCE1 in each of the plurality of light emitting areas EA1, EA2, and EA3 may be narrower than that of the second common connection electrode CCE2 in each of the plurality of common connection areas CCA1, CCA2, and CCA3.

Due to the plurality of common connection areas CCA1, CCA2, and CCA3, a width PWdd (e.g., see FIG. 3) of the partition wall PW in the second diagonal direction DDR2 may be shorter than a distance Ddd between adjacent light emitting areas in the second diagonal direction DDR2. Because the partition wall PW has a width thinner than its thickness, when the width PWdd of the partition wall PW is reduced in the second diagonal direction DDR2, support capability of the partition wall PW may be lowered to cause destruction of the partition wall PW, or adhesion of the partition wall PW may be reduced to cause separation of the partition wall PW. Therefore, a size of each of the plurality of common connection areas CCA1, CCA2, and CCA3 may properly be designed in consideration of the support capability of the partition wall PW and the adhesion of the partition wall PW.

The size of each of the plurality of common connection areas CCA1, CCA2, and CCA3 may be smaller than that of each of the plurality of light emitting areas EA1, EA2, and EA3. The sizes of the plurality of light emitting areas EA1, EA2, and EA3 are substantially the same as one another, and in this case, the sizes of the plurality of common connection areas CCA1, CCA2, and CCA3 may substantially be the same as one another, but the present disclosure is not limited thereto.

The non-display area NDA may include a first common voltage supply area CVA1, a second common voltage supply area CVA2, a first pad area PDA1, and a second pad area PDA2.

The first common voltage supply area CVA1 may be disposed between the first pad area PDA1 and the display area DA in the second direction DR2. The second common voltage supply area CVA2 may be disposed between the second pad area PDA2 and the display area DA in the second direction DR2. Each of the first common voltage supply area CVA1 and the second common voltage supply area CVA2 may include a plurality of common voltage supply portions CVS connected to the common electrode CE. The common voltage may be supplied to the common electrode CE through a plurality of common voltage supply portions CVS.

The plurality of common voltage supply portions CVS of the first common voltage supply area CVA1 may be electrically connected to any one of first pads PD1 of the first pad area PDA1. That is, the plurality of common voltage supply portions CVS of the first common voltage supply area CVA1 may be supplied with a common voltage from any one of the first pads PD1 of the first pad area PDA1.

The plurality of common voltage supply portions CVS of the second common voltage supply area CVA2 may be electrically connected to any one of second pads of the second pad area PDA2. That is, the plurality of common voltage supply portions CVS of the second common voltage supply area CVA2 may be supplied with a common voltage from any one of the second pads of the second pad area PDA2.

The first pad area PDA1 may be disposed above the display panel 100 in the second direction DR2. The first pad area PDA1 may include first pads PD1 connected to an external circuit board.

The second pad area PDA2 may be disposed below the display panel 100 in the second direction DR2. The second pad area PDA2 may include second pads for connection with the external circuit board. In one or more embodiments, the second pad area PDA2 may be omitted.

Figure 7:
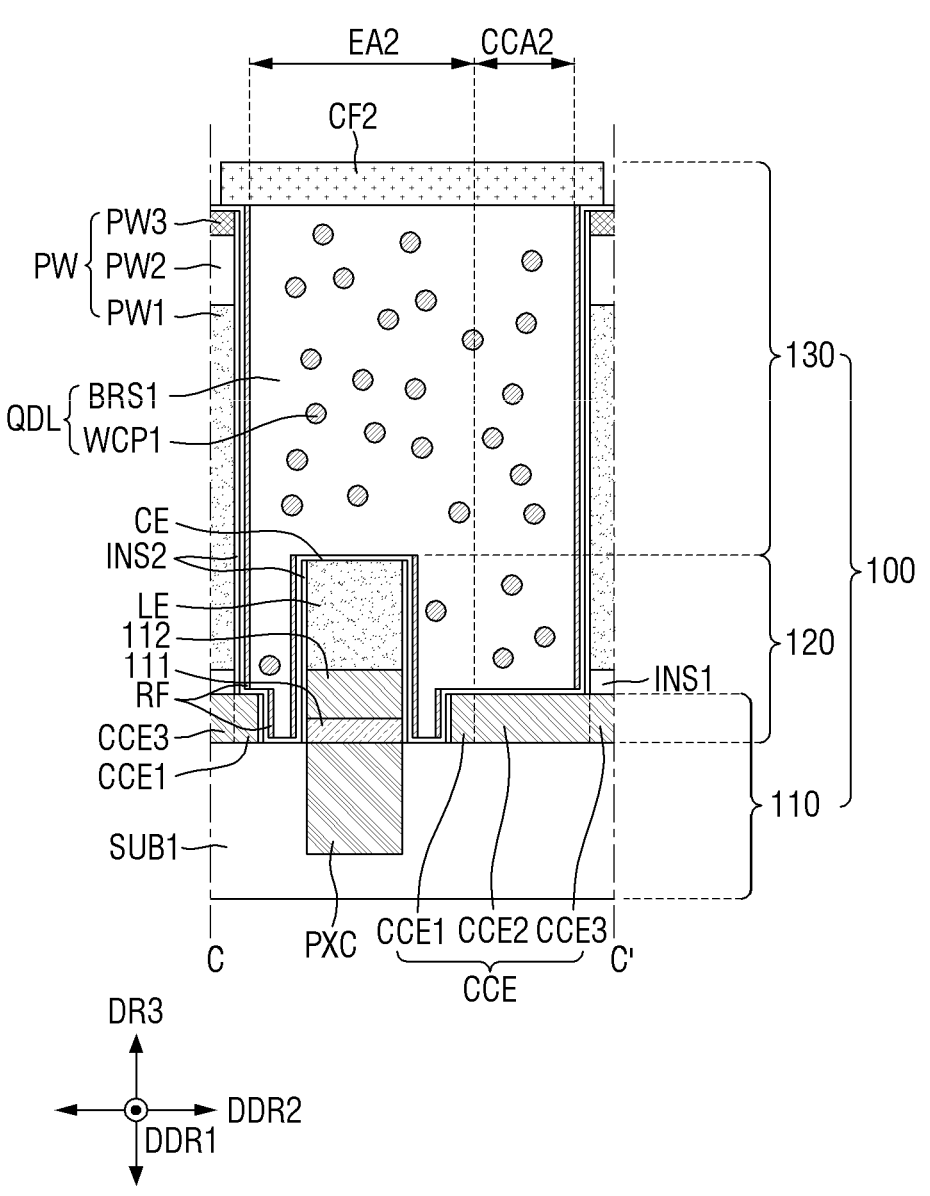
FIG. 7 is a cross-sectional view illustrating an example of a display panel taken along the line C-C' of FIG. 3.
Figure 8:
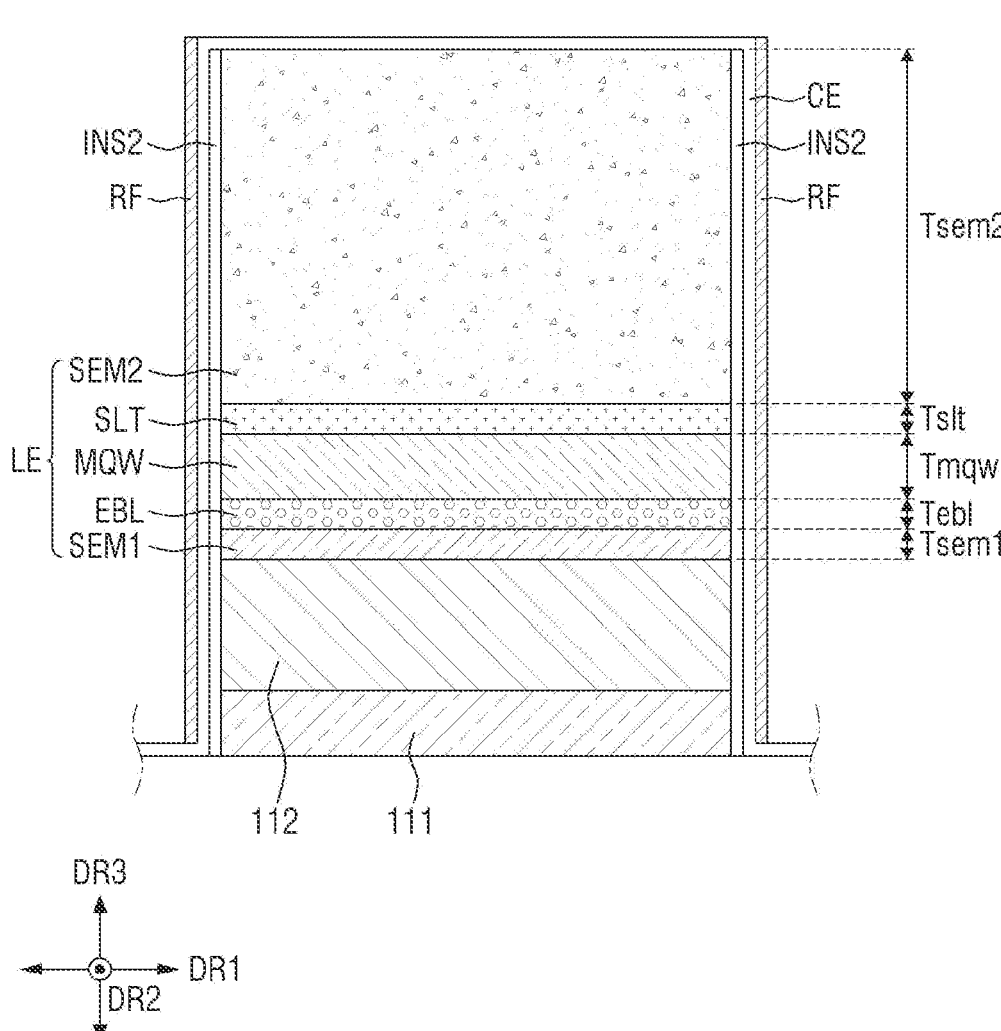
FIG. 8 is an enlarged cross-sectional view illustrating a light emitting element of FIG. 7.
Figure 9:
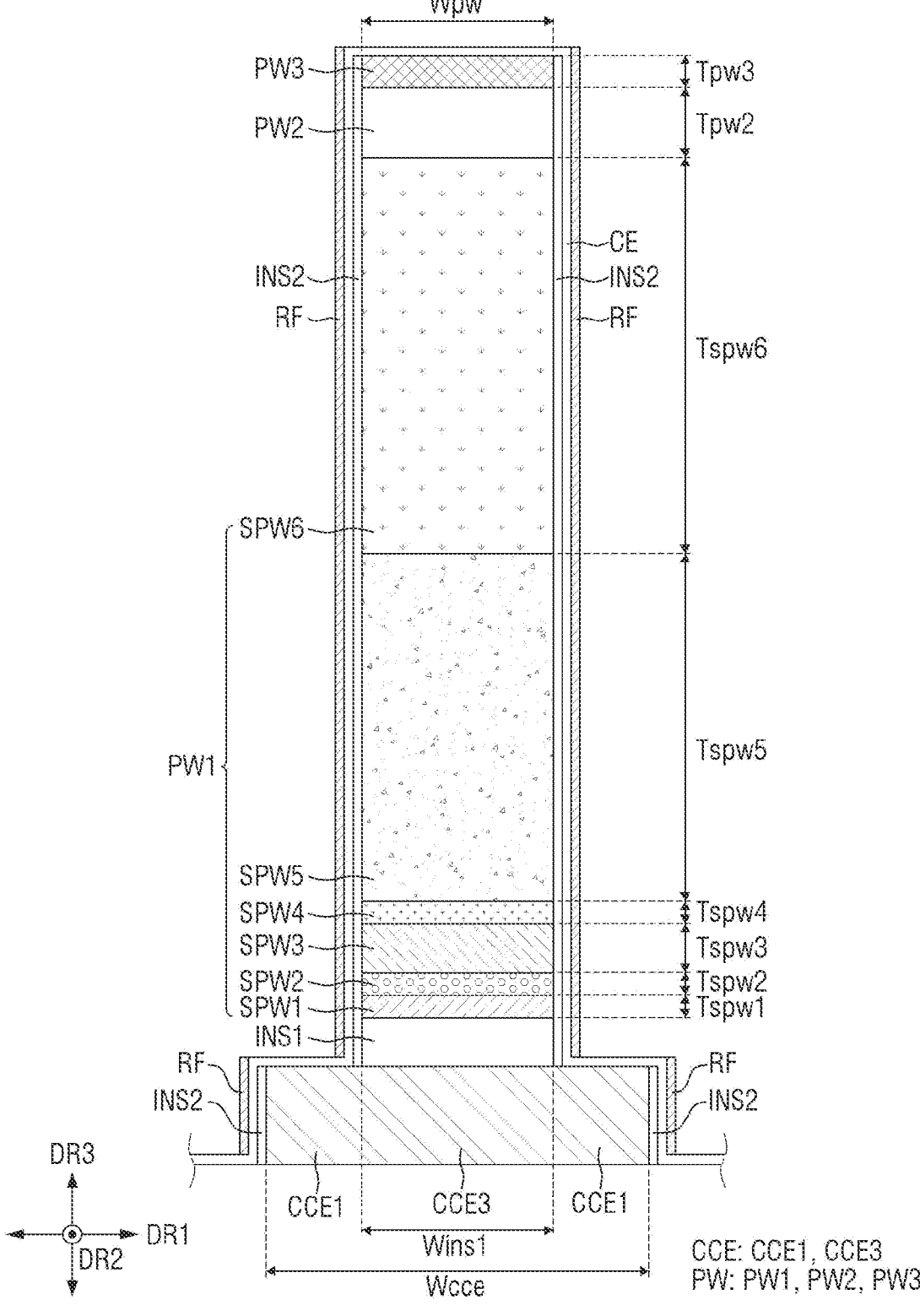
FIG. 9 is an enlarged cross-sectional view illustrating an example of a partition wall of FIG. 7.

FIG. 5 is a cross-sectional view illustrating an example of a display panel taken along the line A-A' of FIG. 2. FIG. 6 is a cross-sectional view illustrating an example of a display panel taken along the line B-B' of FIG. 3. FIG. 7 is a cross-sectional view illustrating an example of a display panel taken along the line C-C' of FIG. 3. FIG. 8 is an enlarged cross-sectional view illustrating a light emitting element of FIG. 7. FIG. 9 is an enlarged cross-sectional view illustrating an example of a partition wall of FIG. 7.

Referring to FIGS. 5 to 9, the display panel 100 may include a semiconductor circuit board 110 and a light emitting element layer 120.

The semiconductor circuit board 110 may include a first substrate SUB1, a plurality of pixel circuit areas PXC, pixel electrodes 111, a first pad PD1, and a first common voltage supply portion CVS1 of a common voltage supply portion CVS.

The first substrate SUB1 may be a silicon wafer substrate. The first substrate SUB1 may be made of single crystal silicon.

Each of the plurality of pixel circuit areas PXC may be disposed on the first substrate SUB1. Each of the plurality of pixel circuit areas PXC may include a complementary metal-oxide-semiconductor (CMOS) circuit formed using a semiconductor process. Each of the plurality of pixel circuit areas PXC may include at least one transistor formed by the semiconductor process. Each of the plurality of pixel circuit areas PXC may further include at least one capacitor formed by the semiconductor process.

The plurality of pixel circuit areas PXC may be disposed in the display area DA. Each of the plurality of pixel circuit areas PXC may be connected to its corresponding pixel electrode 111. That is, the plurality of pixel circuit areas PXC and the plurality of pixel electrodes 111 may be connected to each other in a one-to-one correspondence. Each of the pixel circuit areas PXC may apply a pixel voltage or an anode voltage to the pixel electrode 111.

Each of the pixel electrodes 111 may be disposed on its corresponding pixel circuit area PXC. Each of the pixel electrodes 111 may be an exposed electrode exposed from the pixel circuit area PXC. That is, each of the pixel electrodes 111 may be protruded from an upper surface of the pixel circuit area PXC. Each of the pixel electrodes 111 may be integrally formed with the pixel circuit area PXC. Each of the pixel electrodes 111 may be supplied with a pixel voltage or an anode voltage from the pixel circuit area PXC. The pixel electrodes 111 may include aluminum (Al).

Each of the first pad PD1 and the first common voltage supply portion CVS1 may be an exposed electrode exposed from the first substrate SUB1. Each of the first pad PD1 and the first common voltage supply portion CVS1 may include the same material as that of the pixel electrodes 111. For example, each of the first pad PD1 and the first common voltage supply portion CVS1 may include aluminum (Al).

Because the second pads of the second pad area PDA2 are substantially the same as the first pad PD1 described with reference to FIG. 5, their description will be omitted.

The light emitting element layer 120 may be a layer emitting light by including a plurality of light emitting areas EA1, EA2, and EA3. The light emitting element layer 120 may include connection electrodes 112, a pad connection electrode PDE, a second common voltage supply portion CVS2 of the common voltage supply portion CVS, a common connection electrode CCE, light emitting elements LE, a first insulating film INS1, a partition wall PW, a second insulating film INS2, a common electrode CE, a reflection film RF, a wavelength conversion layer QDL, and a plurality of color filters CF1, CF2, and CF3. In other embodiments, the light emitting element layer 120 may include one or more conductive patterns.

Each of the connection electrodes 112 may be disposed on its corresponding pixel electrode 111. That is, the connection electrodes 112 may be connected to the pixel electrodes 111 in a one-to-one correspondence. The connection electrodes 112 may serve as a bonding metal for bonding the pixel electrodes 111 to the light emitting elements LE during a fabricating process. For example, the connection electrodes 112 may include at least one of gold (Au), copper (Cu), aluminum (Al), or tin (Sn). Alternatively, the connection electrodes 112 may include a first layer including any one of gold (Au), copper (Cu), aluminum (Al), and tin (Sn), and a second layer including the other one of gold (Au), copper (Cu), aluminum (Al), and tin (Sn). In this case, the second layer may be disposed on the first layer.

The common connection electrode CCE may be spaced from the pixel electrode 111 and the connection electrode 112. The common connection electrode CCE may be disposed to be around (or surround) the pixel electrode 111 and the connection electrode 112.

The common connection electrode CCE may include a first common connection electrode CCE1 disposed in each of the plurality of light emitting areas EA1, EA2 and EA3, a second common connection electrode CCE2 disposed in each of the plurality of common connection areas CCA1, CCA2 and CCA3, and a third common connection electrode CCE3 overlapped with the partition wall PW in the third direction DR3.

The common connection electrode CCE may be connected to any one of the first pads PD1 of the first pad area PDA1 of the non-display area NDA or any one of the second pads of the second pad area PDA2 to receive a common voltage. The common connection electrode CCE may include the same material as that of the connection electrodes 112. For example, the common connection electrode CCE may include at least one of gold (Au), copper (Cu), aluminum (Al), or tin (Sn). When each of the connection electrodes 112 includes the first layer and the second layer, the common connection electrode CCE may include the same material as that of the first layer of each of the connection electrodes 112.

The pad connection electrode PDE may be disposed on the first pad PD1, and the second common voltage supply portion CVS2 may be disposed on the first common voltage supply portion CVS1. The pad connection electrode PDE may be in contact with an upper surface of the first pad PD1, and the second common voltage supply portion CVS2 may be in contact with an upper surface of the first common voltage supply portion CVS1. The pad connection electrode PDE and the second common voltage supply portion CVS2 may include the same material as that of the connection electrodes 112. For example, each of the pad connection electrode PDE and the second common voltage supply portion CVS2 may include at least one of gold (Au), copper (Cu), aluminum (Al), or tin (Sn). When each of the connection electrodes 112 includes the first layer and the second layer, each of the pad connection electrode PDE and the second common voltage supply portion CVS2 may include the first layer and the second layer.

The pad connection electrode PDE may be connected to a pad CPD of the circuit board through a conductive connection member such as a wire WR. That is, the first pad PD1, the pad connection electrode PDE, the wire WR, and the pad CPD of the circuit board may be electrically connected to one another.

The semiconductor circuit board 110 and the circuit board may be disposed on a base substrate BSUB. The semiconductor circuit board 110 and the circuit board may be attached to an upper surface of the base substrate BSUB by an adhesive member such as a pressure sensitive adhesive.

The circuit board may be a flexible printed circuit board (FPCB), a printed circuit board (PCB), a flexible printed circuit (FPC), or a flexible film such as a chip on film (COF).

The light emitting element layer 120 may include the plurality of light emitting areas EA1, EA2, and EA3 and a plurality of common connection areas CCA1, CCA2, and CCA3, which are defined by the partition wall PW. Any one of the light emitting elements LE, the wavelength conversion layer QDL, and the plurality of color filters CF1, CF2, and CF3 may be disposed in each of the plurality of light emitting areas EA1, EA2, and EA3. The second common connection electrode CCE2 may be disposed in each of the plurality of common connection areas CCA1, CCA2, and CCA3.

Each of the light emitting elements LE may be disposed on the connection electrode 112. The light emitting element LE may be a vertical light emitting diode element extended in the third direction DR3. That is, a length of the light emitting element LE in the third direction DR3 may be longer than a length in a horizontal direction. The length in the horizontal direction indicates a length in the first direction DR1 or a length in the second direction DR2. For example, the length of the light emitting element LE in the third direction DR3 may be 1 μm to 5 μm, approximately.

The light emitting element LE may be a micro light emitting diode element or a nano light emitting diode. The light emitting element LE includes a first semiconductor layer SEM1, an electron blocking layer EBL, an active layer MQW, a superlattice layer SLT, and a second semiconductor layer SEM2 stacked in the third direction DR3 as shown in FIG. 8. The first semiconductor layer SEM1, the electron blocking layer EBL, the active layer MQW, the superlattice layer SLT, and the second semiconductor layer SEM2 may be sequentially deposited along the third direction DR3.

The first semiconductor layer SEM1 may be disposed on the connection electrode 112. The first semiconductor layer SEM1 may be doped with a first conductive type dopant such as Mg, Zn, Ca, Se, and Ba. For example, the first semiconductor layer SEM1 may be p-GaN doped with p-type Mg. A thickness Tsem1 of the first semiconductor layer SEM1 may be 30 nm to 200 nm, approximately.

The electron blocking layer EBL may be disposed on the first semiconductor layer SEM1. The electron blocking layer EBL may be a layer for suppressing or preventing too many electrons from flowing to the active layer MQW. For example, the electron blocking layer EBL may be p-AlGaN doped with p-type Mg. A thickness Tebl of the electron blocking layer EBL may be 10 nm to 50 nm, approximately. In one or more embodiments, the electron blocking layer EBL may be omitted.

The active layer MQW may be disposed on the electron blocking layer EBL. The active layer MQW may emit light by combination of electron-hole pairs in accordance with an electrical signal applied through the first semiconductor layer SEM1 and the second semiconductor layer SEM2. The active layer MQW may emit first light having a main peak wavelength band ranging from 450 nm to 495 nm, that is, light of a blue wavelength band.

The active layer MQW may include a single or multiple quantum well structure material. When the active layer MQW includes a multiple quantum well structure material, a plurality of well layers and a plurality of barrier layers may alternately be deposited. In this case, the well layer may be formed of, but not limited to, InGaN, and the barrier layer may be formed of, but not limited to, GaN or AlGaN. A thickness of the well layer may be 1 nm to 4 nm, approximately, and a thickness of the barrier layer may be 3 nm to 10 nm, approximately.

Alternately, the active layer MQW may have a structure in which semiconductor materials having a large band gap energy and semiconductor materials having a low band gap energy are alternately deposited, and may include different Group III to group V semiconductor materials depending on a wavelength range of light that is emitted. The light emitted from the active layer MQW may not be limited to the first light (e.g., light of a blue wavelength band), and may emit second light (e.g., light of a green wavelength band) or third light (e.g., light of red wavelength band) as the case may be.

The superlattice layer SLT may be disposed on the active layer MQW. The superlattice layer SLT may be a layer for mitigating stress between the second semiconductor layer SEM2 and the active layer MQW. For example, the superlattice layer SLT may be formed of InGaN or GaN. A thickness Tslt of the superlattice layer SLT may be 50 nm to 200 nm, approximately. In one or more embodiments, superlattice layer SLT may be omitted.

The second semiconductor layer SEM2 may be disposed on the superlattice layer SLT. The second semiconductor layer SEM2 may be doped with a second conductive type dopant such as Si, Ge, and Sn. For example, the second semiconductor layer SEM2 may be n-GaN doped with n-type Si. A thickness Tsem2 of the second semiconductor layer SEM2 may be 500 nm to 1 μm, approximately.

The first insulating film INS1 may be formed on the common connection electrode CCE. The first insulating film INS1 may be formed of an inorganic film, such as a silicon oxide film (SiO2), an aluminum oxide film (Al2O3), or a hafnium oxide film (HfOX).

The partition wall PW may be disposed on the first insulating film INS1. In the first direction DR1 and the second direction DR2, the width Wpw of the partition wall PW may be narrower than a width Wcce of the common connection electrode CCE. The partition wall PW may be disposed to be spaced from each of the light emitting elements LE in the first direction DR1 and the second direction DR2. The partition wall PW may be disposed to be around (or surround) each of the light emitting elements LE.

As shown in FIG. 9, the partition wall PW may include a first partition wall PW1, a second partition wall PW2, and a third partition wall PW3.

The first partition wall PW1 may be disposed on the first insulating film INS1. Because the first partition wall PW1 is formed by the same process as that of the light emitting element LE, at least a portion of the first partition wall PW1 may include the same material as that of the light emitting element LE.

As shown in FIG. 9, the first partition wall PW1 may include a plurality of sub-partition walls SPW1 to SPW6 sequentially deposited in the third direction DR3. For example, the first partition wall PW1 may include a first sub-partition wall SPW1, a second sub-partition wall SPW2, a third sub-partition wall SPW3, a fourth sub-partition wall SPW4, a fifth sub-partition wall SPW5, and a sixth sub-partition wall SPW6.

The first sub-partition wall SPW1 may be formed of the same material as that of the first semiconductor layer SEM1 of the light emitting element LE. The first sub-partition wall SPW1 may be formed by the same process as that of the first semiconductor layer SEM1 of the light emitting element LE. A thickness Tspw1 of the first sub-partition wall SPW1 may substantially be the same as the thickness Tsem1 of the first semiconductor layer SEM1 of the light emitting element LE.

The second sub-partition wall SPW2 may be formed of the same material as that of the electron blocking layer EBL of the light emitting element LE. The second sub-partition wall SPW2 may be formed by the same process as that of the electron blocking layer EBL of the light emitting element LE. A thickness Tspw2 of the second sub-partition wall SPW2 may substantially be the same as a thickness Tebl of the electron blocking layer EBL of the light emitting element LE. When the electron blocking layer EBL is omitted, the second sub-partition wall SPW2 may also be omitted.

The third sub-partition wall SPW3 may be formed of the same material as that of the active layer MQW of the light emitting element LE. The third sub-partition wall SPW3 may be formed by the same process as that of the active layer MQW of the light emitting element LE. A thickness Tspw3 of the third sub-partition wall SPW3 may substantially be the same as a thickness Tmqw of the active layer MQW of the light emitting element LE The fourth sub-partition wall SPW4 may be formed of the same material as that of the superlattice layer SLT of the light emitting element LE. The fourth sub-partition wall SPW4 may be formed by the same process as that of the superlattice layer SLT of the light emitting element LE. A thickness Tspw4 of the fourth sub-partition wall SPW4 may be substantially the same as a thickness Tslt of the superlattice layer SLT of the light emitting element LE.

The fifth sub-partition wall SPW5 may be formed of the same material as that of the second semiconductor layer SEM2 of the light emitting element LE. The fifth sub-partition wall SPW5 may be formed by the same process as that of the second semiconductor layer SEM2 of the light emitting element LE. Because the fifth sub-partition wall SPW5 is not removed but a portion of the second semiconductor layer SEM2 of the light emitting element LE is removed during the fabricating process of the display panel 100, a thickness Tspw5 of the fifth sub-partition wall SPW5 may be thicker than the thickness Tsem2 of the second semiconductor layer SEM2 of the light emitting element LE.

The sixth sub-partition wall SPW6 may be formed of a semiconductor layer that is not doped with a dopant, that is, an undoped semiconductor layer. For example, the sixth sub-partition wall SPW6 may be an undoped GaN that is not doped with a dopant. A thickness Tspw6 of the sixth sub-partition wall SPW6 may be thicker than the thickness Tsem2 of the second semiconductor layer SEM2 of the light emitting element LE. The thickness Tspw6 of the sixth sub-partition wall SPW6 may be 2 μm to 3 μm, approximately.

The second partition wall PW2 may be disposed on the first partition wall PW1. The second partition wall PW2 may be formed of an inorganic film, such as a silicon oxide film (SiO2), an aluminum oxide film (Al2O3), or a hafnium oxide film (HfOX). The thickness Tpw2 of the second partition wall PW2 may be 1 μm to 2 μm, approximately.

The third partition wall PW3 may be disposed on the second partition wall PW2. The third partition wall PW3 may include a conductive material such as nickel (Ni). A thickness Tpw3 of the third partition wall PW3 may be 0.01 μm to 1 μm, approximately.

The second partition wall PW2 and the third partition wall PW3 may serve as masks for preventing the first partition wall PW1 from being etched during a fabricating process for forming the light emitting element LE and the partition wall PW.

The second insulating film INS2 may be disposed on a side of the common connection electrode CCE, a side of the partition wall PW, a side of each of the pixel electrodes 111, a side of each of the connection electrodes 112, and a side of each of the light emitting elements LE. The second insulating film INS2 may be formed of an inorganic film such as a silicon oxide film (SiO$_2$), an aluminum oxide film (Al$_2$O$_3$), or a hafnium oxide film (HfO$_X$). A thickness of the second insulating film INS2 may be 0.1 μm, approximately.

The common electrode CE may be disposed on the upper surface and the side of each of the light emitting elements LE and the upper surface and the side of the partition wall PW. That is, the common electrode CE may be disposed to cover the upper surface and the side of each of the light emitting elements LE and the upper surface and the side of the partition wall PW.

The common electrode CE may be in contact with the second insulating film INS2 disposed on the side of the first common connection electrode CCE1, the side of the partition wall PW, the side of each of the pixel electrodes 111, the side of each of the connection electrodes 112, and the side of each of the light emitting elements LE. In addition, the common electrode CE may be in contact with the upper surface of the first common connection electrode CCE1, the upper surface of the second common connection electrode CCE2 (e.g., see FIG. 7), the upper surface of each of the light emitting elements LE, and the upper surface of the partition wall PW.

The common electrode CE may be in contact with the upper surface of the first common connection electrode CCE1, the upper surface of the second common connection electrode CCE2 (e.g., see FIG. 7), and the upper surface of the light emitting element LE, which are exposed without being covered by the second insulating film INS2, at the edges of each of the plurality of light emitting areas EA1, EA2, and EA3 and in each of the plurality of common connection areas CCA1, CCA2, and CCA3. A contact area between the common electrode CE and the second common connection electrode CCE2 in each of the plurality of common connection areas CCA1, CCA2, and CCA3 may be wider than a contact area between the common electrode CE and the first common connection electrode CCE1 at the edges of each of the plurality of light emitting areas EA1, EA2, and EA3. Therefore, due to the plurality of common connection areas CCA1, CCA2, and CCA3, the common electrode CE and the common connection electrode CCE may stably be connected to each other. Therefore, the common voltage supplied to the common connection electrode CCE may be supplied to the light emitting element LE. One end of the light emitting element LE may be supplied with a pixel voltage or an anode voltage of the pixel electrode 111 through the connection electrode 112, and the other end thereof may be supplied with a common voltage through the common electrode CE. The light emitting element LE may emit light with a desired luminance (e.g., a predetermined luminance) in accordance with a voltage difference between the pixel voltage and the common voltage.

The common electrode CE may include a transparent conductive material. The common electrode CE may be formed of a transparent conductive oxide (TCO) such as indium tin oxide (ITO) or indium zinc oxide (IZO). A thickness of the common electrode CE may be 0.1 µm, approximately.

The reflection film RF serves to reflect light moving to upper and lower sides and left and right sides, and not light moving in an upper direction from among the light emitted from the light emitting element LE. The reflection film RF may include a metal material having high reflectance, such as aluminum (Al). A thickness of the reflection film RF may be 0.1 µm, approximately.

The reflection film RF may be disposed on the side of the first common connection electrode CCE1, the side of the partition wall PW, the side of each of the pixel electrodes 111, the side of each of the connection electrodes 112, and the side of each of the light emitting elements LE. The reflection film RF may be in contact with the common electrode CE disposed on the side of the first common connection electrode CCE1, the side of the partition wall PW, the side of each of the pixel electrodes 111, the side of each of the connection electrodes 112, and the side of each of the light emitting elements LE.

The wavelength conversion layer QDL may be disposed on the light emitting element LE in each of the plurality of light emitting areas EA1, EA2, and EA3. The wavelength conversion layer QDL may be disposed to cover the light emitting element LE in each of the plurality of light emitting areas EA1, EA2, and EA3. The wavelength conversion layer QDL may convert a portion of the first light incident from the light emitting element LE into fourth light and emit the fourth light. For example, the fourth light may be the light of a yellow wavelength band. The fourth light may include both a green wavelength band and a red wavelength band. That is, the fourth light may be the mixture light of the second light and the third light.

The wavelength conversion layer QDL may include a first base resin BRS1 and first wavelength conversion particles WCP1. The first base resin BRS1 may include a light-transmissive organic material. For example, the first base resin BRS1 may include an epoxy-based resin, an acrylic resin, a cardo-based resin, or an imide-based resin.

The first wavelength conversion particles WCP1 may convert the first light incident from the light emitting element LE into the fourth light. For example, the first wavelength conversion particles WCP1 may convert the light of the blue wavelength band into the light of the yellow wavelength band. The first wavelength conversion particles WCP1 may be quantum dots (QD), quantum rods, fluorescent materials, or phosphorescent materials. The quantum dots may include Group IV nanocrystal, Group II-VI compound nanocrystal, group III-V compound nanocrystal, Group IV-VI nanocrystal, or their combination.

The quantum dots may include a core and a shell that over-coats the core. For example, the core may be, but not limited to, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, Fe2O3, Fe3O4, Si, or Ge. The shell may include, but is not limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, or PbTe.

The wavelength conversion layer QDL may further include a scatterer for scattering the light of the light emitting element LE in a random direction. In this case, the scatterer may include metal oxide particles or organic particles. For example, the metal oxide may be titanium oxide (TiO2), zirconium oxide (ZrO2), silicon dioxide (SiO2), aluminum oxide ($Al_2O_3$), indium oxide (In2O3), zinc oxide (ZnO), or tin oxide (SnO2). In addition, the organic particles may include an acrylic resin or a urethane-based resin. A diameter of the scatterer may be several nanometers to several tens of nanometers.

The plurality of color filters CF1, CF2, and CF3 may include first color filters CF1, second color filters CF2, and third color filters CF3.

Each of the first color filters CF1 may be disposed on the wavelength conversion layer QDL in the first light emitting area EA1. Also, each of the first color filters CF1 may be disposed on the partition wall PW. Each of the first color filters CF1 may transmit the first light and absorb or block the fourth light. For example, each of the first color filters CF1 may transmit light of the blue wavelength band and absorb or block light of the green and red wavelength bands. Therefore, each of the first color filters CF1 may transmit the first light, which is not converted by the wavelength conversion layer QDL, from among the first light emitted from the light emitting element LE, and may absorb or block the fourth light converted by the wavelength conversion layer QDL. Therefore, each of the first light emitting areas EA1 may emit the first light.

Each of the second color filters CF2 may be disposed on the wavelength conversion layer QDL in the second light emitting area EA2. Also, each of the second color filters CF2 may be disposed on the partition wall PW. Each of the second color filters CF2 may transmit the second light, and may absorb or block the first light and the third light. For example, each of the second color filters CF2 may transmit the light of the green wavelength band and absorb or block the light of the blue and red wavelength bands. Therefore, each of the second color filters CF2 may absorb or block the first light that is not converted by the wavelength conversion layer QDL among the first light emitted from the light emitting element LE. In addition, each of the second color filters CF2 may transmit the second light corresponding to the green wavelength band from among the fourth light converted by the wavelength conversion layer QDL, and may absorb or block the third light corresponding to the blue wavelength band. Therefore, each of the second light emitting areas EA2 may emit the second light.

Each of the third color filters CF3 may be disposed on the wavelength conversion layer QDL in the third light emitting area EA3. Also, each of the third color filters CF3 may be disposed on the partition wall PW. Each of the third color filters CF3 may transmit the third light and absorb or block the first light and the second light. For example, each of the third color filters CF3 may transmit the light of the red wavelength band and absorb or block the light of the blue and green wavelength bands. Therefore, each of the third color filters CF3 may absorb or block the first light that is not converted by the wavelength conversion layer QDL from among the first light emitted from the light emitting element LE. In addition, each of the third color filters CF3 may transmit the third light corresponding to the red wavelength band from among the fourth light converted by the wavelength conversion layer QDL, and may absorb or block the second light corresponding to the green wavelength band. Therefore, each of the third light emitting areas EA3 may emit the third light.

A black matrix may be disposed among the plurality of color filters CF1, CF2, and CF3. For example, the black matrix may be disposed between the first color filter CF1 and the second color filter CF2, between the second color filter CF2 and the third color filter CF3, and between the first color filter CF1 and the third color filter CF3. The black matrix may include inorganic black pigments or organic black pigments, such as carbon black.

Because the light emitting elements LE and the wavelength conversion layer QDL are disposed in each of the plurality of light emitting areas EA1, EA2, and EA3 partitioned by the partition wall PW, the thickness of the partition wall PW may be thicker than that of the light emitting element LE. In this case, the common electrode CE may be disconnected on the sides of the partition wall PW by a great thickness and a narrow width of the partition wall PW. That is, because an inclination angle of each of the sides of the partition wall PW is close to 90°, approximately, the common electrode CE may be disconnected on the sides of the partition wall PW.

As shown in FIGS. 5 to 9, the common electrode CE may be in contact with the upper surface of the common connection electrode CCE and the upper surface of the light emitting element LE, which are exposed without being covered by the second insulating film INS2, at the edges of each of the plurality of light emitting areas EA1, EA2, and EA3 and in each of the plurality of common connection areas CCA1, CCA2, and CCA3. Therefore, even though the common electrode CE is disconnected on the sides of the partition wall PW due to the great thickness and the narrow width of the partition wall PW, the common voltage may stably be supplied to the common electrode CE through the common connection electrode CCE.

Figure 10:
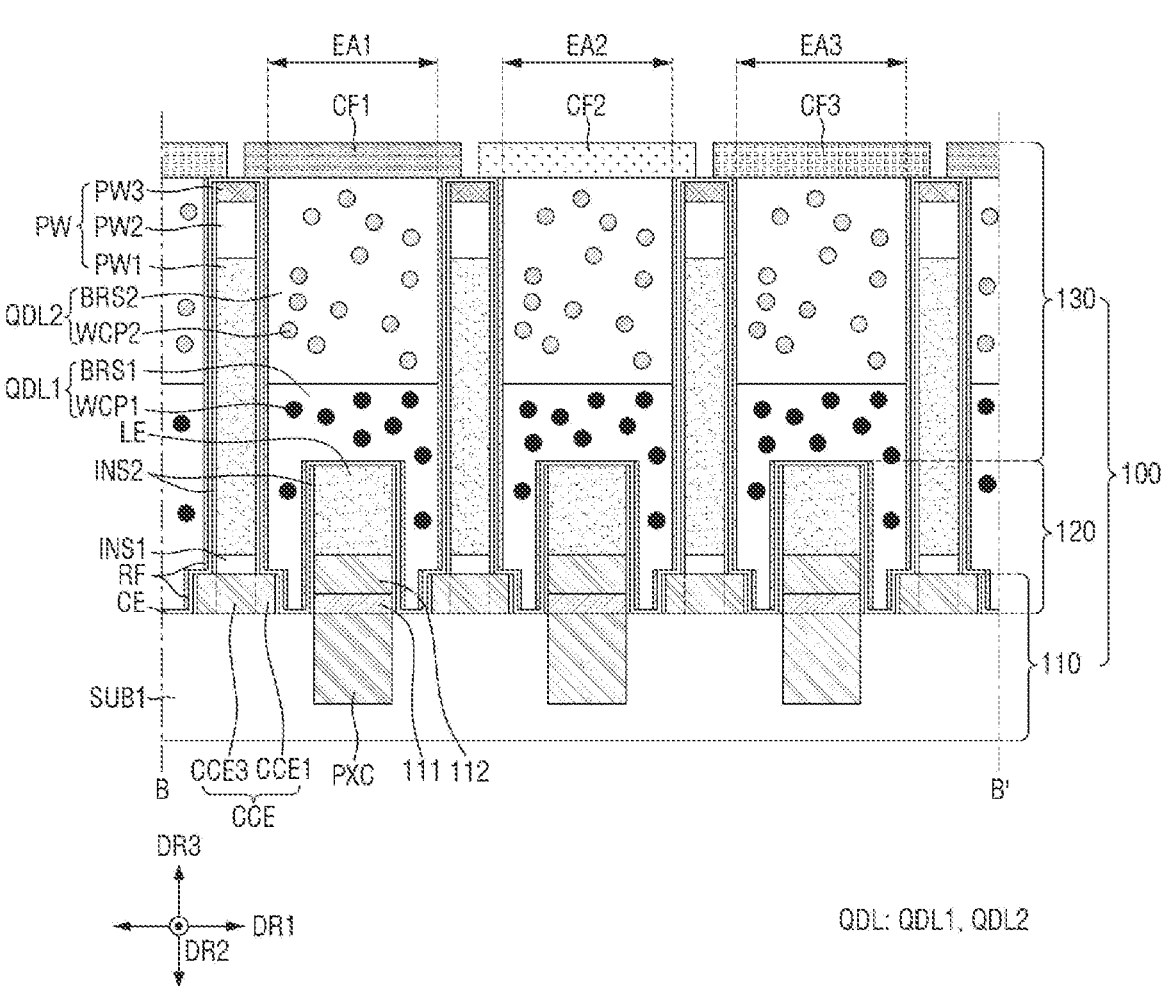
FIG. 10 is a cross-sectional view illustrating an example of a display panel taken the line B-B' of FIG. 3.

FIG. 10 is a cross-sectional view illustrating an example of a display panel taken along the line B-B' of FIG. 3.

The embodiment of FIG. 10 is different from the embodiment of FIG. 6 in that the wavelength conversion layer QDL includes a first wavelength conversion layer QDL1 and a second wavelength conversion layer QDL2 in each of the first light emitting areas EA1, the second light emitting areas EA2 and the third light emitting areas EA3. In FIG. 10, the description duplicated with the embodiment of FIG. 6 will be omitted.

Referring to FIG. 10, the first wavelength conversion layer QDL1 may be disposed on the light emitting element LE. The first wavelength conversion layer QDL1 may include a first base resin BRS1 and first wavelength conversion particles WCP1. The first base resin BRS1 may include a light-transmissive organic material. For example, the first base resin BRS1 may include an epoxy-based resin, an acrylic resin, a cardo-based resin, or an imide-based resin.

The first wavelength conversion particles WCP1 may convert the first light incident from the light emitting element LE into the second light. For example, the first wavelength conversion particles WCP1 may convert the light of the blue wavelength band into the light of the green wavelength band. The first wavelength conversion particles WCP1 may be quantum dots (QD), quantum rods, fluorescent materials, or phosphorescent materials.

The second wavelength conversion layer QDL2 may be disposed on the first wavelength conversion layer QDL1. The second wavelength conversion layer QDL2 may include a second base resin BRS2 and second wavelength conversion particles WCP2. The second base resin BRS2 may include a light-transmissive organic material. For example, the second base resin BRS2 may include an epoxy-based resin, an acrylic resin, a cardo-based resin, or an imide-based resin. The second wavelength conversion particles WCP2 may convert the first light incident from the light emitting element LE into the third light. For example, the second wavelength conversion particles WCP2 may convert the light of the blue wavelength band into the light of the red wavelength band. The second wavelength conversion particles WCP2 may be quantum dots (QD), quantum rods, fluorescent materials, or phosphorescent materials.

The first light that is not converted by the first wavelength conversion layer QDL1 and the second wavelength conversion layer QDL2 from among the first light emitted from the light emitting element LE may transmit through the first color filter CF1. Among the first light emitted from the light emitting element LE, the second light converted by the first wavelength conversion layer QDL1 and the third light converted by the second wavelength conversion layer QDL2 may be absorbed or blocked by the first color filter CF1. Therefore, the first light emitting area EA1 may emit the first light.

The first light that is not converted by the first wavelength conversion layer QDL1 and the second wavelength conversion layer QDL2 from among the first light emitted from the light emitting element LE may be absorbed or blocked by the second color filter CF2. In addition, from among the first light emitted from the light emitting element LE, the second light converted by the first wavelength conversion layer QDL1 may transmit through the second color filter CF2 but the third light converted by the second wavelength conversion layer QDL2 may be absorbed or blocked by the second color filter CF2. Therefore, the second light emitting area EA2 may emit the second light.

The first light that is not converted by the first wavelength conversion layer QDL1 and the second wavelength conversion layer QDL2 from among the first light emitted from the light emitting element LE may be absorbed or blocked by the third color filter CF3. In addition, from among the first light emitted from the light emitting element LE, the second light converted by the first wavelength conversion layer QDL1 is absorbed or blocked by the third color filter CF3 but the third light converted by the second wavelength conversion layer QDL2 may transmit through the third color filter CF3. Therefore, the third light emitting area EA3 may emit the third light.

Although FIG. 10 illustrates that the first wavelength conversion layer QDL1 is disposed on the light emitting element LE and the second wavelength conversion layer QDL2 is disposed on the first wavelength conversion layer QDL1, the present disclosure is not limited thereto. For example, the second wavelength conversion layer QDL2 may be disposed on the light emitting element LE, and the first wavelength conversion layer QDL1 may be disposed on the second wavelength conversion layer QDL2.

Figure 11:
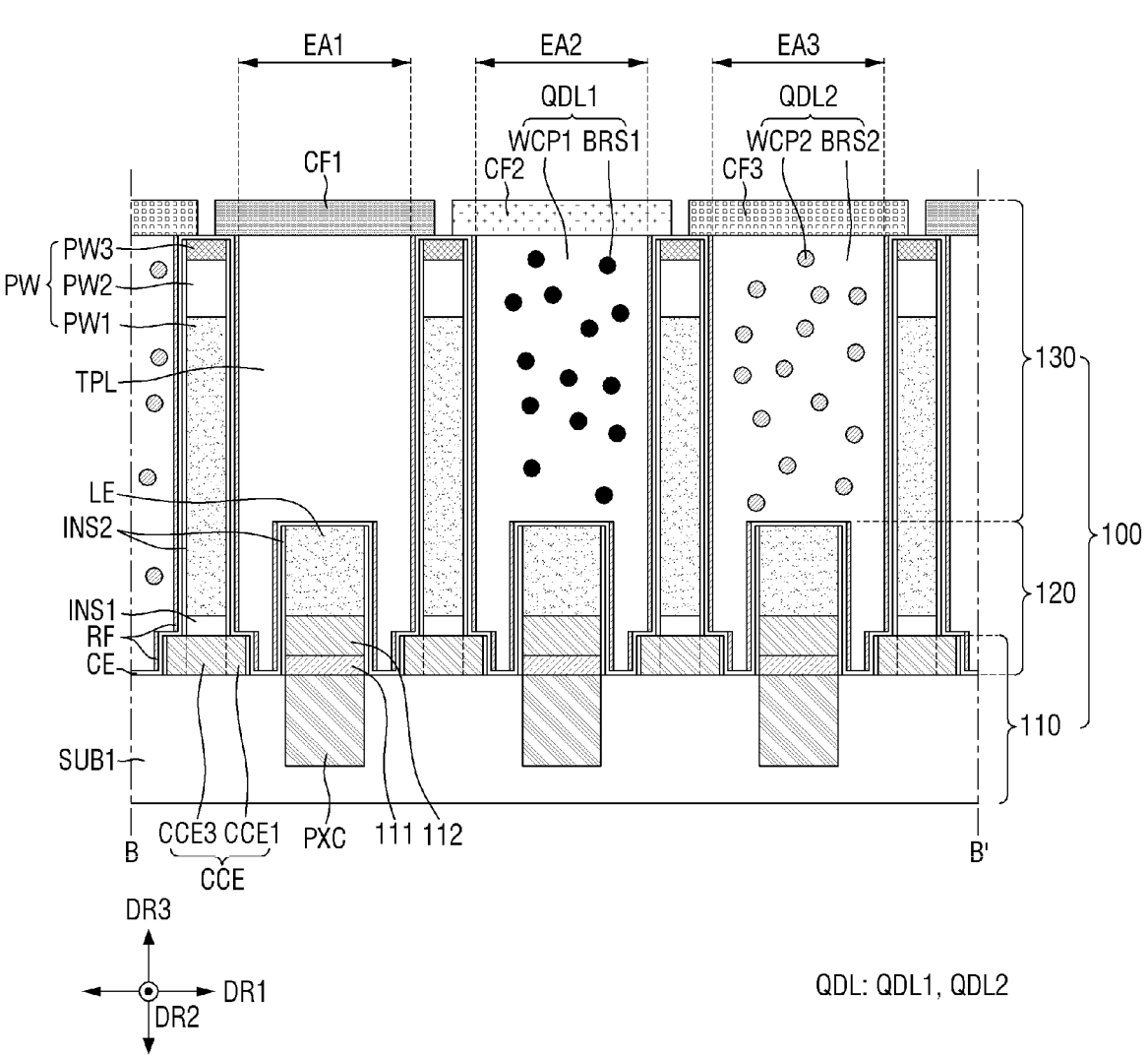
FIG. 11 is a cross-sectional view illustrating an example of a display panel taken along the line B-B' of FIG. 3.

FIG. 11 is a cross-sectional view illustrating still an example of a display panel taken along the line B-B' of FIG. 3.

The embodiment of FIG. 11 is different from the embodiment of FIG. 6 in that a light transmitting layer TPL is disposed in each of the first light emitting areas EA1, a first wavelength conversion layer QDL1 is disposed in each of the second light emitting areas EA2, and a second wavelength conversion layer QDL2 is disposed in each of the third light emitting areas EA3. In FIG. 11, the description duplicated with the embodiment of FIG. 6 will be omitted.

Referring to FIG. 11, the light transmitting layer TPL may be disposed on the light emitting element LE in each of the first light emitting areas EA1. The light transmitting layer TPL may include a light-transmissive organic material. For example, the light transmitting layer TPL may include an epoxy-based resin, an acrylic resin, a cardo-based resin, or an imide-based resin.

The first wavelength conversion layer QDL1 may be disposed on the light emitting element LE in each of the second light emitting areas EA2. The first wavelength conversion layer QDL1 may include a first base resin BRS1 and first wavelength conversion particles WCP1. Because the first base resin BRS1 and the first wavelength conversion particles WCP1 are substantially the same as those described with reference to FIG. 10, their description will be omitted.

The second wavelength conversion layer QDL2 may be disposed on the light emitting element LE in each of the third light emitting areas EA3. The second wavelength conversion layer QDL2 may include a second base resin BRS2 and second wavelength conversion particles WCP2. Because the second base resin BRS2 and the second wavelength conversion particles WCP2 are substantially the same as those described with reference to FIG. 10, their description will be omitted.

The first light emitted from the light emitting element LE in the first light emitting area EA1 may transmit through the first color filter CF1 via the light transmitting layer TPL. That is, because the first light emitted from the light emitting element LE in the first light emitting area EA1 is not converted by a separate wavelength conversion layer, the first light may transmit through the first color filter CF1. Therefore, the first light emitting area EA1 may emit the first light.

The second light converted by the first wavelength conversion layer QDL1 from among the first light emitted from the light emitting element LE in the second light emitting area EA2 may transmit through the second color filter CF2. The first light that is not converted by the first wavelength conversion layer QDL1 from among the first light emitted from the light emitting element LE in the second light emitting area EA2 may be absorbed or blocked by the second color filter CF2. Therefore, the second light emitting area EA2 may emit the second light.

The third light converted by the second wavelength conversion layer QDL2 among the first light emitted from the light emitting element LE in the third light emitting area EA2 may transmit through the third color filter CF3. The first light that is not converted by the second wavelength conversion layer QDL2 from among the first light emitted from the light emitting element LE in the third light emitting area EA3 may be absorbed or blocked by the third color filter CF3. Therefore, the third light emitting area EA3 may emit the third light.

Figure 12:
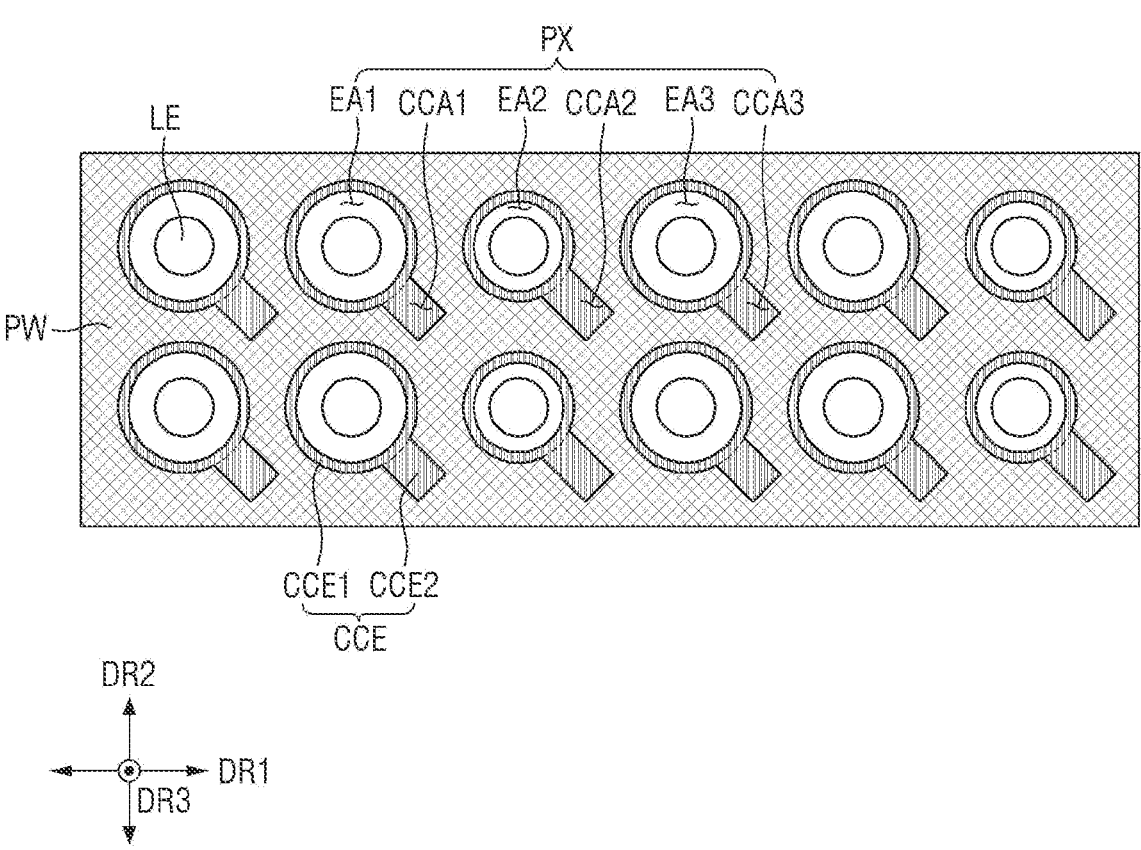
FIG. 12 is a layout view illustrating pixels of a display panel according to one or more embodiments.

FIG. 12 is a layout view illustrating pixels of a display panel according to one or more embodiments.

The embodiment of FIG. 12 is different from the embodiment of FIG. 3 in that a size of each of the second light emitting areas EA2 is different from that of each of the first light emitting areas EA1 and the third light emitting areas EA3, and a size of each of the second common connection areas CCA2 is different from that of each of the first common connection areas CCA1 and the third common connection area CCA3. In FIG. 12, the description duplicated with the embodiment of FIG. 3 will be omitted.

Referring to FIG. 12, when the sizes of the first light emitting area EA1, the second light emitting area EA2, and the third light emitting area EA3 are the same as one another, luminance of the second light emitted from the second light emitting area EA2 may be higher than luminance of the first light emitted from the first light emitting area EA1 or luminance of the third light emitted from the third light emitting area EA3. In addition, when considering support capability of the partition wall PW and adhesion of the partition wall PW, it is preferable that a space in which the partition wall PW is disposed is wide. Therefore, in order to accommodate an arrangement space of the partition wall PW, the size of each of the second light emitting areas EA2 may be smaller than that of each of the first light emitting areas EA1 and the third light emitting areas EA3. In this case, the sizes of the first and third light emitting areas EA1 and EA3 may substantially be the same as each other.

In addition, as a contact area between the common electrode CE and the common connection electrode CCE becomes wide, contact resistance between the common electrode CE and the common connection electrode CCE may be reduced, and the common electrode CE and the common connection electrode CCE may be stably connected to each other. Therefore, when the size of each of the second light emitting areas EA2 is smaller than that of each of the first light emitting area EA1 and the third light emitting areas EA3, the arrangement space of each of the second common connection areas CCA2 may be greater than that of each of the first common connection areas CCA1 and the third common connection areas CCA3. That is, the size of each of the second common connection areas CCA2 may be greater than that of each of the first common connection areas CCA1 and the third common connection areas CCA3. In this case, the sizes of the first common connection areas CCA1 and the third common connection areas CCA3 may substantially be the same as each other.

Figure 13:
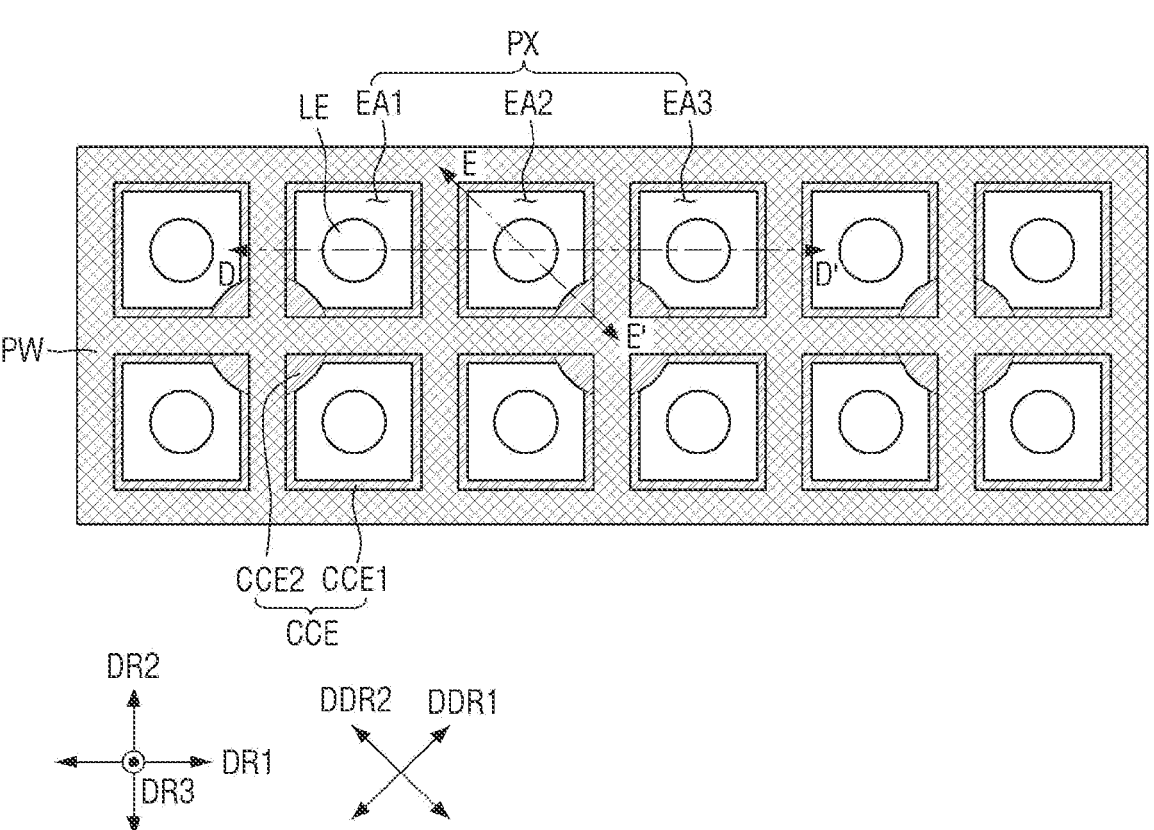
FIG. 13 is a layout view illustrating pixels of a display panel according to one or more embodiments.

FIG. 13 is a layout view illustrating pixels of a display panel according to one or more embodiments.

The embodiment of FIG. 13 is different from the embodiment of FIG. 3 in that each of the plurality of light emitting areas EA1, EA2, and EA3 has a rectangular plane shape, and the second common connection electrode CCE2 is disposed on any one corner (or vertex) of each of the plurality of light emitting areas EA 1, EA2, and EA3.

Referring to FIG. 13, the first common connection electrode CCE1 and the second common connection electrode CCE2 may be disposed in each of the plurality of light emitting areas EA1, EA2, and EA3. The first common connection electrode CCE1 may be disposed at the edges of each of the plurality of light emitting areas EA1, EA2, and EA3. The second common connection electrode CCE2 may be disposed on at least one corner (or vertex) of each of the plurality of light emitting areas EA1, EA2, and EA3.

Although FIG. 13 illustrates that the second common connection electrode CCE2 is disposed on any one corner (or vertex) from among four corners (or vertices) of each of the plurality of light emitting areas EA1, EA2, and EA3 when each of the plurality of light emitting areas EA1, EA2, and EA3 has a rectangular plane shape, but the present disclosure is not limited thereto. For example, the second common connection electrode CCE2 may be disposed on two corners (or vertices), three corners (or vertices), or four corners (or vertices) of each of the four corners (or vertices) of each of the plurality of light emitting areas EA1, EA2, and EA3.

Although the second common connection electrode CCE2 has a fan-shaped plane shape, the present disclosure is not limited thereto. The second common connection electrode CCE2 may have a polygonal or irregular plane shape.

The second common connection electrode CCE2 may be disposed on any one corner (or vertex) in each of four light emitting areas adjacent to one another in the first direction DR1 and the second direction DR2. Positions of corners (or vertices) on which the second common connection electrode CCE2 is disposed in the four light emitting areas adjacent to one another in the first direction DR1 and the second direction DR2 may be adjacent to one another.

For example, when the second common connection electrode CCE2 is disposed on a left lower corner (or vertex) in one of the light emitting areas adjacent to each other in the first direction DR1, the second common connection electrode CCE2 may be disposed on a right lower corner (or vertex) in the other light emitting area. Alternatively, when the second common connection electrode CCE2 is disposed on a left upper corner (or vertex) in any one of the light emitting areas adjacent to each other in the first direction DR1, the second common connection electrode CCE2 may be disposed on a right upper corner (or vertex) in the other light emitting area.

Also, when the second common connection electrode CCE2 is disposed on the left lower corner (or vertex) in any one of the light emitting areas adjacent to each other in the second direction DR2, the second common connection electrode CCE2 may be disposed on the left upper corner (or vertex) in the other light emitting area. Alternatively, when the second common connection electrode CCE2 is disposed on the right lower corner (or vertex) in any one of the light emitting areas adjacent to each other in the second direction DR2, the second common connection electrode CCE2 may be disposed on the right upper corner (or vertex) in the other light emitting area.

Because the cross-sectional view of the display panel taken along the line D-D' shown in FIG. 13 is substantially the same as that of FIG. 6, FIG. 10, FIG. 11, or FIG. 12, its description will be omitted.

Figure 14:
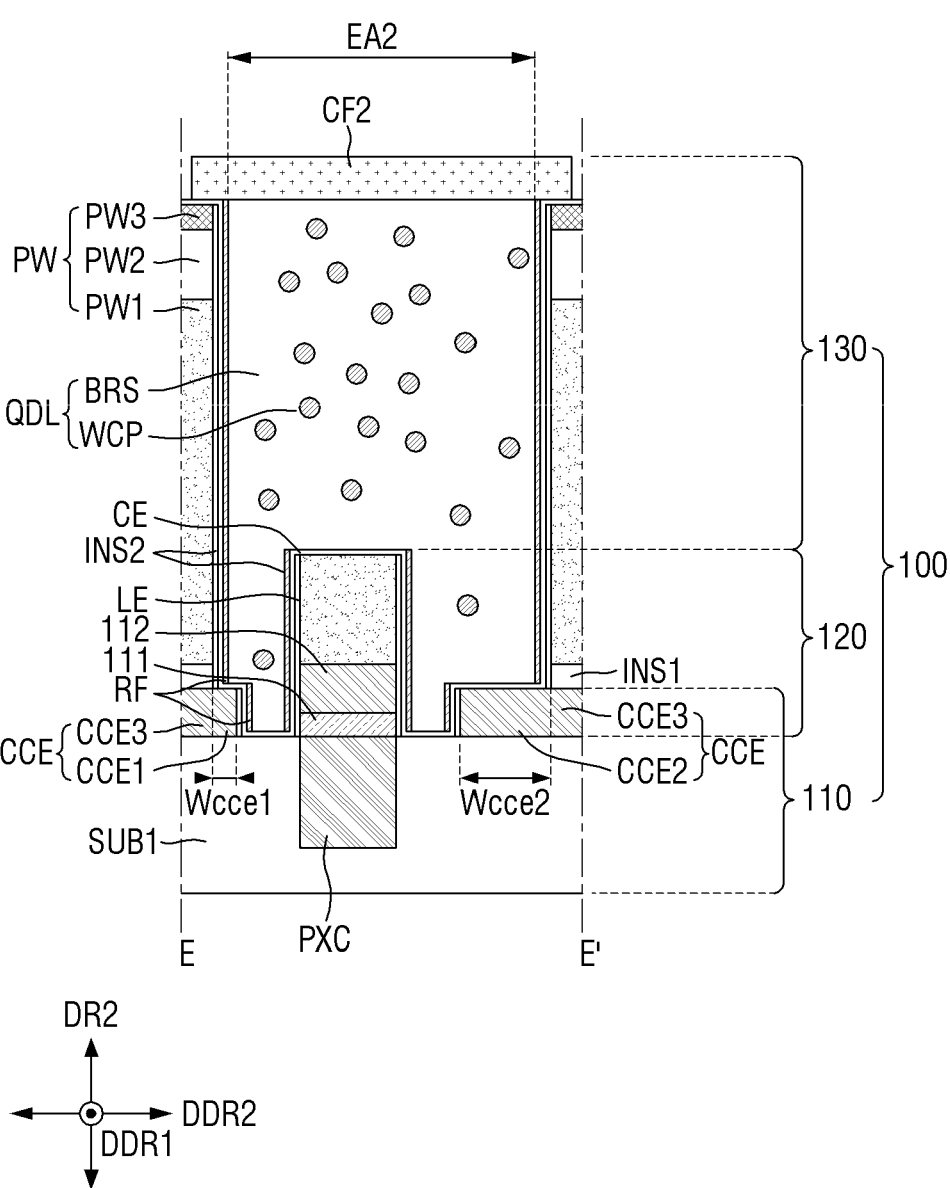
FIG. 14 is a cross-sectional view illustrating an example of a display panel taken along the line E-E' of FIG. 13.

FIG. 14 is a cross-sectional view illustrating an example of a display panel taken along the line E-E' of FIG. 13.

The embodiment shown in FIG. 14 is different from the embodiment of FIG. 7 in that the second common connection electrode CCE2 is disposed in each of the plurality of light emitting areas EA1, EA2, and EA3 instead of the plurality of common connection areas CCA1, CCA2, and CCA3. In FIG. 14, the description duplicated with the embodiment of FIG. 7 will be omitted.

Referring to FIG. 14, a maximum width Wcce2 of the second common connection electrode CCE2 may be wider than a maximum width Wcce1 of the first common connection electrode CCE1. A distance Dcce2 between the second common connection electrode CCE2 and the pixel electrode 111 may be shorter than a distance Dcce1 between the first common connection electrode CCE1 and the pixel electrode 111.

The common electrode CE may be in contact with the upper surface of the first common connection electrode CCE1, the upper surface of the second common connection electrode CCE2, and the upper surface of the light emitting element LE, which are exposed without being covered by the second insulating film INS2, at the edges of each of the plurality of light emitting areas EA1, EA2, and EA3 and on at least one corner (vertex). Because the maximum width Wcce2 of the second common connection electrode CCE2 is wider than the maximum width Wcce1 of the first common connection electrode CCE1, the contact area between the common connection electrode CCE and the common electrode CE may be increased in each of the plurality of light emitting areas EA1, EA2, and EA3 due to the second common connection electrode CCE2. Therefore, even though the common electrode CE is disconnected due to the great thickness of the partition wall PW, the common voltage may stably be supplied to the common electrode CE through the common connection electrode CCE.

Figure 15:
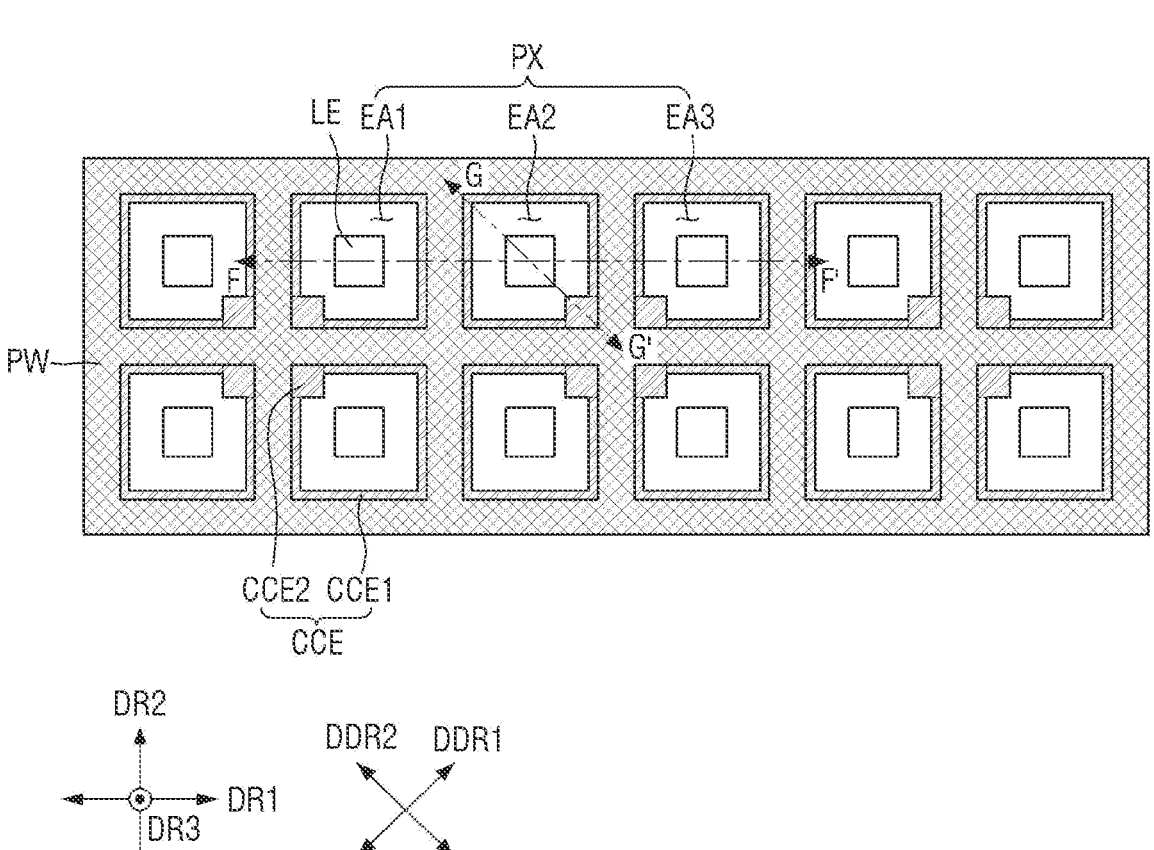
FIG. 15 is a layout view illustrating pixels of a display panel according to one or more embodiments.

FIG. 15 is a layout view illustrating pixels of a display panel according to one or more embodiments.

The embodiment of FIG. 15 is different from the embodiment of FIG. 13 in that each of the light emitting elements LE has a rectangular plane shape and the second common connection electrode CCE2 has a rectangular plane shape. Therefore, the description of the embodiment of FIG. 15 will be omitted.

Because the cross-sectional view of the display panel taken along the line F-F' shown in FIG. 15 is substantially the same as that of FIG. 6, FIG. 10, FIG. 11, or FIG. 12, its description will be omitted. In addition, because the cross-sectional view of the display panel taken along the line G-G' shown in FIG. 15 is substantially the same as that of FIG. 14, its description will be omitted.

Figure 16:
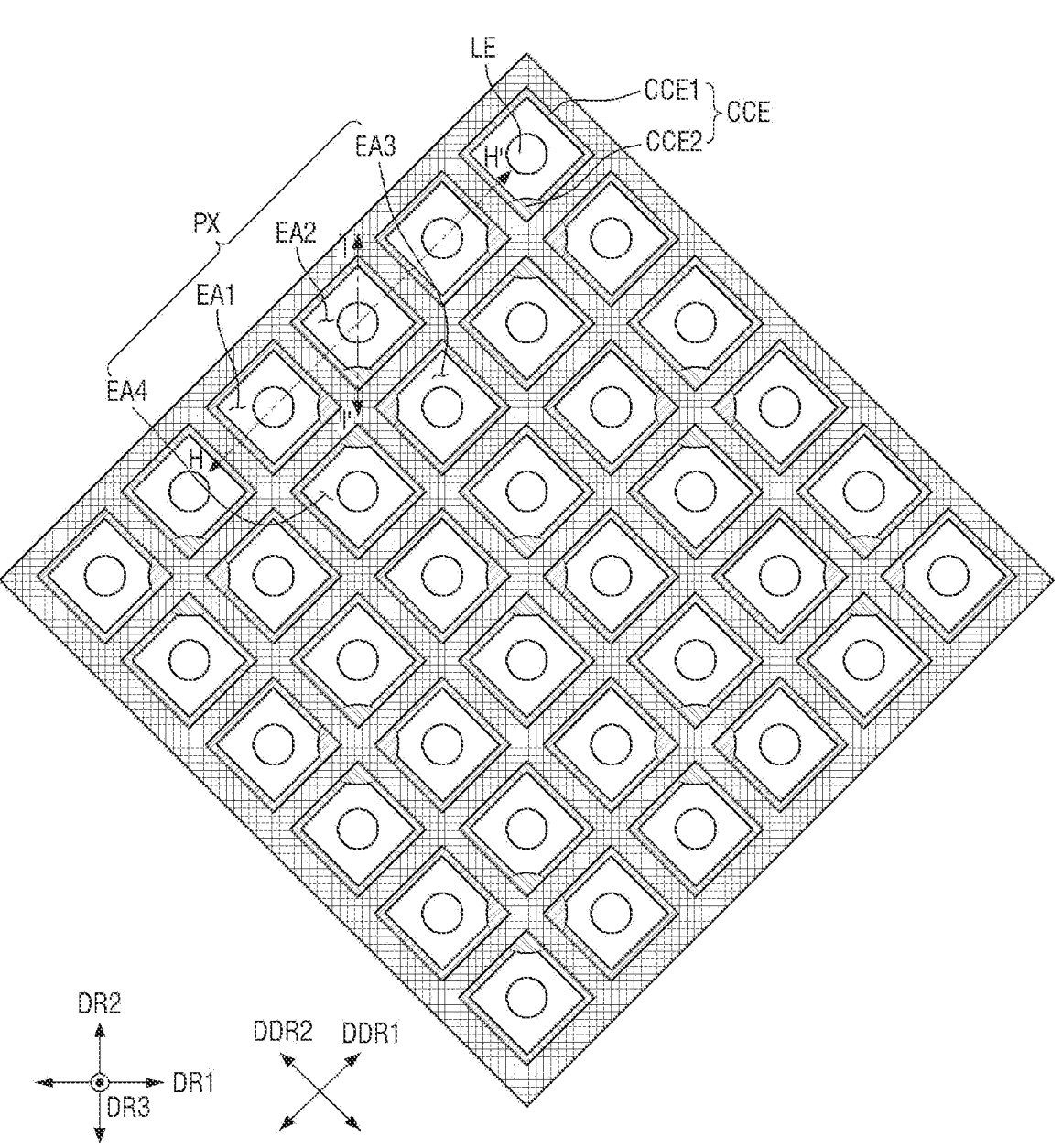
FIG. 16 is a layout view illustrating pixels of a display panel according to one or more embodiments.

FIG. 16 is a layout view illustrating pixels of a display panel according to one or more embodiments.

The embodiment of FIG. 16 is different from the embodiment of FIG. 13 in that each of the plurality of light emitting areas EA1, EA2, EA3, and EA4 has a rhombus plane shape, and the pixel PX includes four light emitting areas EA1, EA2, EA3, and EA4. In FIG. 16, the description duplicated with the embodiment of FIG. 13 will be omitted.

Referring to FIG. 16, the pixel PX may include a first light emitting area EA1, a second light emitting area EA2, a third light emitting area EA3, and a fourth light emitting area EA4.

The first light emitting area EA1 and the second light emitting area EA2 may be disposed to be adjacent to each other in the first diagonal direction DDR1, and the third light emitting area EA3 and the fourth light emitting area EA4 may be disposed to be adjacent to each other in the first diagonal direction DDR1. The first light emitting area EA1 and the fourth light emitting area EA4 may be disposed to be adjacent to each other in the second diagonal direction DDR2 crossing the first diagonal direction DDR1. The second light emitting area EA2 and the third light emitting area EA3 may be disposed to be adjacent to each other in the second diagonal direction DDR2. The first diagonal direction DDR1 may be the direction between the first direction DR1 and the second direction DR2, and the second diagonal direction DDR2 may be the direction orthogonal to the first diagonal direction.

The first light emitting area EA1, the second light emitting area EA2, and the third light emitting area EA3 may substantially be the same as those described with reference to FIG. 3 except for their arrangement positions. The fourth light emitting area EA4 indicates an area for emitting the second light. The fourth light emitting area EA4 may convert a portion of the first light output from the light emitting element LE into the second light and output the second light.

Because the cross-sectional view of the display panel taken along the line H-H' shown in FIG. 16 is substantially the same as that of FIG. 6, FIG. 10, FIG. 11, or FIG. 12, its description will be omitted. In addition, since the cross-sectional view of the display panel taken along the line I-I' shown in FIG. 16 is substantially the same as that of FIG. 14, its description will be omitted.

Figure 17:
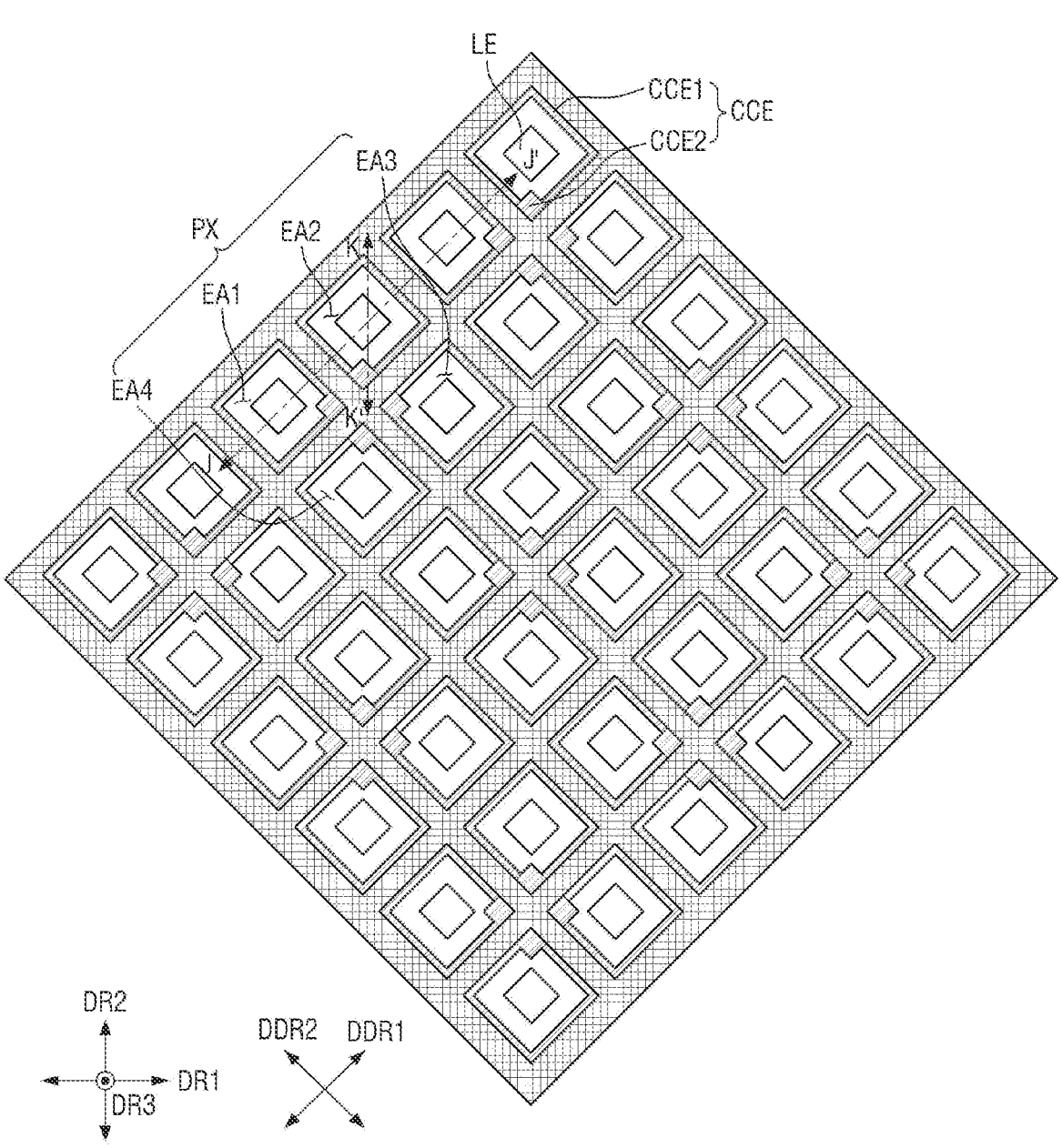
FIG. 17 is a layout view illustrating pixels of a display panel according to one or more embodiments.

FIG. 17 is a layout view illustrating pixels of a display panel according to one or more embodiments.

The embodiment of FIG. 17 is different from the embodiment of FIG. 16 in that each of the light emitting elements LE has a rhombus plane shape and the second common connection electrode CCE2 has a rhombus plane shape. Therefore, the description of the embodiment of FIG. 17 will be omitted.

Because the cross-sectional view of the display panel taken along the line J-J' shown in FIG. 17 is substantially the same as that of FIG. 6, FIG. 10, FIG. 11, or FIG. 12, its description will be omitted. In addition, Because the cross-sectional view of the display panel taken along the line K-K' shown in FIG. 17 is substantially the same as that of FIG. 14, its description will be omitted.

Figure 18:
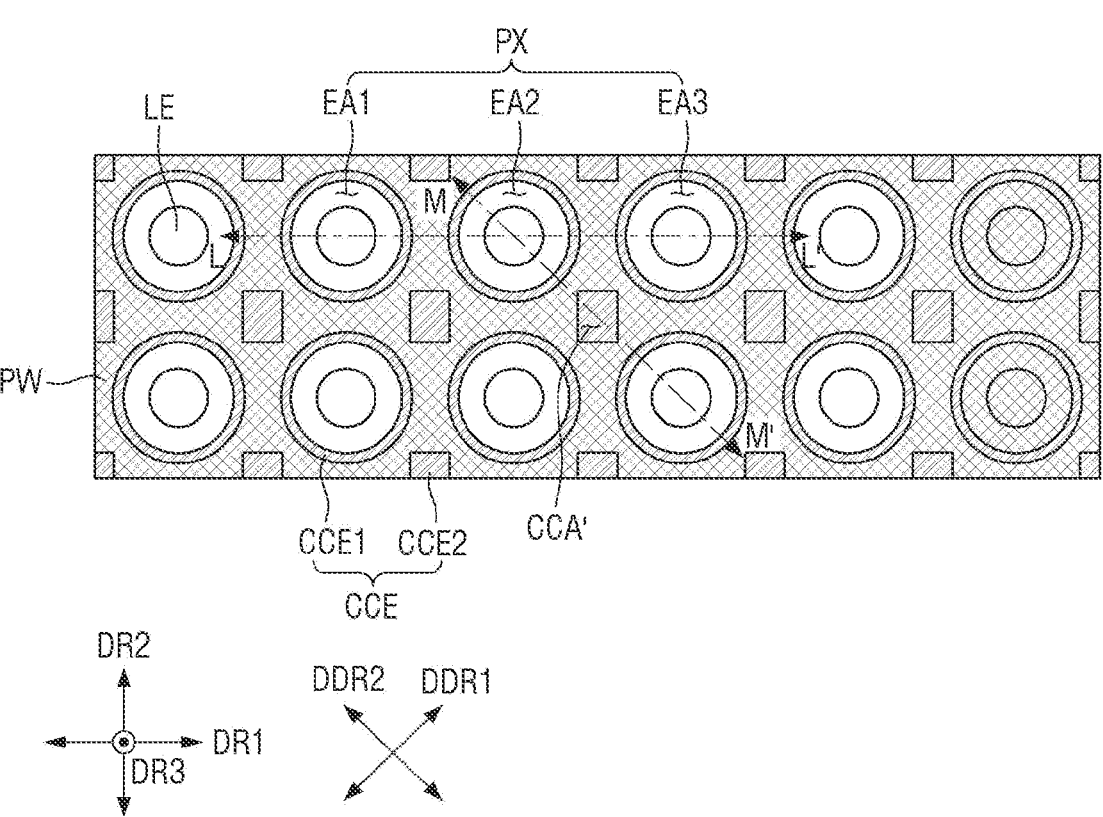
FIG. 18 is a layout view illustrating pixels of a display panel according to one or more embodiments.

FIG. 18 is a layout view illustrating pixels of a display panel according to further still another embodiment.

The embodiment of FIG. 18 is different from the embodiment of FIG. 3 in that each of a plurality of common connection areas CCA' is spaced from the plurality of light emitting areas EA1, EA2, and EA3. In FIG. 18, the description duplicated with the embodiment of FIG. 3 will be omitted.

Referring to FIG. 18, each of the plurality of common connection areas CCA' may be an area where the common connection electrode CCE and the common electrode CE are connected to each other. Each of the plurality of common connection areas CCA' may be spaced from the plurality of light emitting areas EA1, EA2, and EA3. Each of the plurality of common connection areas CCA' may be disposed between adjacent light emitting areas in the first diagonal direction DDR1. In addition, each of the plurality of common connection areas CCA' may be disposed between adjacent light emitting areas in the second diagonal direction DDR2. The first diagonal direction DDR1 may be the direction between the first direction DR1 and the second direction DR2, and the second diagonal direction DDR2 may be the direction orthogonal to the first diagonal direction.

Each of the plurality of light emitting areas EA1, EA2, and EA3 and the plurality of common connection areas CCA' may be partitioned by the partition wall PW. The partition wall PW may be disposed to be around (or surround) the plurality of light emitting areas EA1, EA2, and EA3 and the plurality of common connection areas CCA', respectively.

Each of the plurality of common connection areas CCA' may have a rectangular plane shape, but the present disclosure is not limited thereto. Each of the plurality of common connection areas CCA' may have a polygonal plane shape in addition to the rectangular plane shape, a circular plane shape, an oval plane shape, or an irregular plane.

Figure 19:
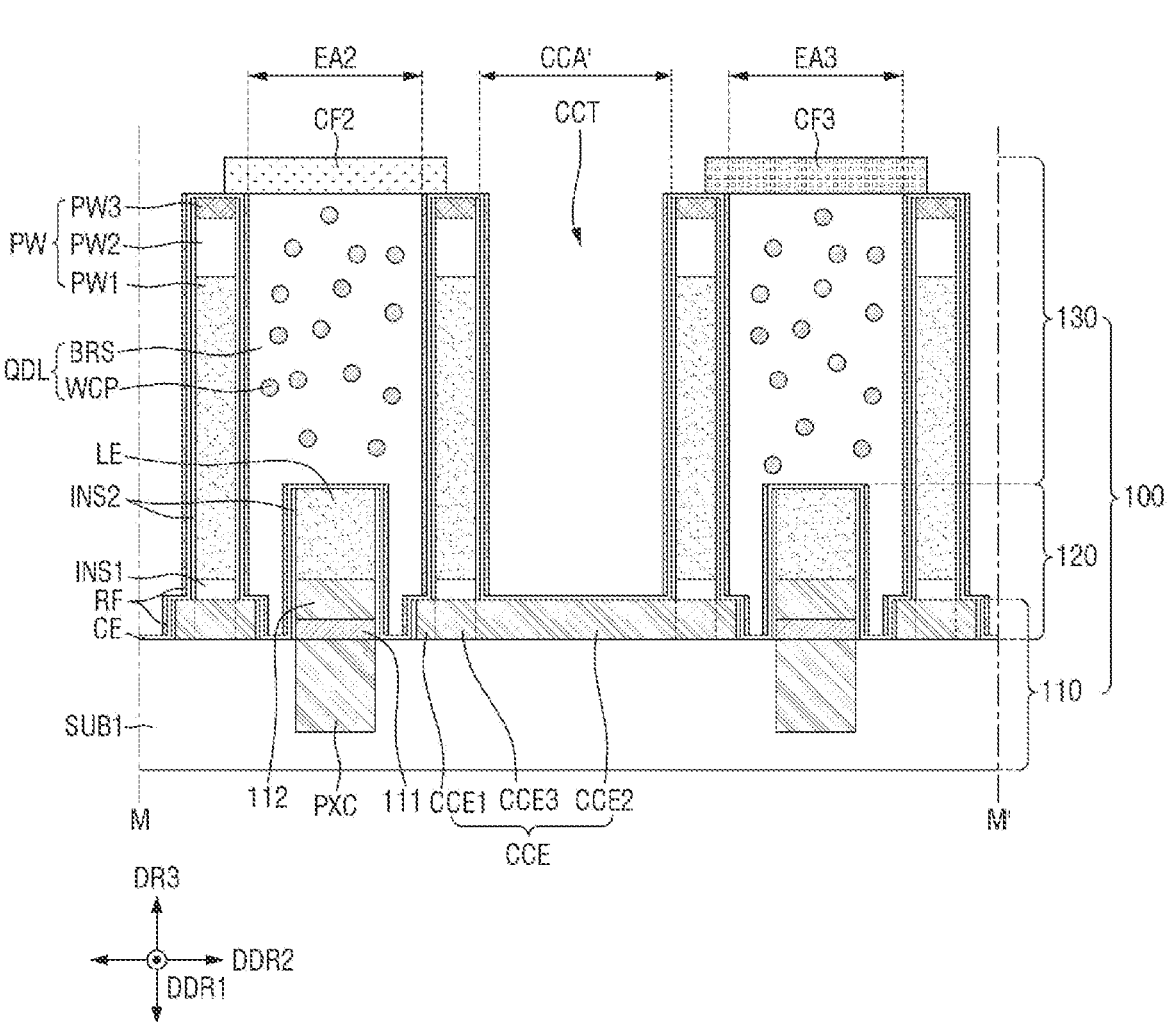
FIG. 19 is a cross-sectional view illustrating an example of a display panel taken along the line M-M' of FIG. 18.

FIG. 19 is a cross-sectional view illustrating an example of a display panel taken along the line M-M' of FIG. 18.

The embodiment of FIG. 19 is different from the embodiment of FIG. 7 in that a common connection area CCA' is further disposed between the second light emitting area EA2 and the third light emitting area EA3.

Referring to FIG. 19, the common connection area CCA' may include a hole CCT that exposes the common electrode CE by passing through the partition wall PW. The common electrode CE may be in contact with the upper surface of the second common connection electrode CCE2 in the common connection area CCA'. Due to the common connection area CCA', the contact area between the common connection electrode CCE and the common electrode CE may be increased. Therefore, even though the common electrode CE is disconnected due to the great thickness of the partition wall PW, the common voltage may stably be supplied to the common electrode CE through the common connection electrode CCE.

Although FIG. 19 illustrates that the wavelength conversion layer QDL is not disposed in the common connection area CCA', the present disclosure is not limited thereto. For example, even though the light emitting element LE is not disposed in the common connection area CCA', the wavelength conversion layer QDL may be disposed in the common connection area CCA'. In this case, a color filter may be disposed on the wavelength conversion layer QDL of the common connection area CCA'.

Figure 20:
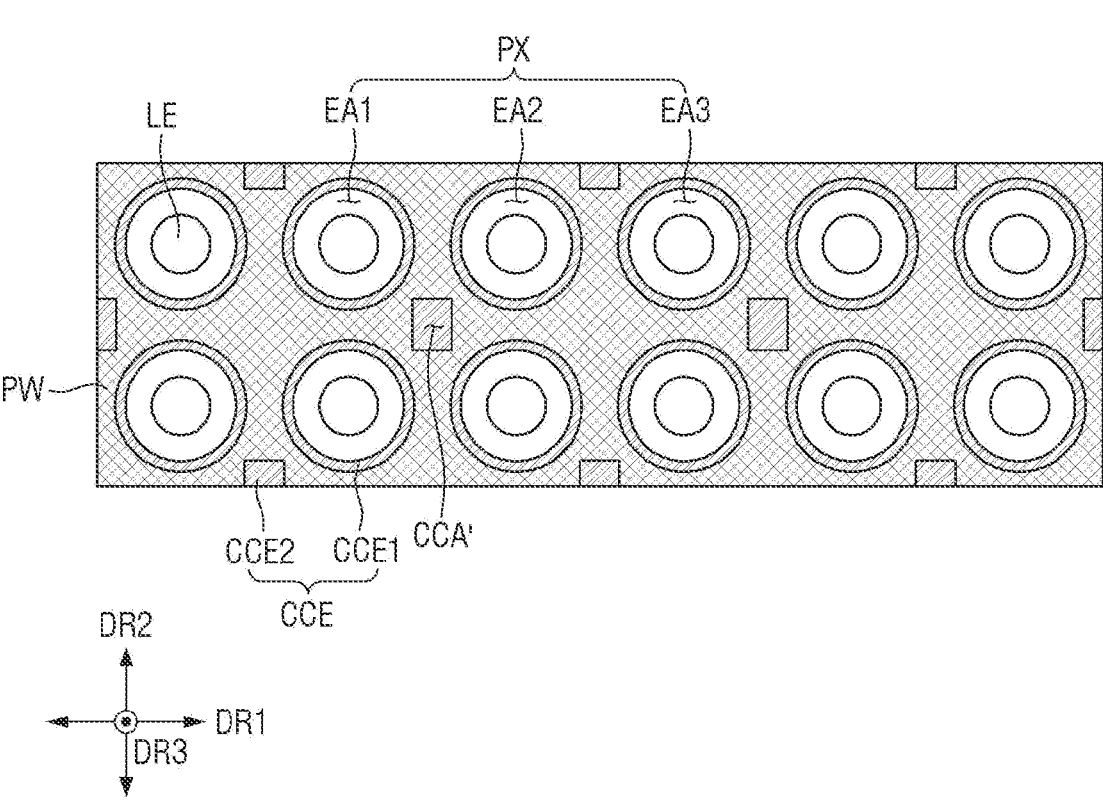
FIG. 20 is a layout view illustrating pixels of a display panel according to one or more embodiments.

FIG. 20 is a layout view illustrating pixels of a display panel according to one or more embodiments.

The embodiment of FIG. 20 is different from the embodiment of FIG. 18 in that the number of the plurality of common connection areas CCA' is reduced to half. In FIG. 20, the description duplicated with the embodiment of FIG. 18 will be omitted.

Referring to FIG. 20, a width of the partition wall PW may be narrower in an area where the common connection area CCA' is disposed, than in the area where the common connection area CCA' is not disposed. Because the partition wall PW has a narrow width as compared with the thickness of the partition wall PW, support capability of the partition wall PW may be lowered, so as to cause destruction of the partition wall PW, or adhesion of the partition wall PW may be reduced to cause separation of the partition wall PW. Therefore, the number of the plurality of common connection areas CCA' may properly be designed in consideration of the support capability of the partition wall PW and the adhesion of the partition wall PW.

FIG. 21 is a flow chart illustrating a method for fabricating a display device according to one or more embodiments of the present disclosure. FIGS. 22 to 33 are cross-sectional views illustrating a method for fabricating a display device according to one or more embodiments of the present disclosure.

Figure 22:
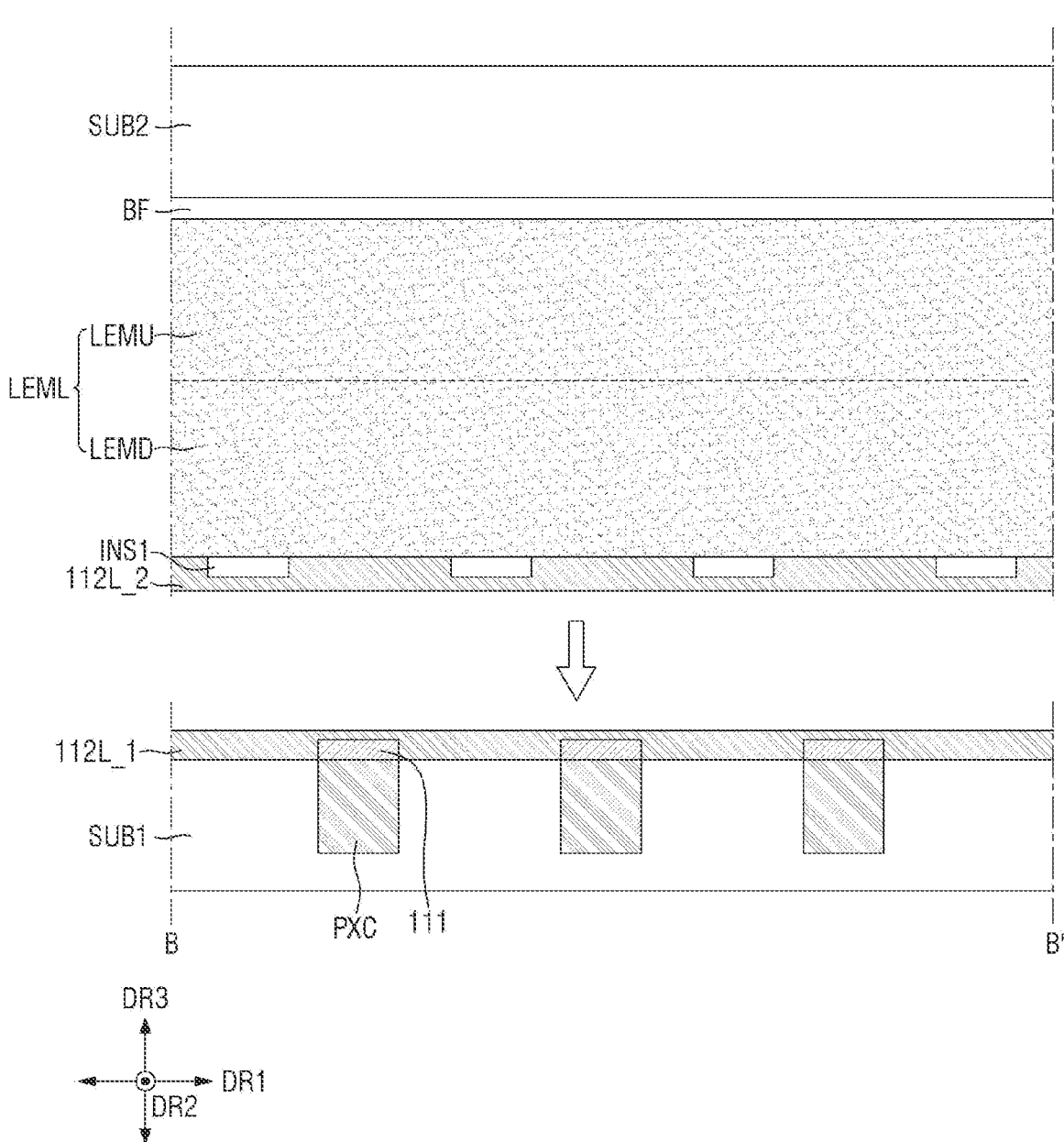
FIGS. 22 to 33 are cross-sectional views illustrating a method for fabricating a display device according to one or more embodiments of the present disclosure.

First, as shown in FIG. 22, a first connection electrode layer 112L_1 is formed on a first substrate SUB1, and a second connection electrode layer 112L_2 is formed on a light emitting material layer LEML of a second substrate SUB2 (S110 of FIG. 21).

The first connection electrode layer 112L_1 is deposited to cover the pixel electrodes 111 of the first substrate SUB1. The first connection electrode layer 112L_1 may include gold (Au), copper (Cu), aluminum (Al), or tin (Sn). One surface of the first connection electrode layer 112L_1 facing the second connection electrode layer 112L_2 may be planarized by a polishing process such as a chemical mechanical polishing (CMP) process.

As shown in FIG. 7, the first semiconductor material layer LEMD may include a first semiconductor layer SEM1, an electron blocking layer EBL, an active layer MQW, a superlattice layer SLT, and a second semiconductor layer SEM2. The second semiconductor material layer LEMU may be a semiconductor layer that is not doped with a dopant, that is, an undoped semiconductor layer. The second semiconductor material layer LEMU may correspond to the sixth sub-partition wall SPW6 of the first partition wall PW1 as shown in FIG. 9. For example, the second semiconductor material layer LEMU may be GaN that is not doped with a dopant. A thickness of the second semiconductor material layer LEMU may be thicker than that of the first semiconductor material layer LEMD.

The first insulating film INS1 may be patterned on the first semiconductor material layer LEMD. The first insulating film INS1 may not overlap the pixel electrode 111 in the third direction DR3 as shown in FIG. 22. The first insulating film INS1 may be formed of an inorganic film such as a silicon oxide film ($SiO_2$), an aluminum oxide film ($Al_2O_3$), or a hafnium oxide film ($HfO_X$).

The second connection electrode layer 112L_2 may be deposited on the first insulating film INS1 and the first semiconductor material layer LEMD. The second connection electrode layer 112L_2 may include gold (Au), copper (Cu), aluminum (Al) or tin (Sn). One surface of the first connection electrode layer 112L_1 facing the second connection electrode layer 112L_2 may be planarized by a polishing process such as a chemical mechanical polishing (CMP) process.

Figure 23:
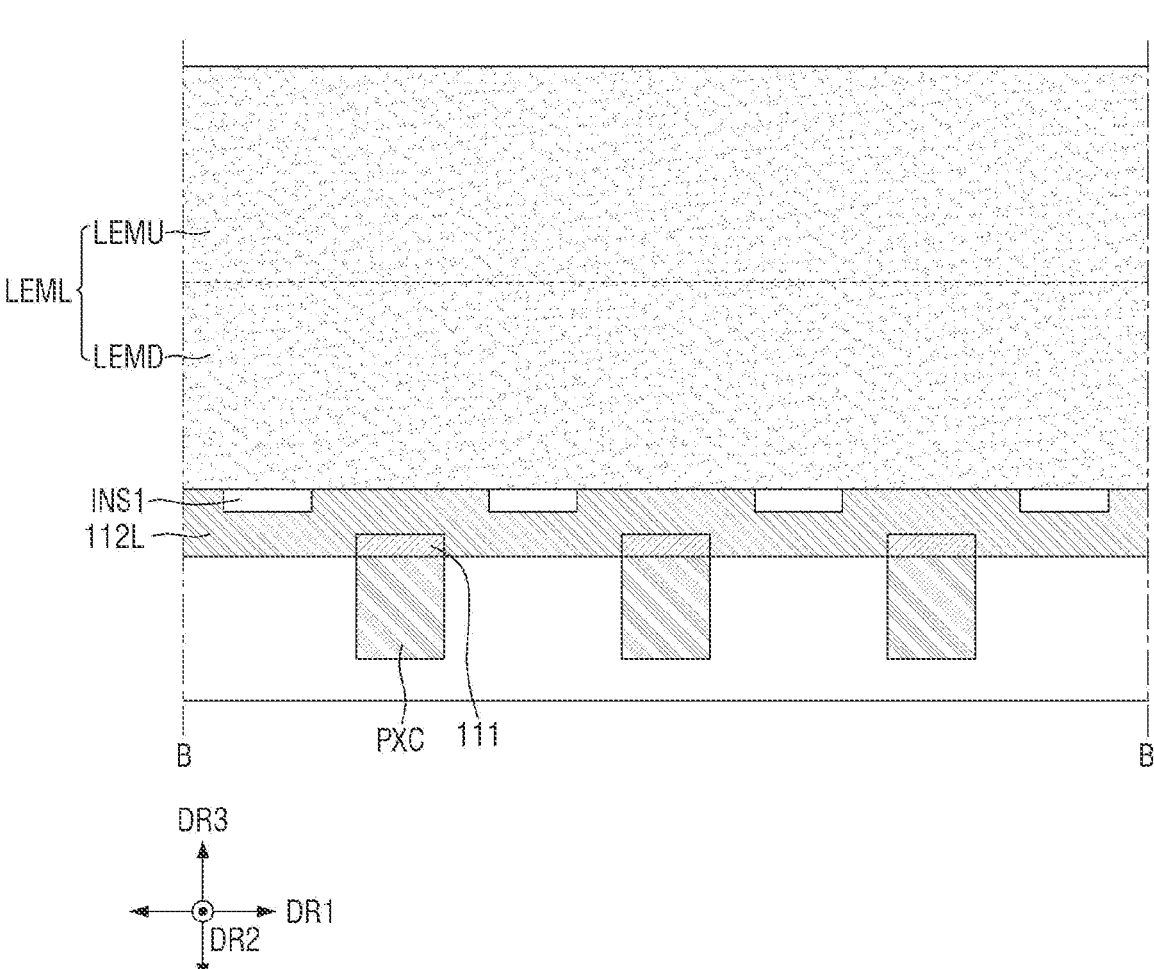

Second, as shown in FIG. 23, the first connection electrode layer 112L_1 and the second connection electrode layer 112L_2 are adhered to each other, and the second substrate SUB2 is removed (S210 of FIG. 11).

The first connection electrode layer 112L_1 of the first substrate SUB1 and the second connection electrode layer 112L_2 of the second substrate SUB2 are brought into contact with each other. Then, the first connection electrode layer 112L_1 and the second connection electrode layer 112L_2 are subjected to melt bonding at a suitable temperature (e.g., a predetermined temperature) to form one connection electrode layer 112L. That is, the connection electrode layer 112L is disposed between the pixel electrodes 111 of the first substrate SUB1 and the light emitting material layer LEML of the second substrate SUB2 and serves as a bonding metal layer for bonding the pixel electrodes 111 of the first substrate SUB1 to the light emitting material layer LEML of the second substrate SUB2.

Then, the second substrate SUB2 and the buffer film BF may be removed through a polishing process such as a chemical mechanical polishing (CMP) process, and/or an etching process. In addition, a portion of an upper portion of the second semiconductor material layer LEMU of the light emitting material layer LEML may be removed through the polishing process such as the CMP process.

Then, the second substrate SUB2 and the buffer film BF may be removed through a polishing process, such as a chemical mechanical polishing (CMP) process, and/or an etching process. In addition, the second semiconductor material layer LEMU of the light emitting material layer LEML may be partially removed through the polishing process such as the CMP process.

Figure 24:
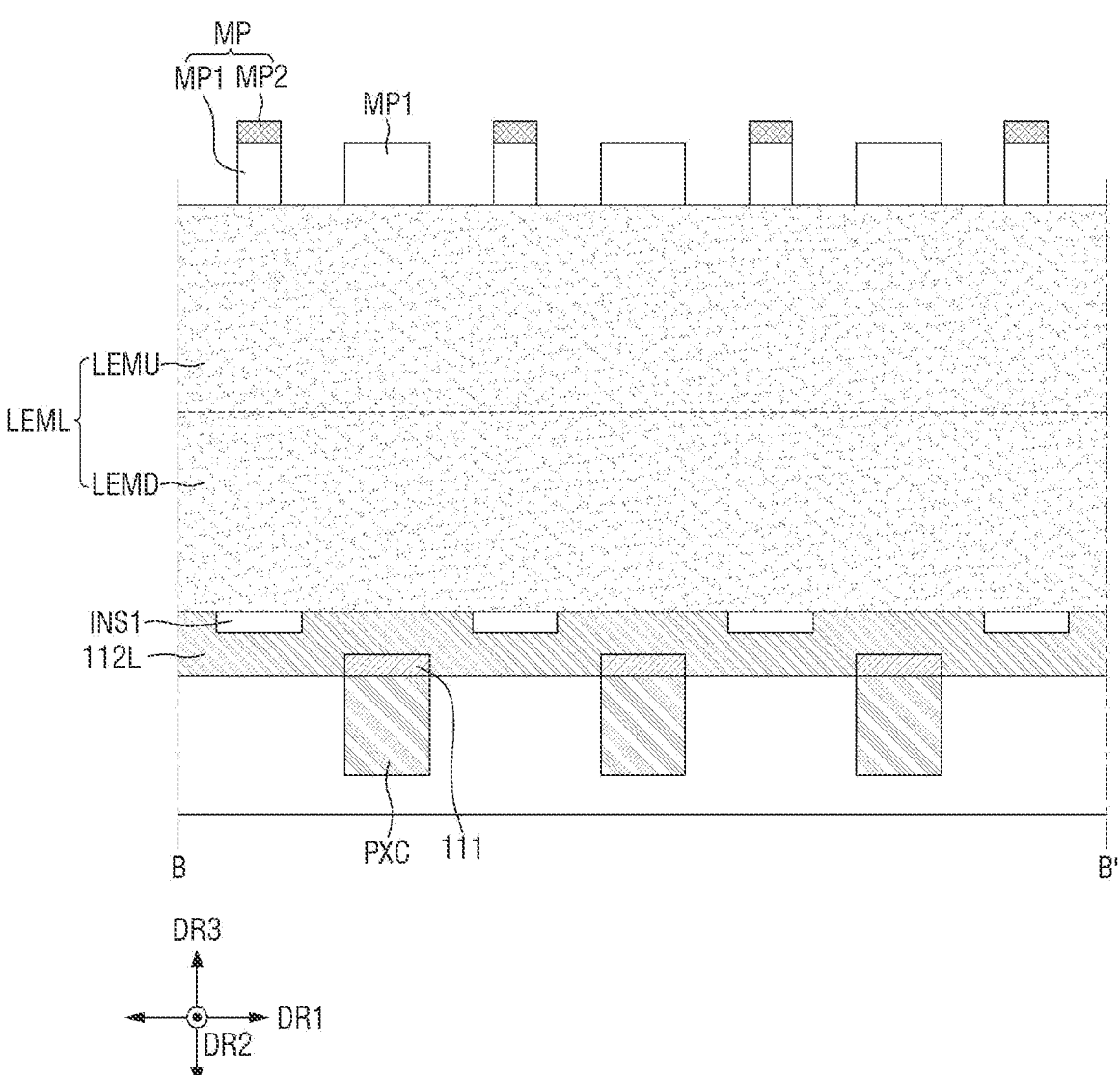

Third, as shown in FIG. 24, a mask pattern MP is formed on the light emitting material layer LEML (S310 of FIG. 21).

The mask pattern MP may include a first mask pattern MP1 and a second mask pattern MP2.

The first mask pattern MP1 is formed on the upper surface of the light emitting material layer LEML. The upper surface of the light emitting material layer LEML may be a surface upwardly exposed by removing the second substrate SUB2, the buffer film BF. In other embodiments, the second light emitting material layer LEMU may also be removed. The first mask pattern MP1 may be disposed in an area where the light emitting elements LE are to be formed. In one or more other embodiments, the first mask pattern MP1 may be disposed in an area where the first partition PW1 are to be formed. The first mask pattern MP1 may overlap the pixel electrode 111 in the third direction DR3. The first mask pattern MP1 may be formed of an inorganic film such as a silicon oxide film ($SiO_2$), an aluminum oxide film ($Al_2O_3$), or a hafnium oxide film ($HfO_X$). A thickness of the first mask pattern MP1 may be 1 μm to 2 μm, approximately.

The second mask pattern MP2 may be disposed on a partial pattern of the first mask pattern MP1. The second mask pattern MP2 may be disposed in an area where the first partition wall PW1 is to be formed. The second mask pattern MP2 may include a conductive material such as nickel (Ni). A thickness of the second mask pattern MP2 may be 0.01 μm to 1 μm, approximately.

Figure 25:
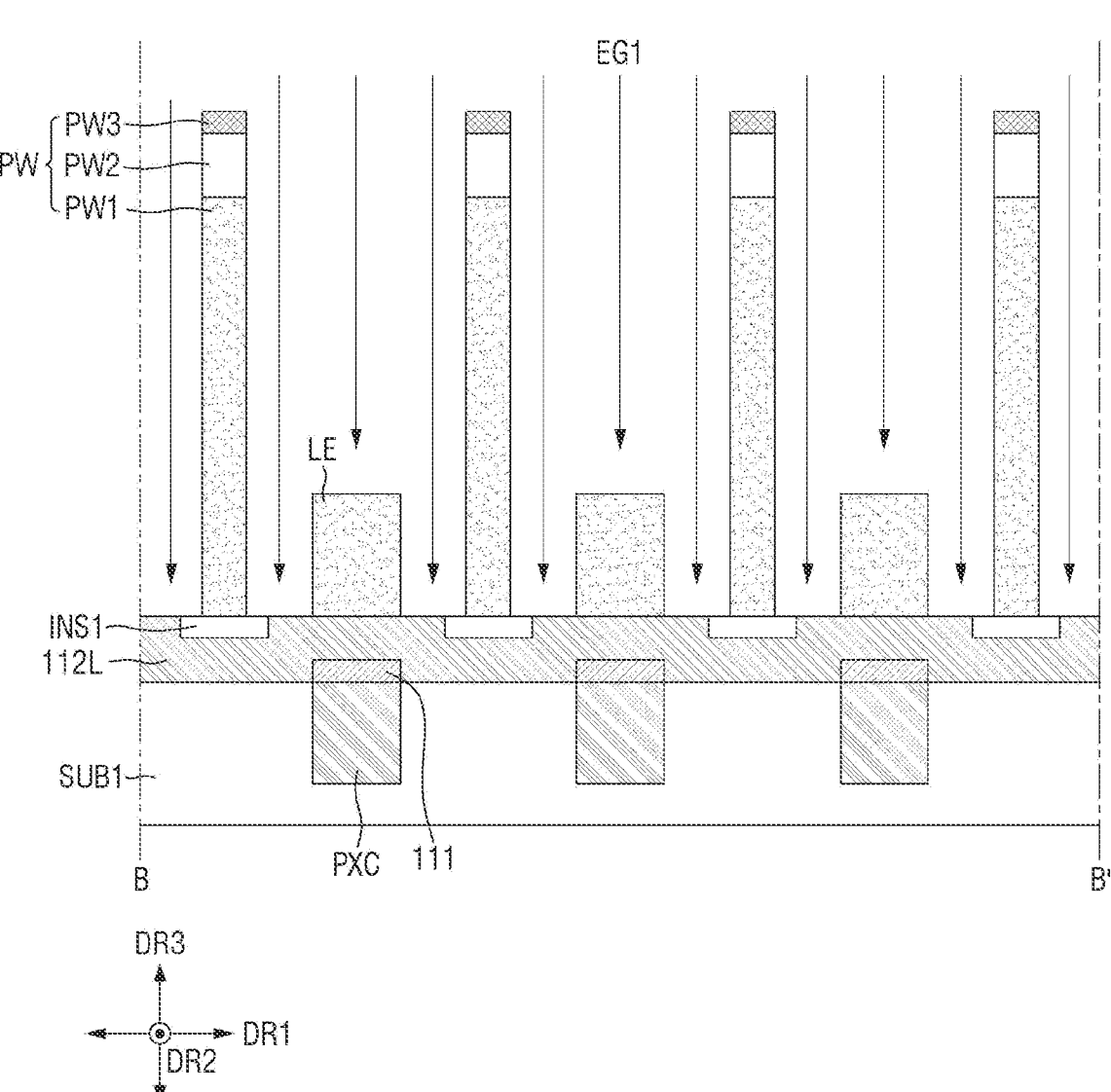
Figure 26:
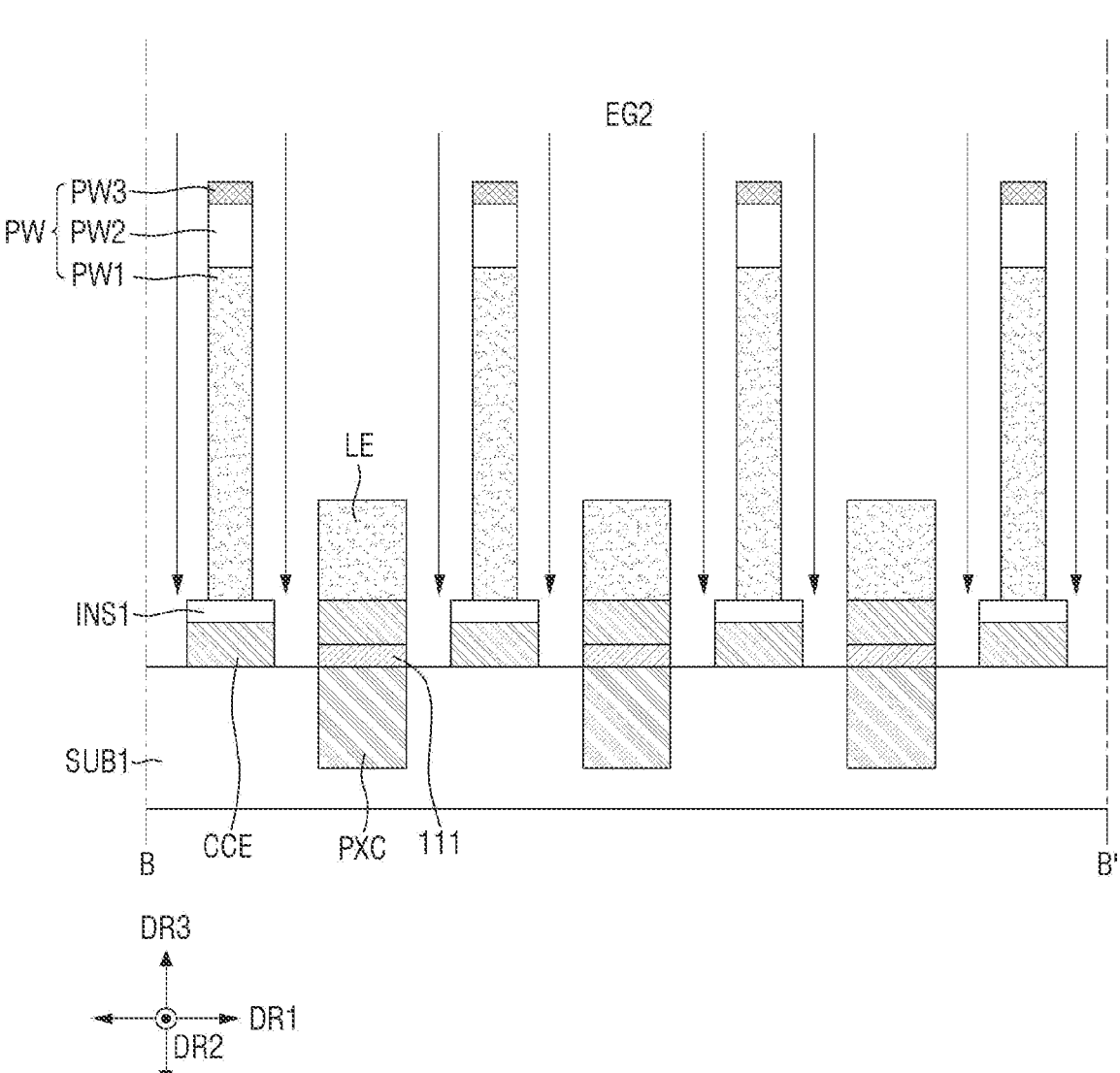
Figure 27:
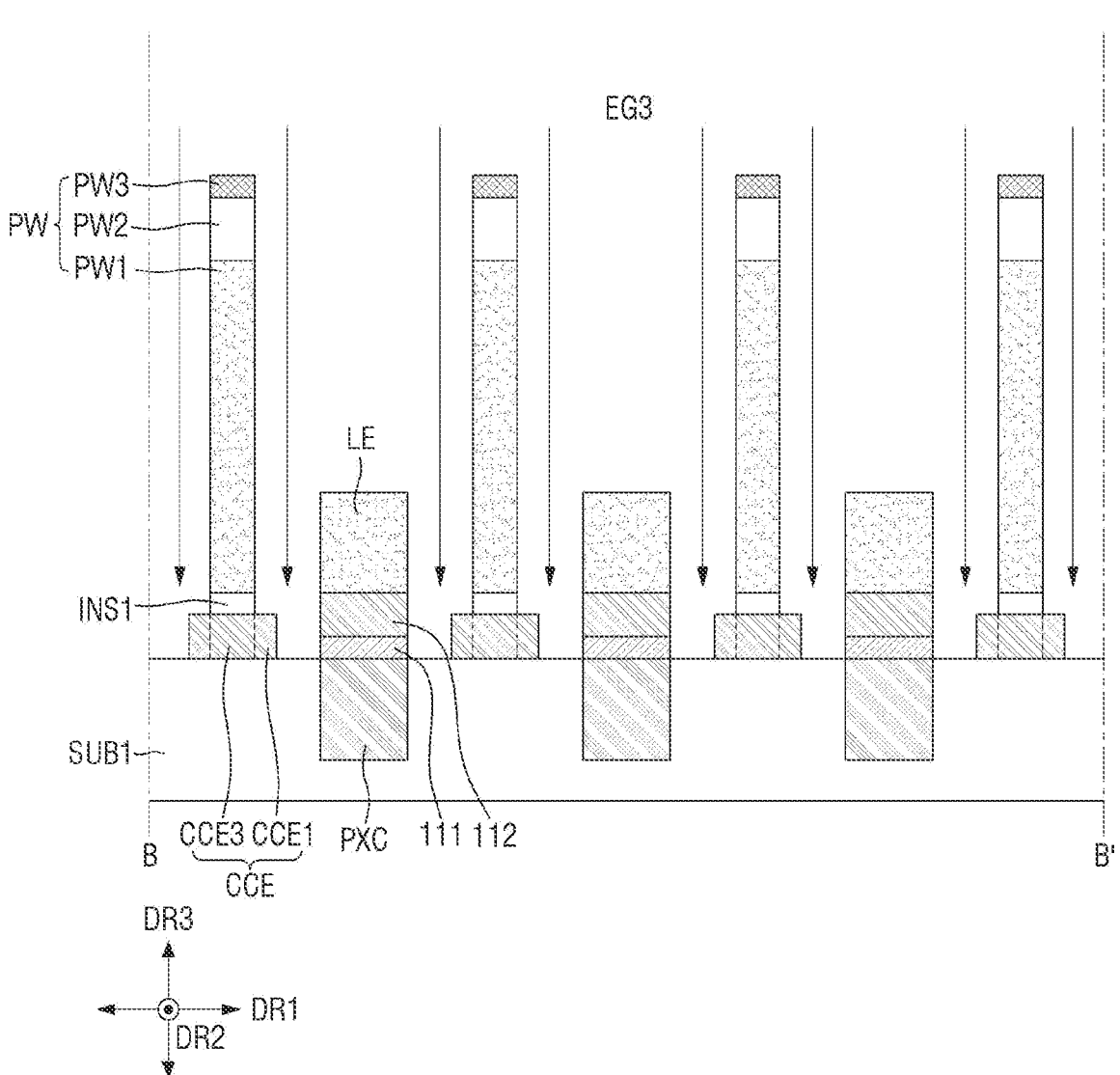

Fourth, as shown in FIGS. 25 to 27, the light emitting material layer LEML and the connection electrode layer 112L are etched in accordance with the mask pattern MP to form the light emitting elements LE, the common connection electrode CCE and the partition wall PW (S410 of FIG. 21).

As shown in FIG. 25, the second mask pattern MP2 may not be etched by a first etching material EG1 for etching the light emitting material layer LEML. For this reason, the light emitting material layer LEML of the area where the second mask pattern MP2 is disposed may not be etched by the first etching material EG1. Therefore, the first partition wall PW1 may be formed in the area where the second mask pattern MP2 is disposed.

An etching ratio of the light emitting material layer LEML by the first etching material EG1 may be higher than that of the first mask pattern MP1. Therefore, the light emitting elements LE having a thickness thinner than the first partition wall PW1 in the third direction DR3 may be formed in the area where the first mask pattern MP1 is only disposed.

Also, the light emitting material layer LEML may be completely removed from the area, in which the first mask pattern MP1 and the second mask pattern MP2 are not disposed, by the first etching material EG1.

Then, as shown in FIG. 26, the second mask pattern MP2, the light emitting elements LE, and the first insulating film INS1 may not be etched by a second etching material EG2 for etching the connection electrode layer 112L. For this reason, the second mask pattern MP2 and the connection electrode layer 112L disposed below the first insulating film INS1 may not be etched by the second etching material EG2. Therefore, the connection electrode 112 disposed below each of the light emitting elements LE and the common connection electrode CCE disposed below the first insulating film INS1 may be formed.

Then, as shown in FIG. 27, the second mask pattern MP2, the light emitting elements LE and the common connection electrode CCE may not be etched by a third etching material EG3 for etching the first insulating film INS1. Therefore, the first insulating film INS1 exposed without being covered by the partition wall PW may be etched by the third etching material EG3. As a result, a portion of the upper surface of the common connection electrode CCE may be exposed without being covered by the first insulating film INS1.

For example, as shown in FIG. 6, the upper surface of the first common connection electrode CCE1 disposed at the edges of each of the plurality of light emitting areas EA1, EA2, and EA3 may be exposed without being covered by the first insulating film INS1. Also, as shown in FIG. 7, the upper surface of the second common connection electrode CCE2 disposed in each of the plurality of common connection areas CCA1, CCA2, and CCA3 may be exposed without being covered by the first insulating film INS1.

Figure 28:
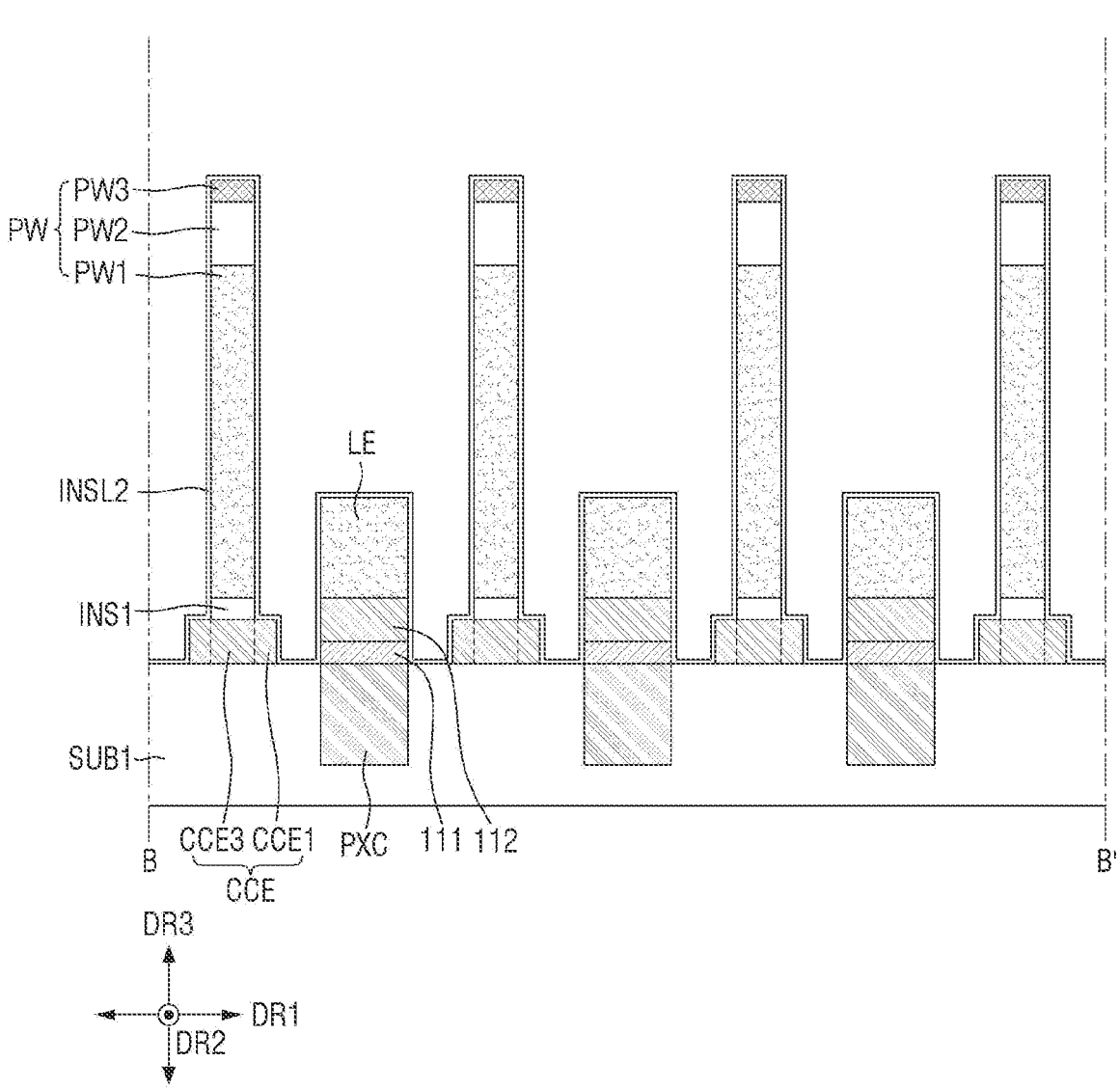
Figure 29:
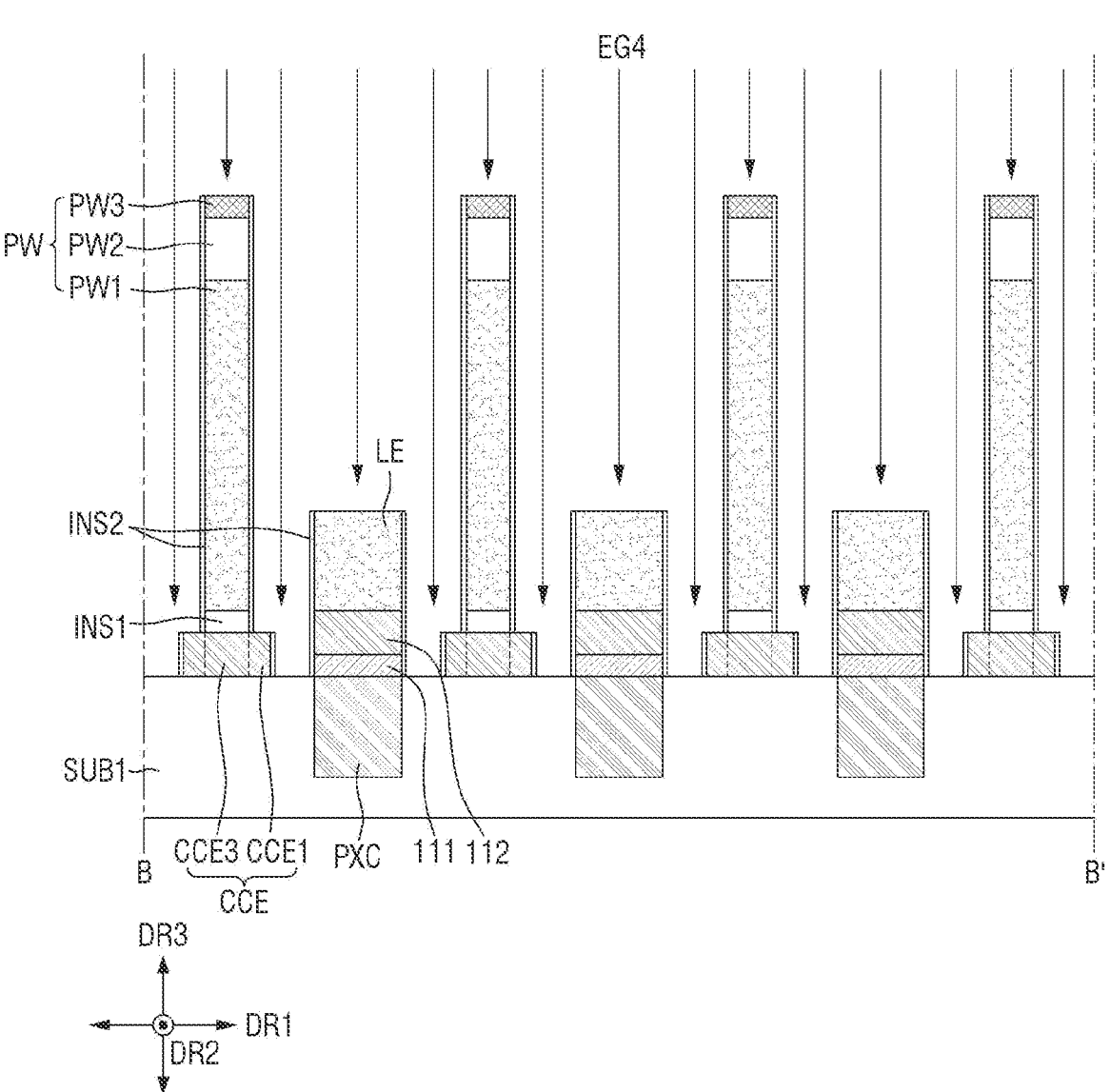

Fifth, as shown in FIG. 29, the second insulating film INS2 is formed on the side of each of the light emitting elements LE, the side of the first common connection electrodes CCE1, and the side of the partition wall PW (S510 of FIG. 21). The second insulating film INS2 may also be formed on the sides of each of the pixel electrodes 111 and the sides of each of the connection electrodes 112. As some of the drawings illustrate cross-sectional diagrams, some of the elements appear to have opposing sides. However, in the actual embodiment, the opposing sides may actually be part of one continuous side (e.g., a peripheral or circumferential side). As shown in FIG. 28, a second insulating film layer INSL2 is deposited to cover the light emitting elements LE and the partition wall PW. The second insulating film layer INSL2 may be disposed on the upper surface and side of the common connection electrode CCE, the upper surface and side of the partition wall PW, the side of each of the pixel electrodes 111, the side of each of the connection electrodes 112, the upper surface and side of each of the light emitting elements LE, and the upper surface of the first substrate SUB1 between the pixel electrode 111 and the common connection electrode CCE.

Then, as shown in FIG. 29, a big voltage difference is formed in the third direction DR3 without a separate mask, and when the second insulating film layer INSL2 is etched by a fourth etching material EG4, the fourth etching material EG4 etches the second insulating film layer INSL2 while moving in the third direction DR3. For this reason, the second insulating film layer INSL2 disposed on a horizontal plane defined by the first direction DR1 and the second direction DR2 is removed, whereas the second insulating film layer INSL2 disposed on a vertical plane defined by the third direction DR3 may not be removed. Therefore, the second insulating film layer INSL2 disposed on the upper surface of the common connection electrode CCE, the upper surface of the partition wall PW, the upper surface of each of the light emitting elements LE, and the upper surface of the first substrate SUB1 between the pixel electrode 111 and the common connection electrode CCE may be removed. In contrast, the second insulating film layer INSL2 disposed on the side of the common connection electrode CCE, the side of the partition wall PW, the side of each of the pixel electrodes 111, the side of each of the connection electrodes 112, and the side of each of the light emitting elements LE may not be removed. Therefore, the second insulating film INS2 may be formed on the side of the common connection electrode CCE, the side of the partition wall PW, the side of each of the pixel electrodes 111, the side of each of the connection electrodes 112, and the side of each of the light emitting elements LE.

The second insulating film INS2 may be formed of an inorganic film such as a silicon oxide film ($SiO_2$), an aluminum oxide film ($Al_2O_3$), or a hafnium oxide film ($HfO_x$). A thickness of the second insulating film INS2 may be 0.1 μm, approximately.

Because a portion of an upper portion of the second insulating film layer INSL2 disposed on the side of the partition wall PW may be removed by the fourth etching material EG4, a height of the second insulating film INS2 disposed on the side of the partition wall PW may be lower than that of the upper surface of the partition wall PW in the third direction DR3. Similarly, because a portion of an upper portion of the second insulating film layer INSL2 disposed on the side of each of the light emitting elements LE may be removed by the fourth etching material EG4, a height of the second insulating film INS2 disposed on the side of each of the light emitting elements LE may be lower than that of the upper surface of the light emitting element LE in the third direction DR3.

Figure 30:
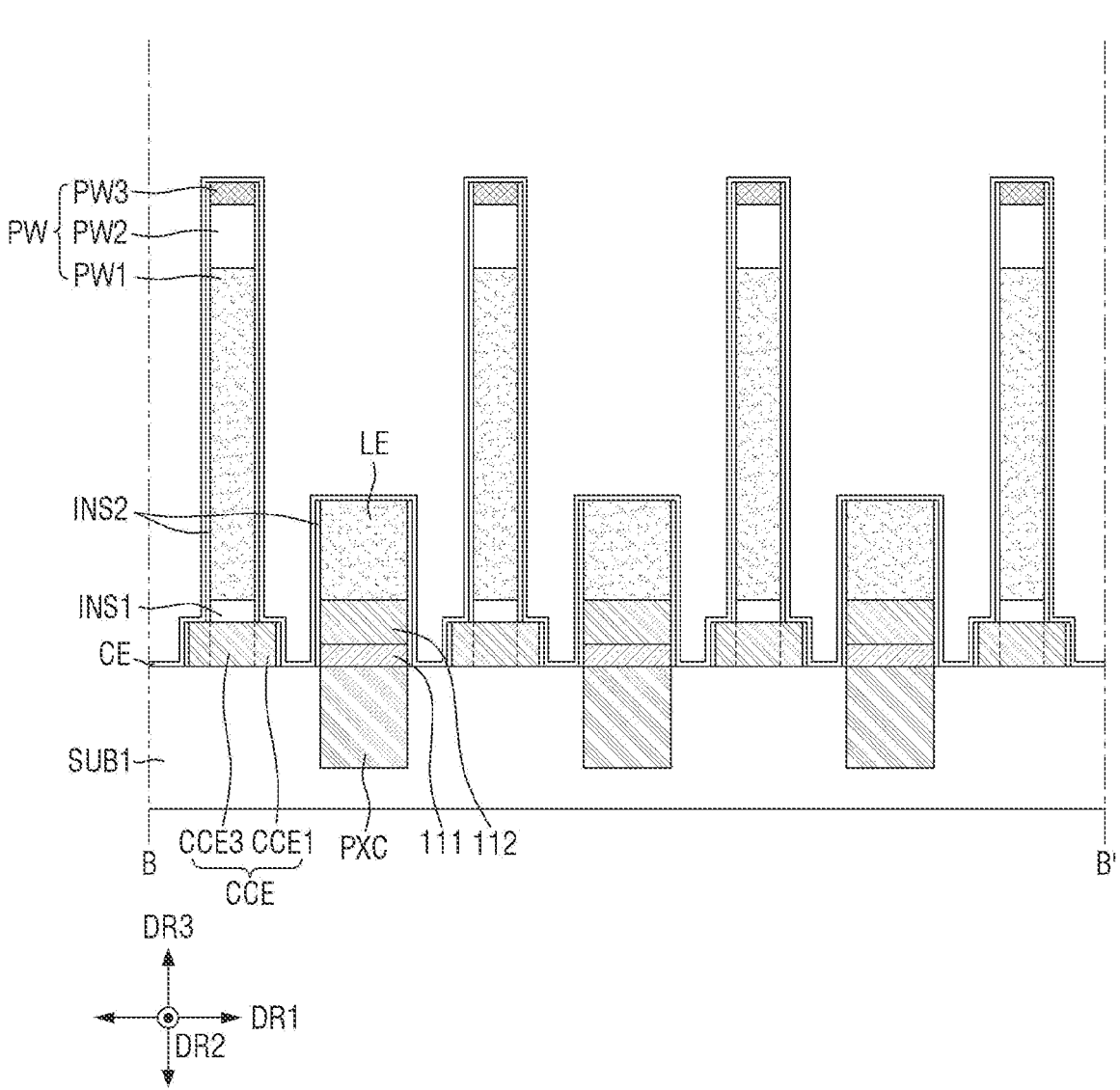

Sixth, as shown in FIG. 30, the common electrode CE covering the light emitting elements LE and the partition wall PW is formed (S610 of FIG. 21).

The common electrode CE is deposited on the light emitting elements LE and the partition wall PW. In this case, the common electrode CE may be disposed on the upper surface of the common connection electrode CCE, the upper surface of the partition wall PW, and the upper surface of the first substrate SUB1 disposed between the pixel electrode 111 and the common connection electrode CCE. The common electrode CE may also be disposed on the second insulating film INS2 disposed on the side of the common connection electrode CCE, the side of the partition wall PW, the side of each of the pixel electrodes 111, the side of each of the connection electrodes 112, and the side of each of the light emitting elements LE.

The upper surface of the common connection electrode CCE, which is exposed without being covered by the first insulating film INS1, may be in contact with the common electrode CE. For example, as shown in FIG. 6, the upper surface of the first common connection electrode CCE1 disposed at the edges of each of the plurality of light emitting areas EA1, EA2, and EA3 may be in contact with the common electrode CE. Also, as shown in FIG. 7, the upper surface of the second common connection electrode CCE2 disposed in each of the plurality of common connection areas CCA1, CCA2, and CCA3 may be in contact with the common electrode CE.

The common electrode CE may include a transparent conductive oxide (TCO) such as indium tin oxide (ITO) or indium zinc oxide (IZO). A thickness of the common electrode CE may be 0.1 μm, approximately.

Figure 31:
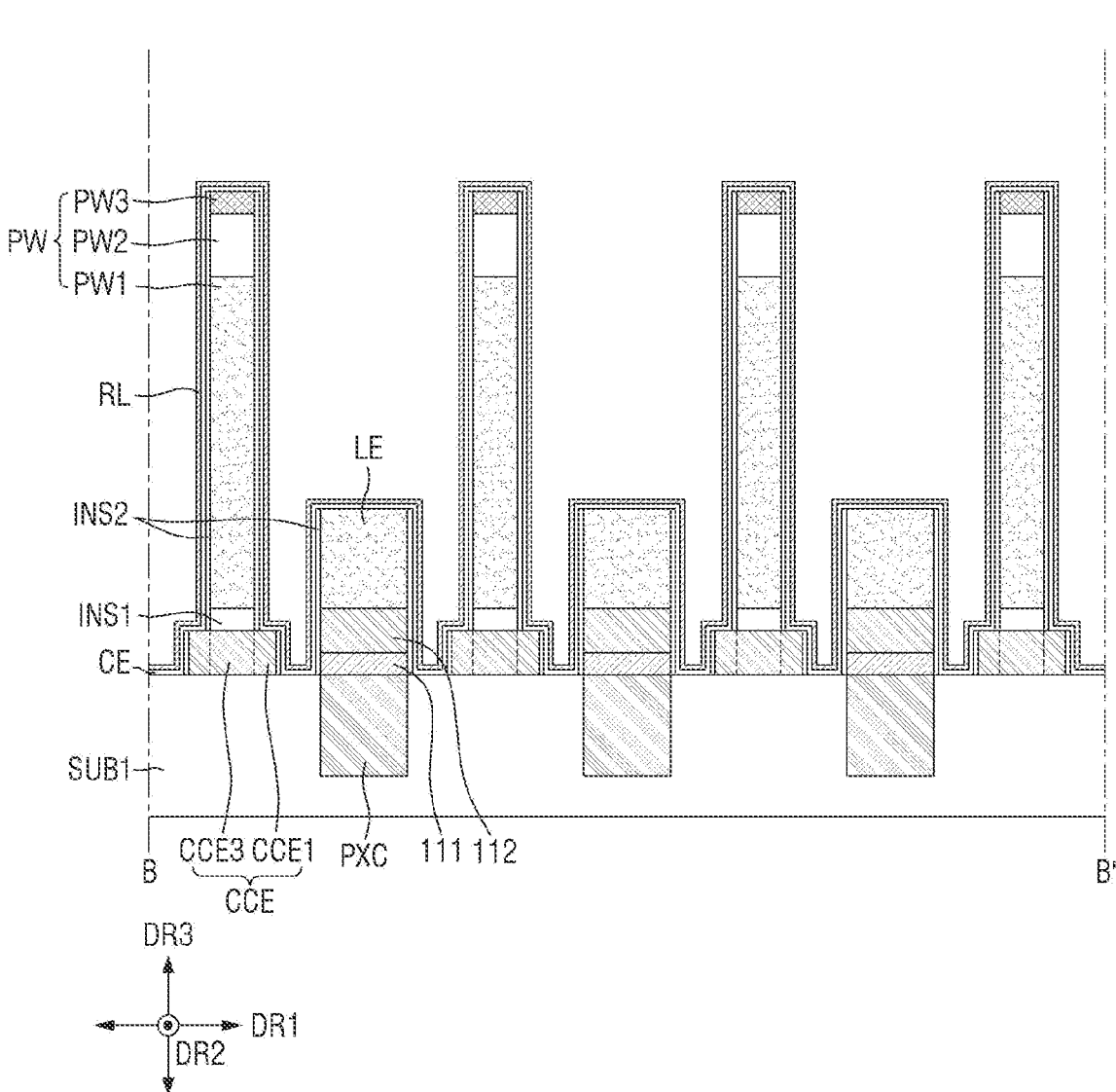

Seventh, as shown in FIGS. 30 and 31, the reflection film RF is formed on the side of each of the light emitting elements LE, the side of the common connection electrode CCE and the side of the partition wall PW (S710 of FIG. 21).

As shown in FIG. 30, a reflection layer RL is entirely deposited to cover the light emitting elements LE and the partition wall PW. In this case, the reflection layer RL may be disposed on the common electrode CE disposed on the upper surface and side of the common connection electrode CCE, the upper surface and side of the partition wall PW, the side of each of the pixel electrodes 111, the side of each of the connection electrodes 112, the upper surface and side of each of the light emitting elements LE, and the upper surface of the first substrate SUB1 disposed between the pixel electrode 111 and the common connection electrode CCE.

Figure 32:
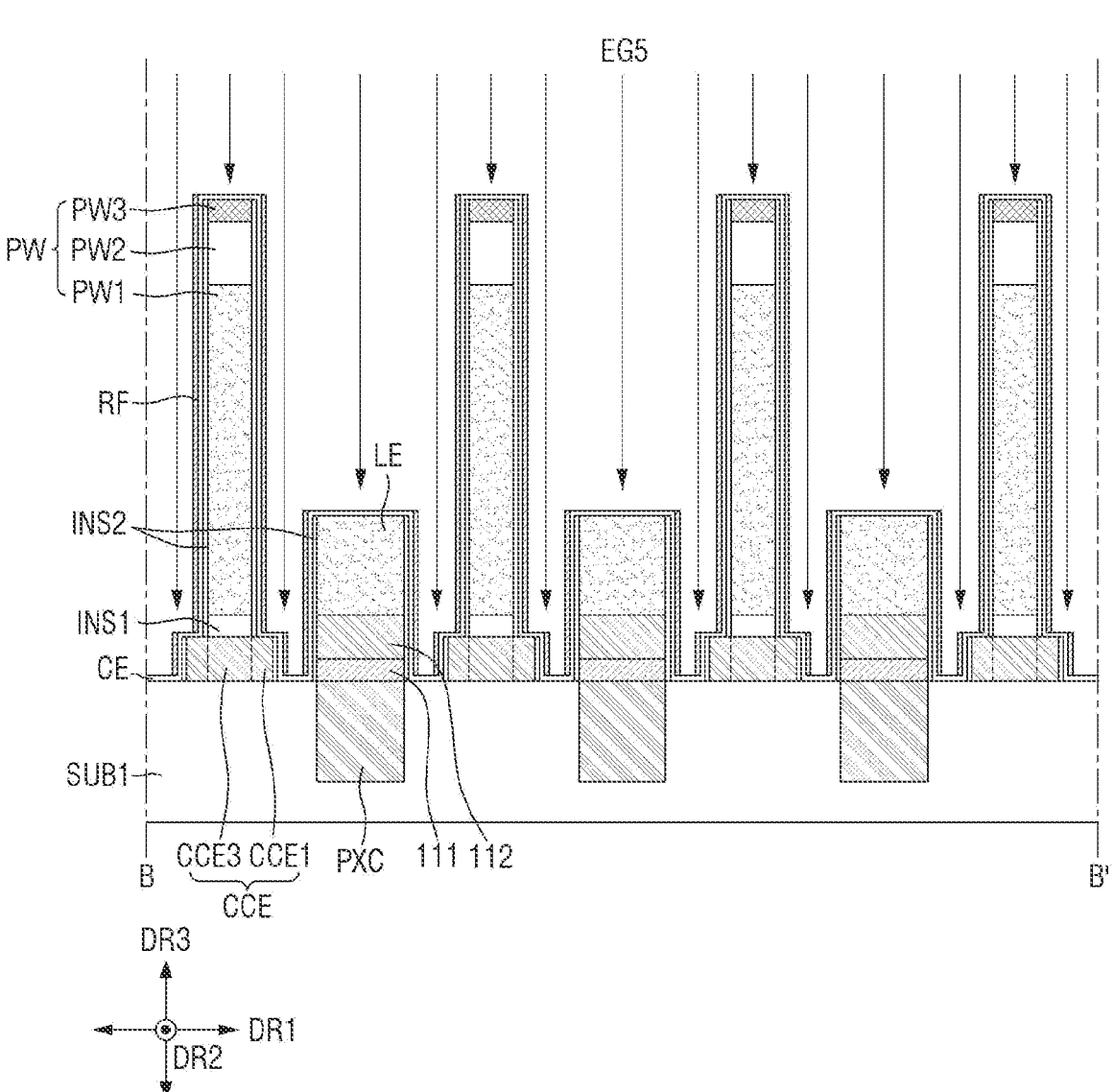

Then, as shown in FIG. 32, a big voltage difference is formed in the third direction DR3 without a separate mask, and when the reflection layer RL is etched using a fifth etching material EG5, the fifth etching material EG5 etches the reflection layer RL while moving in the third direction DR3. Therefore, the reflection layer RL disposed on a horizontal plane defined by the first direction DR1 and the second direction DR2 is removed, whereas the reflection layer RL disposed on a vertical plane defined by the third direction DR3 may not be removed. For this reason, the reflection layer RL disposed on the upper surface of the first common connection electrode CCE1, the upper surface of the second common connection electrode CCE2, the upper surface of the partition wall PW, the upper surface of each of the light emitting elements LE, and the upper surface of the first substrate SUB1 disposed between the pixel electrode 111 and the common connection electrode CCE may be removed. In contrast, the reflection layer RL disposed on the side of the first common connection electrode CCE1, the side of the partition wall PW, the side of each of the pixel electrodes 111, the side of each of the connection electrodes 112, and the side of each of the light emitting elements LE may not be removed. Therefore, the reflection film RF may be disposed on the common electrode CE disposed on the side of the first common connection electrode CCE1, the side of the partition wall PW, the side of each of the pixel electrodes 111, the side of each of the connection electrodes 112, and the side of each of the light emitting elements LE.

The reflection film RF may include a metal material having high reflectance, such as aluminum (Al). A thickness of the reflection film RF may be 0.1 μm, approximately.

Because a portion of an upper portion of the reflection layer RL disposed on the side of the partition wall PW may be removed, a height of the reflection film RF disposed on the side of the partition wall PW may be lower than that of the upper surface of the partition wall PW in the third direction DR3. Similarly, because a portion of an upper portion of the reflection layer RL disposed on the side of each of the light emitting elements LE may be removed, a height of the reflection film RF disposed on the side of each of the light emitting elements LE may be lower than that of the upper surface of the light emitting element LE in the third direction DR3.

Figure 33:
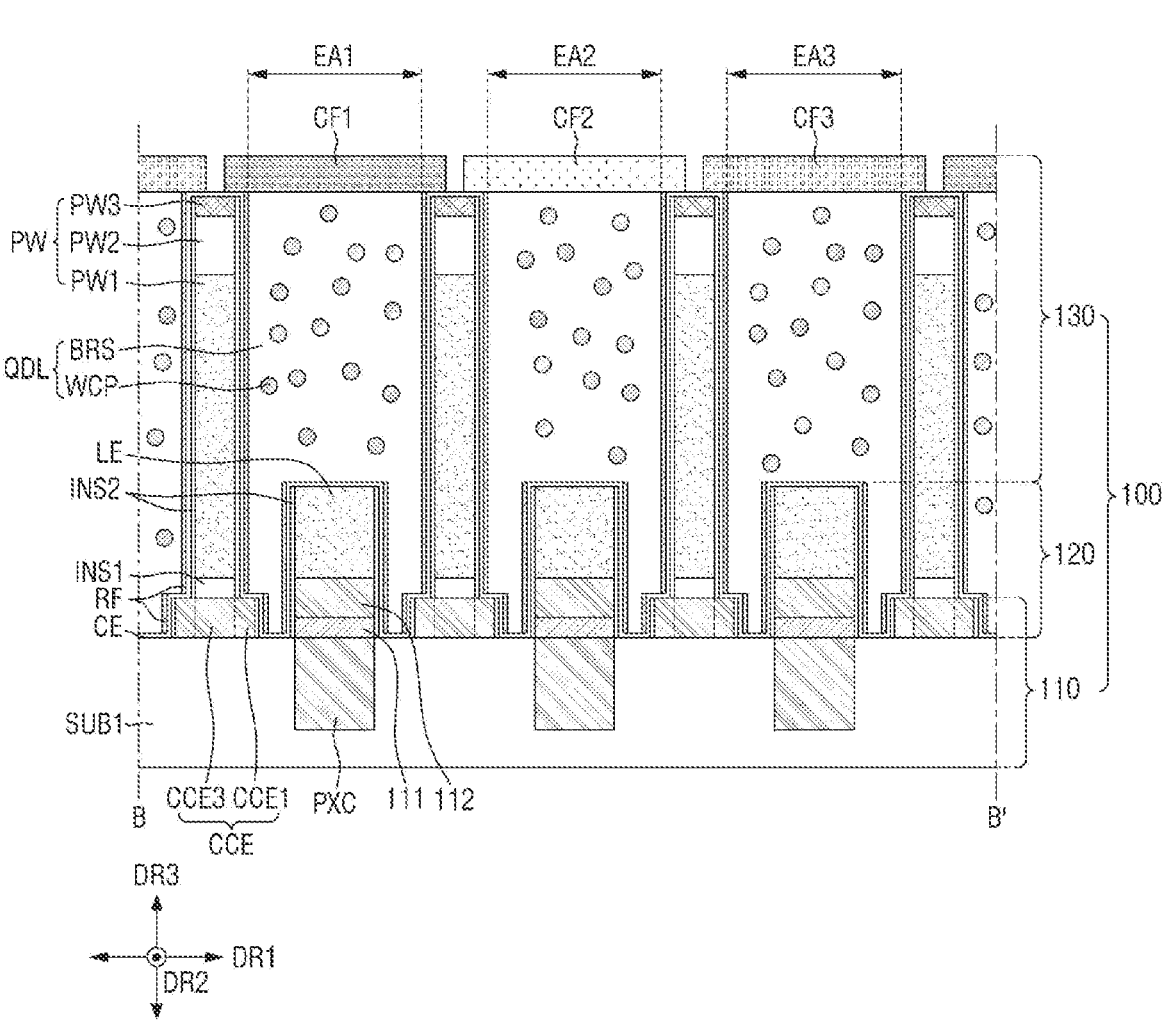

Eighth, as shown in FIG. 33, the wavelength conversion layer QDL is formed in each of the plurality of light emitting areas EA1, EA2, and EA3 partitioned by the partition wall PW, and the color filters CF1, CF2, and CF3 are formed on the wavelength conversion layer QDL (S810 of FIG. 21).

The wavelength conversion layer QDL is formed in each of the first light emitting areas EA1, the second light emitting areas EA2 and the third light emitting areas EA3, which are partitioned by the partition wall PW. In this case, because the same wavelength conversion layer QDL is formed in each of the first light emitting areas EA1, the second light emitting areas EA2, and the third light emitting areas EA3, the wavelength conversion layer QDL may be formed in each of the first light emitting areas EA1, the second light emitting areas EA2, and the third light emitting areas EA3 by one time process.

When the upper surface of the partition wall PW is covered by the wavelength conversion layer QDL, the wavelength conversion layer QDL disposed on the upper surface of the partition wall PW may be removed by the polishing process such as the CMP process. For this reason, the upper surface of the partition wall PW may be exposed without being covered by the wavelength conversion layer QDL. The upper surface of each of the wavelength conversion layers QDL and the upper surface of the partition wall PW may be connected to each other to be flat.

Then, the first color filter CF1 may be formed on the wavelength conversion layer QDL disposed in each of the first light emitting areas EA1, the second color filter CF2 may be formed on the wavelength conversion layer QDL disposed in each of the second light emitting areas EA2, and the third color filter CF3 may be formed on the wavelength conversion layer QDL disposed in each of the third light emitting areas EA3.

Figure 34:
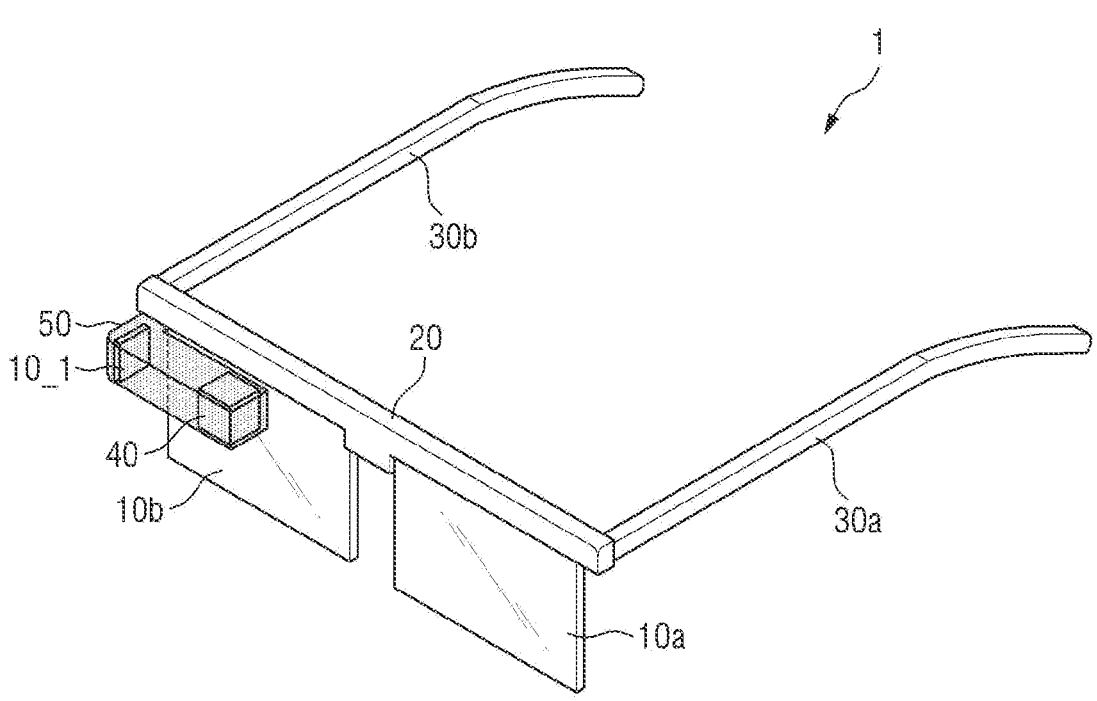
FIG. 34 is a view illustrating a virtual reality device including a display device according to one or more embodiments.

FIG. 34 is a view illustrating a virtual reality device including a display device according to one or more embodiments. In FIG. 34, a virtual reality device 1 to which a display device 10_1 according to one or more embodiments is applied is shown.

Referring to FIG. 34, the virtual reality device 1 according to one or more embodiments may be a glasses-type device. The virtual reality device 1 according to one or more embodiments may include a display device 10_1, a left-eye lens 10a, a right-eye lens 10b, a support frame 20, glasses frame legs 30a and 30b, a reflection member 40, and a display device accommodating portion 50.

Although FIG. 34 illustrates the virtual reality device 1 that includes glasses frame legs 30a and 30b, the virtual reality device 1 according to one or more embodiments may be applied to a head mounted display including a head mounting band, which may be mounted on a head, instead of the glasses frame legs 30a and 30b. That is, the virtual reality device 1 according to one or more embodiments is not limited to that shown in FIG. 34, and is applicable to various electronic devices in various forms.

The display device accommodating portion 50 may include a display device 10_1 and a reflection member 40. An image displayed on the display device 10_1 may be reflected by the reflection member 40 and provided to a user's right eye through the right-eye lens 10b. For this reason, the user may view a virtual reality image displayed on the display device 10_1 through the right eye.

Although FIG. 34 illustrates that the display device accommodating portion 50 is disposed at a right end of the support frame 20, the present disclosure is not limited thereto. For example, the display device accommodating portion 50 may be disposed at a left end of the support frame 20, and in this case, the image displayed on the display device 10_1 may be reflected by the reflection member 40 and provided to the user's left eye through the left-eye lens 10a. For this reason, the user may view the virtual reality image displayed on the display device 10_1 through the left eye. Alternatively, the display device accommodating portion 50 may be disposed at both the left end and the right end of the support frame 20, and in this case, the user may view the virtual reality image displayed on the display device 10_1 through both the left eye and the right eye.

Figure 35:
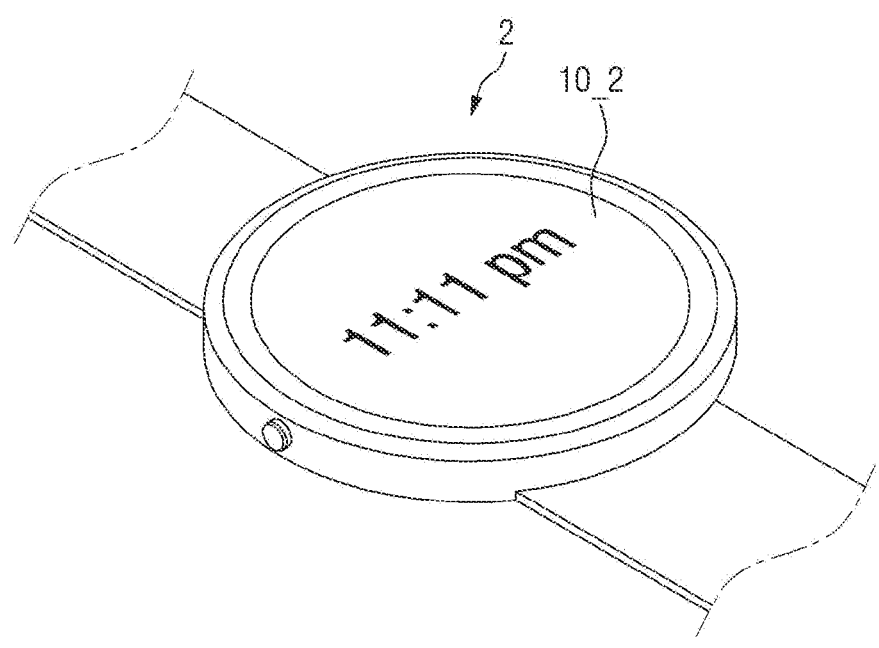
FIG. 35 is a view illustrating a smart device including a display device according to one or more embodiments.

FIG. 35 is a view illustrating a smart device including a display device according to one or more embodiments.

Referring to FIG. 35, a display device 10_2 according to one or more embodiments may be applied to a smart watch 2, which is one of the smart device.

Figure 36:
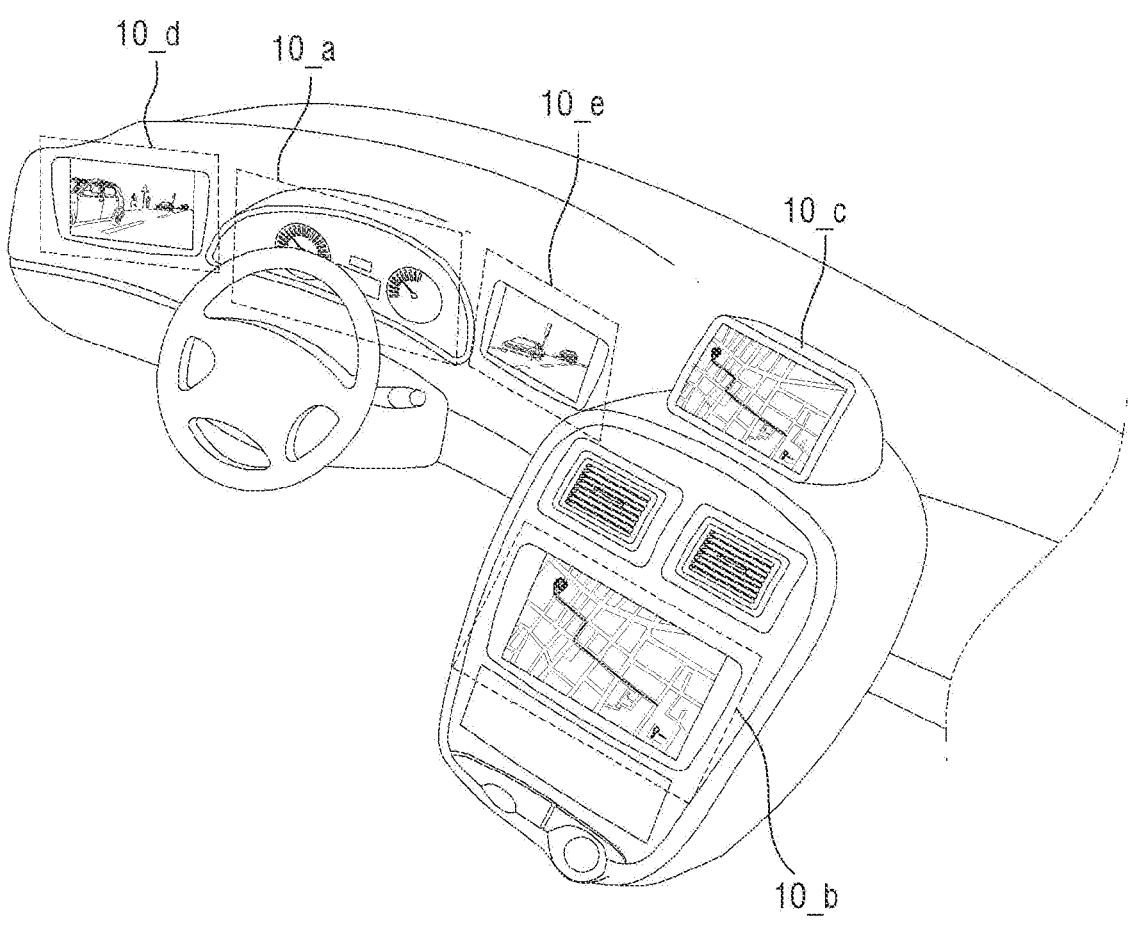
FIG. 36 is a view illustrating a vehicle dashboard and a center fascia including a display device according to one or more embodiments.

FIG. 36 is a view illustrating a vehicle dashboard and a center fascia including a display device according to one or more embodiments. A vehicle to which display devices 10_a, 10_b, 10_c, 10_d and 10_e according to one or more embodiments are applied is shown in FIG. 36.

Referring to FIG. 36, the display devices 10_a, 10_b and 10_c according to one or more embodiments may be applied to a dashboard of the vehicle, applied to a center fascia of the vehicle, or applied to a center information display (CID) disposed on the dashboard of the vehicle. In addition, the display devices 10_d and 10_e according to one or more embodiments may be applied to a room mirror display that replaces a side mirror of the vehicle.

Figure 37:
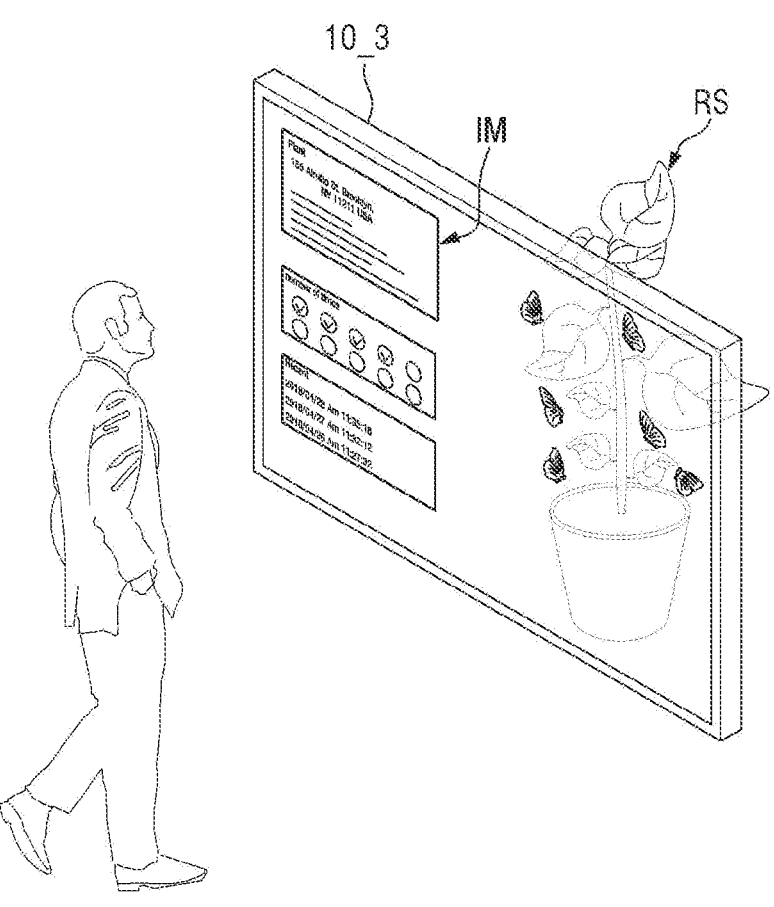
FIG. 37 is a view illustrating a transparent display device including a display device according to one or more embodiments.

FIG. 37 is a view illustrating a transparent display device including a display device according to one or more embodiments.

Referring to FIG. 37, a display device 10_3 according to one or more embodiments may be applied to the transparent display device. The transparent display device may display an image IM and at the same time transmit light. Therefore, a user located at a front surface of the transparent display device may not only view the image IM displayed on the display device 10_3 but also view an object RS or background located on a rear surface of the transparent display device. When the display device 10_3 is applied to the transparent display device, the base substrate BSUB of the display device 10_3 shown in FIG. 5 and the first substrate SUB1 of the display device 10_3 shown in FIGS. 5 and 6 may include a light transmitting portion capable of transmitting light or may be formed of a material capable of transmitting light.

Figure 38:
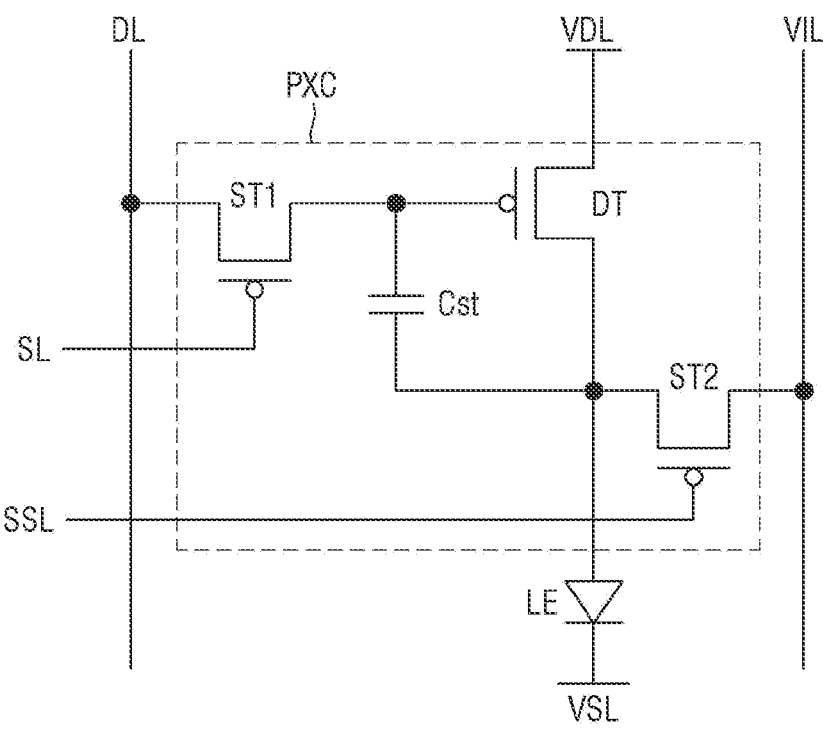
FIG. 38 is a circuit view of a pixel circuit area and a light emitting element according to one embodiment.

FIG. 38 is a circuit view of a pixel circuit area and a light emitting element according to one or more embodiments.

An example of the pixel circuit area PXC and the light emitting element LE of FIG. 6 is shown in FIG. 38.

Referring to FIG. 38, the light emitting element LE emits light in accordance with a driving current. The emission amount of the light emitting element LE may be proportional to the driving current. The light emitting element LE may be an inorganic light emitting element that includes an anode electrode, a cathode electrode, and an inorganic semiconductor disposed between the anode electrode and the cathode electrode. For example, the light emitting element LE may be a micro light emitting diode.

The anode electrode of the light emitting element LE may be connected to a source electrode of a driving transistor DT, and the cathode electrode thereof may be connected to a second power line VSL to which a low potential voltage lower than a high potential voltage is supplied.

The driving transistor DT adjusts a current flowing from a first power line VDL, to which a first power voltage is supplied, to the light emitting element LE in accordance with a voltage difference between a gate electrode and the source electrode. The gate electrode of the driving transistor DT may be connected to a first electrode of a first transistor ST1, its source electrode may be connected to the anode electrode of the light emitting element LE, and its drain electrode may be connected to the first power line VDL to which a high potential voltage is applied.

The first transistor ST1 is turned on by a scan signal of a scan line SL to connect a data line DL to the gate electrode of the driving transistor DT. A gate electrode of the first transistor ST1 may be connected to the scan line SL, its first electrode may be connected to the gate electrode of the driving transistor DT, and its second electrode may be connected to the data line DL.

A second transistor ST2 is turned on by a sensing signal of a sensing signal line SSL to connect an initialization voltage line VIL to the source electrode of the driving transistor DT. A gate electrode of the second transistor ST2 may be connected to the sensing signal line SSL, its first electrode may be connected to the initialization voltage line VIL, and its second electrode may be connected to the source electrode of the driving transistor DT.

Although first electrode of each of the first and second transistors ST1 and ST2 may be a source electrode and the second electrode thereof may be a drain electrode, but it should be noted that they are not limited thereto. That is, the first electrode of each of the first and second transistors ST1 and ST2 may be a drain electrode, and the second electrode thereof may be a source electrode.

A capacitor Cst is formed between the gate electrode and the source electrode of the driving transistor DT. The capacitor Cst stores a differential voltage between a gate voltage and a source voltage of the driving transistor DT.

Although the driving transistor DT and the first and second transistors ST1 and ST2 are formed of N-type metal oxide semiconductor field effect transistors (MOSFETs) in FIG. 38, it should be noted that the transistors are not limited thereto. The driving transistor DT and the first and second transistors ST1 and ST2 may be formed of P-type MOSFETs.

Figure 39:
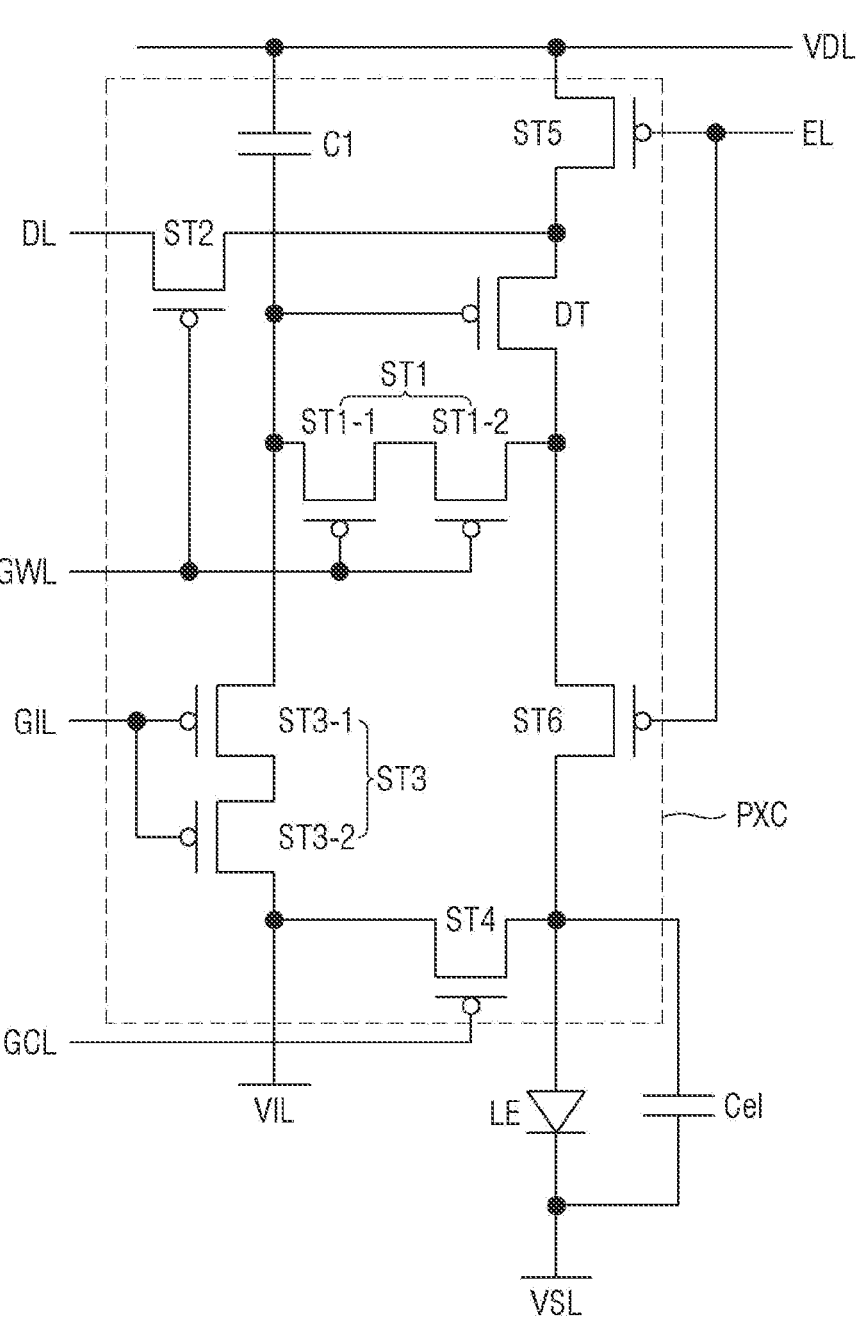
FIG. 39 is a circuit view of a pixel circuit area and a light emitting element according to one or more embodiments.

FIG. 39 is a circuit view of a pixel circuit area and a light emitting element according to one or more embodiments.

Another example of the pixel circuit area PXC and the light emitting element LE of FIG. 6 is shown in FIG. 39.

Referring to FIG. 39, the light emitting element LE emits light in accordance with the driving current. The emission amount of the light emitting element LE may be proportional to the driving current. The light emitting element LE may be an inorganic light emitting element that includes an anode electrode, a cathode electrode, and an inorganic semiconductor disposed between the anode electrode and the cathode electrode. For example, the light emitting element LE may be a micro light emitting diode.

The anode electrode of the light emitting element LE may be connected to a first electrode of a fourth transistor ST4 and a second electrode of a sixth transistor ST6, and the cathode electrode thereof may be connected to the second power line VSL. A parasitic capacitance Cel may be formed between the anode electrode and the cathode electrode of the light emitting element LE.

The pixel circuit area PXC includes a driving transistor DT, switch elements, and a capacitor C1. The switch elements include first to sixth transistors ST1, ST2, ST3, ST4, ST5, and ST6.

The driving transistor DT includes a gate electrode, a first electrode, and a second electrode. The driving transistor DT controls a drain-source current (hereinafter, referred to as "driving current") flowing between the first electrode and the second electrode in accordance with a data voltage applied to the gate electrode.

The capacitor C1 is formed between the gate electrode of the driving transistor DT and the first power line VDL. One electrode of the capacitor C1 may be connected to the gate electrode of the driving transistor DT, and the other electrode thereof may be connected to the first power line VDL.

When a first electrode of each of the first to sixth transistors ST1, ST2, ST3, ST4, ST5, and ST6 and the driving transistor DT is a source electrode, a second electrode thereof may be a drain electrode. Alternatively, when the first electrode of each of the first to sixth transistors ST1, ST2, ST3, ST4, ST5, and ST6 and the driving transistor DT is a drain electrode, the second electrode thereof may be a source electrode.

An active layer of each of the first to sixth transistors ST1, ST2, ST3, ST4, ST5, and ST6 and the driving transistor DT may be formed of any one of poly silicon, amorphous silicon, and oxide semiconductor. When the semiconductor layer of each of the first to sixth transistors ST1, ST2, ST3, ST4, ST5, and ST6 and the driving transistor DT is formed of poly silicon, a process of forming the same may be a low temperature poly silicon (LTPS) process.

Although the first to sixth transistors ST1, ST2, ST3, ST4, ST5, and ST6 and the driving transistor DT are formed of P-type MOSFETs in FIG. 39, the transistors are not limited thereto, and may be formed of N-type MOSFETs.

Moreover, the first power voltage of the first power line VDL, a second power voltage of the second power line VSL, and a third power voltage of a third power line VIL may be set in consideration of characteristics of the driving transistor DT, characteristics of the light emitting element LE, and the like.

Figure 40:
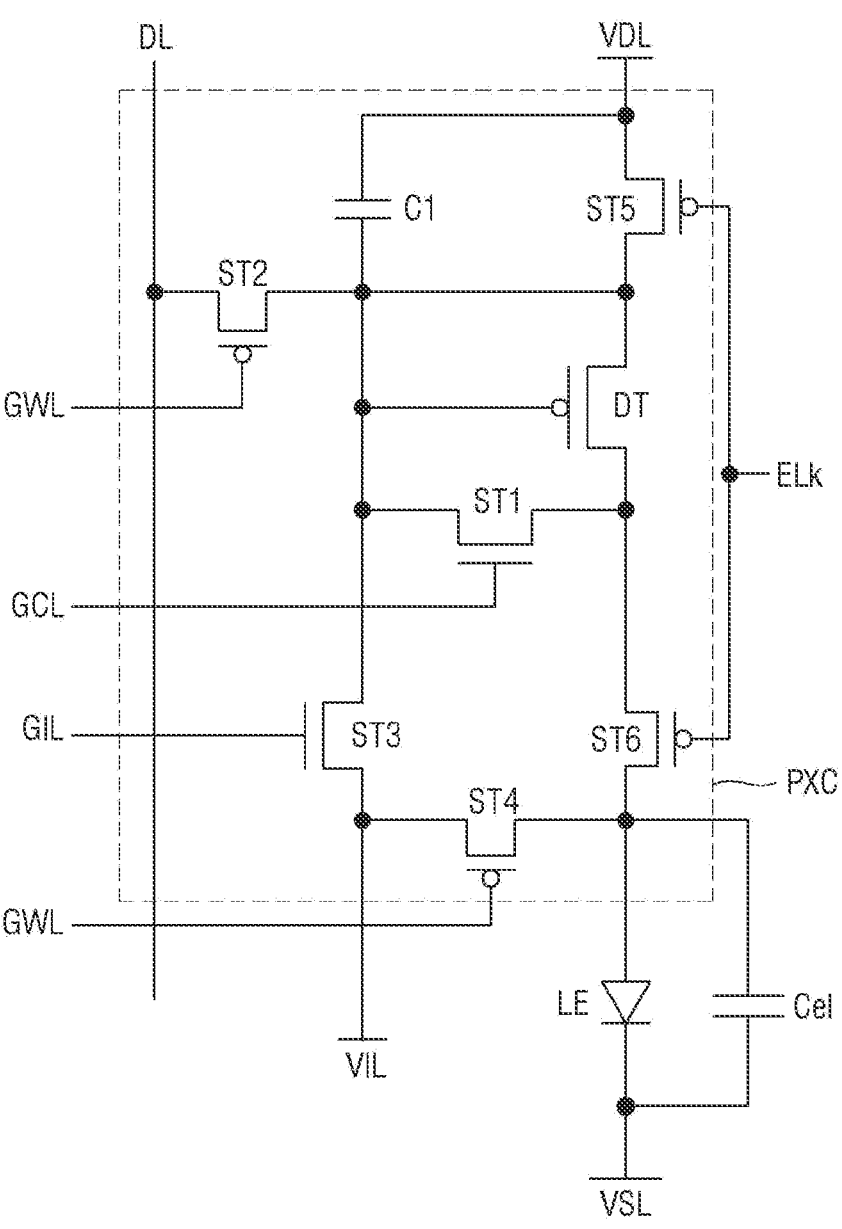
FIG. 40 is a circuit view of a pixel circuit area and a light emitting element according to one or more embodiments.

FIG. 40 is a circuit view of a pixel circuit area and a light emitting element according to one or more embodiments.

Other example of the pixel circuit area PXC and the light emitting element LE of FIG. 6 is shown in FIG. 40.

The embodiment of FIG. 40 is different from the embodiment of FIG. 39 in that the driving transistor DT, the second transistor ST2, the fourth transistor ST4, the fifth transistor ST5, and the sixth transistor ST6 are formed of P-type MOSFETs, and the first transistor ST1 and the third transistor ST3 are formed of N-type MOSFETs.

Referring to FIG. 40, the active layer of each of the driving transistor DT, the second transistor ST2, the fourth transistor ST4, the fifth transistor ST5, and the sixth transistor ST6, which are formed of P-type MOSFETs, may be formed of poly silicon, and the active layer of each of the first transistor ST1 and the third transistor ST3, which are formed of N-type MOSFETs, may be formed of oxide semiconductor.

The embodiment of FIG. 40 is different from the embodiment of FIG. 39 in that the gate electrode of the second transistor ST2 and the gate electrode of the fourth transistor ST4 are connected to a write scan line GWL, and the gate electrode of the first transistor ST1 is connected to a control scan line GCL. In FIG. 40, because the first transistor ST1 and the third transistor ST3 are formed of N-type MOSFETs, a scan signal of a gate high voltage may be applied to the control scan line GCL and an initialization scan line GIL. In contrast, because the second transistor ST2, the fourth transistor ST4, the fifth transistor ST5 and the sixth transistor ST6 are formed of P-type MOSFETs, a scan signal of a gate low voltage may be applied to the write scan line GWL and a light emission line EL.

It should be noted that the pixel circuit area PXC according to the embodiments of the present disclosure is not limited to that shown in FIGS. 38 to 40. The pixel circuit area PXC according to the embodiments of the present disclosure may be formed in other circuit structures, which are known and may be adopted by those skilled in the art, in addition to the embodiments shown in FIGS. 38 to 40.

Figure 41:
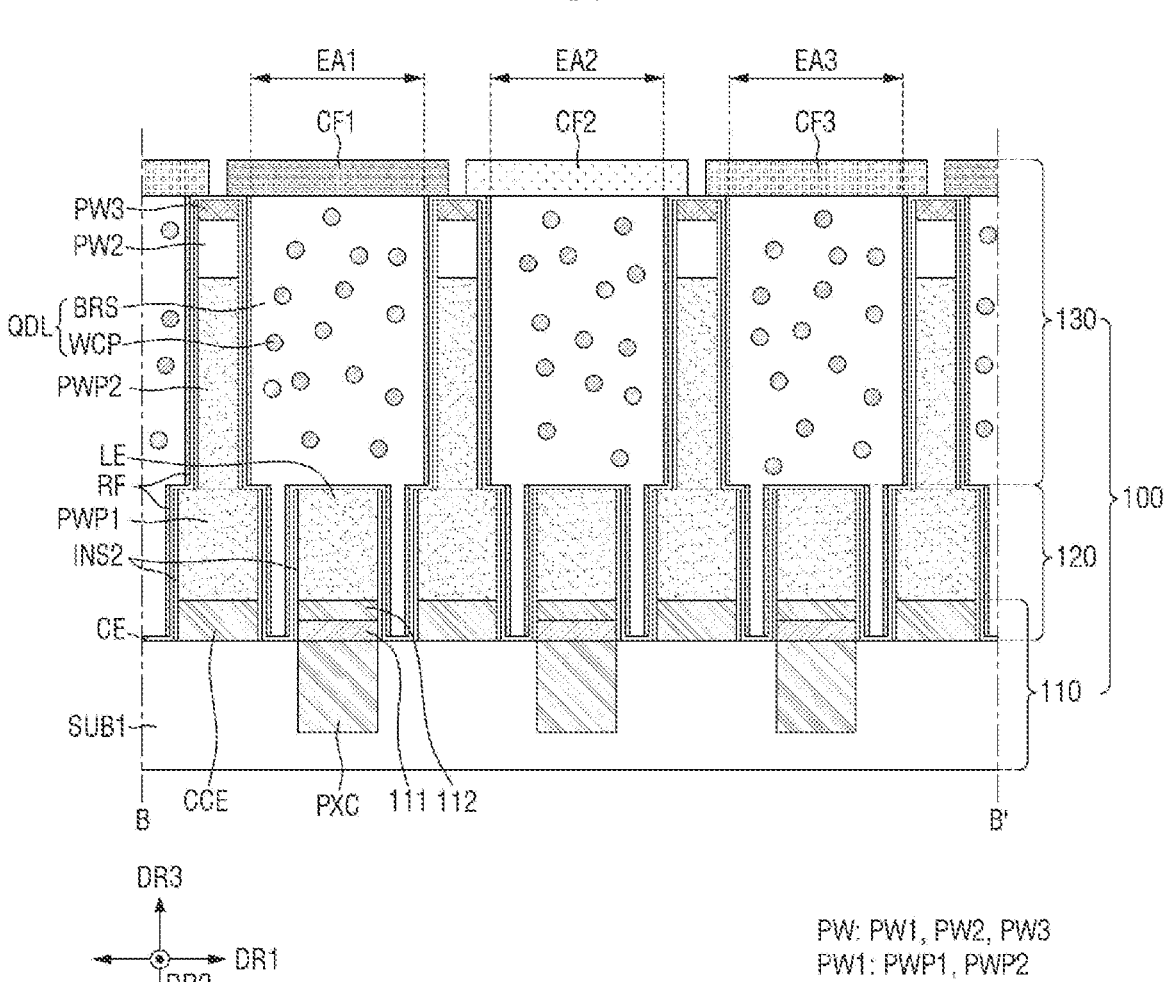
FIG. 41 is a cross-sectional view illustrating an example of a display panel taken along the line B-B' of FIG. 3.
Figure 43:
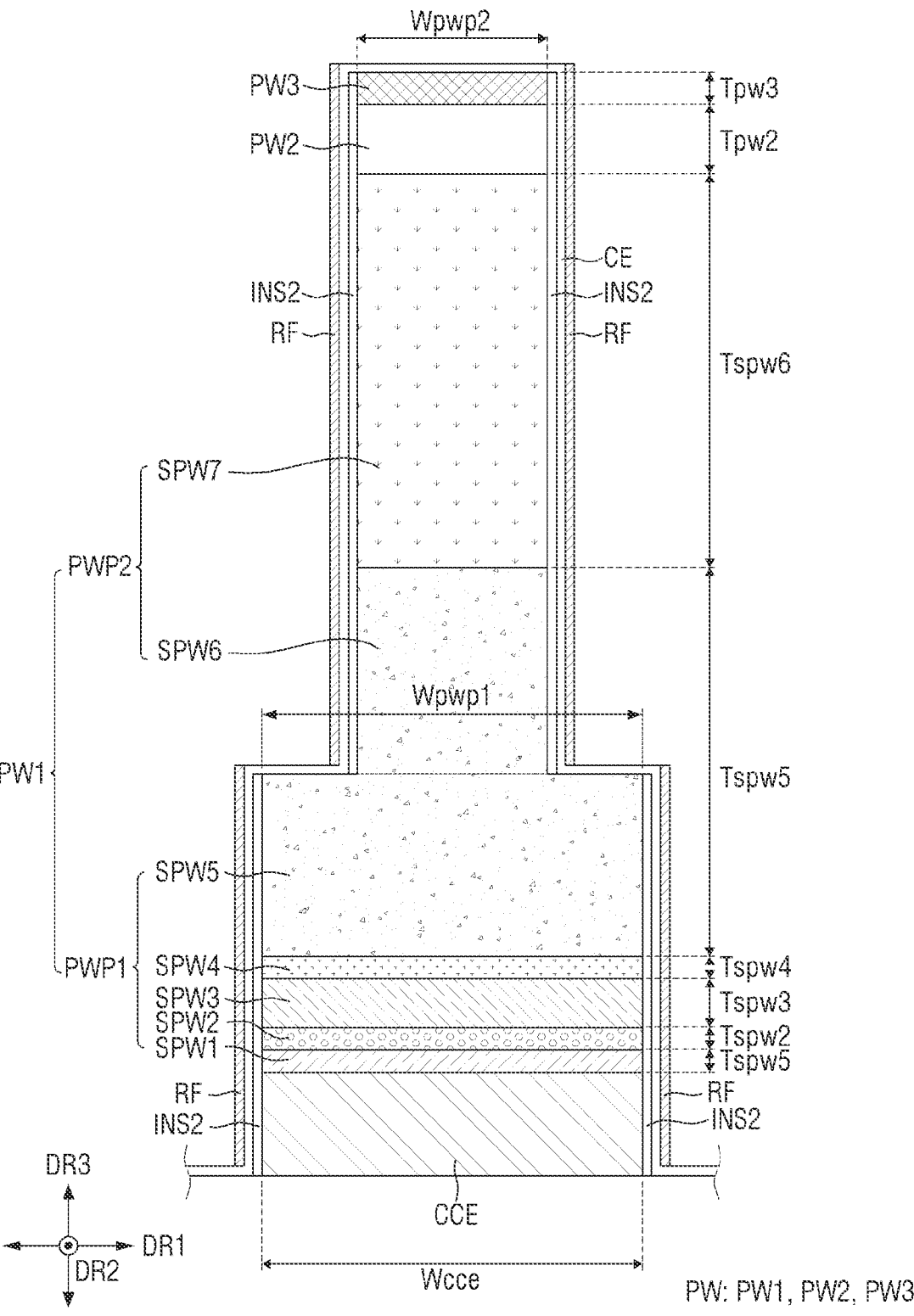
FIG. 43 is an enlarged cross-sectional view illustrating an example of a partition wall of FIG. 42.

FIG. 41 is a cross-sectional view illustrating an example of a display panel taken along the line B-B' of FIG. 3. FIG. 42 is a cross-sectional view illustrating an example of a display panel taken along the line C-C' of FIG. 3. FIG. 43 is an enlarged cross-sectional view illustrating an example of a partition wall of FIGS. 41 and 42.

The embodiment of FIGS. 41 to 43 is different from the embodiments of FIGS. 6, 7, and 9 in that the first insulating film INS1 is removed and the first partition wall PW1 includes a first portion PWP1 and a second portion PWP2, which have their respective widths different from each other. In FIG. 41, the description duplicated with the embodiments of FIGS. 6, 7, and 9 will be omitted.

Referring to FIG. 41, because the first insulating film INS1 is removed, the first partition wall PW1 may be disposed on the common connection electrode CCE. That is, due to the removal of the first insulating film INS1, the first partition wall PW1 serves as a conductive connector for connecting the common connection electrode CCE with the common electrode CE. That is, because the first partition wall PW1 is in contact with the upper surface of the common connection electrode CCE, a common voltage of the common connection electrode CCE may be applied to the first partition wall PW1.

The first partition wall PW1 may include a first portion PWP1 and a second portion PWP2 disposed on the first portion PWP1. A width Wpwp1 of the first portion PWP1 may be greater than a width Wpwp2 of the second portion PWP2. For this reason, an edge of an upper surface of the first portion PWP1 may be exposed without being covered by the second portion PWP2.

The width Wpwp1 of the first portion PWP1 may be substantially the same as the width Wcce of the common connection electrode CCE. For this reason, the upper surface of the common connection electrode CCE may be covered by the first partition wall PW1. That is, the upper surface of the common connection electrode CCE is not exposed.

A height Tpwp1 of the first portion PWP1 may be substantially the same as a height Tle of the light emitting element LE. The height Tpwp1 of the first portion PWP1 may be less than a height Tpwp2 of the second portion PWP2.

The first portion PWP1 may include the same material as that of the light emitting element LE. The first portion PWP1 may include a first sub-partition wall SPW1, a second sub-partition wall SPW2, a third sub-partition wall SPW3, a fourth sub-partition wall SPW4, and a fifth sub-partition wall SPW5. The second portion PWP2 may include a sixth sub-partition wall SPW6 and a seventh sub-partition wall SPW7.

The first sub-partition wall SPW1 may be formed of the same material as that of the first semiconductor layer of the light emitting element LE, and the second sub-partition wall SPW2 may be formed of the same material as that of the electron blocking layer EBL of the light emitting element LE. The third sub-partition wall SPW3 may be formed of the same material as that of the active layer MQW of the light emitting element LE, and the fourth sub-partition wall SPW4 may be formed of the same material as that of the superlattice layer SLT of the light emitting element LE. The fifth sub-partition wall SPW5 may be formed of the same material as that of the second semiconductor layer SEM2 of the light emitting element LE.

The second insulating film INS2 may be disposed on the side of the common connection electrode CCE, side of the first portion PWP1 of the first partition wall PW1, and side of the second portion PWP2. The common electrode CE may be disposed on the upper surface of the first portion PWP1 exposed without being covered by the second insulating film INS2 and the second portion PWP2.

As shown in FIGS. 41 and 43, the common electrode CE may be in contact with the upper surface of the first portion PWP1 of the first partition wall PW1 exposed without being covered by the second portion PWP2 of the first partition wall PW1 in each of the plurality of common connection areas. In this case, the common electrode CE may be supplied with a common voltage through the common connection electrode CCE and the first portion PWP1 of the first partition wall PW1. Therefore, even though the common electrode is disconnected on the side of the partition wall PW due to the great thickness and the narrow width of the partition wall PW, the common voltage may be stably supplied to the common electrode CE through the common connection electrode CCE and the first portion PWP1 of the first partition wall PW1.

FIGS. 44 to 52 are cross-sectional views illustrating a method for fabricating a display panel according to one or more embodiments of the present disclosure.

FIGS. 44 to 52 are cross-sectional views illustrating an example of a method for fabricating the display panel shown in FIG. 21. In FIGS. 44 to 52, the description duplicated with the embodiments of FIGS. 22 to 33 will be omitted.

Figure 44:
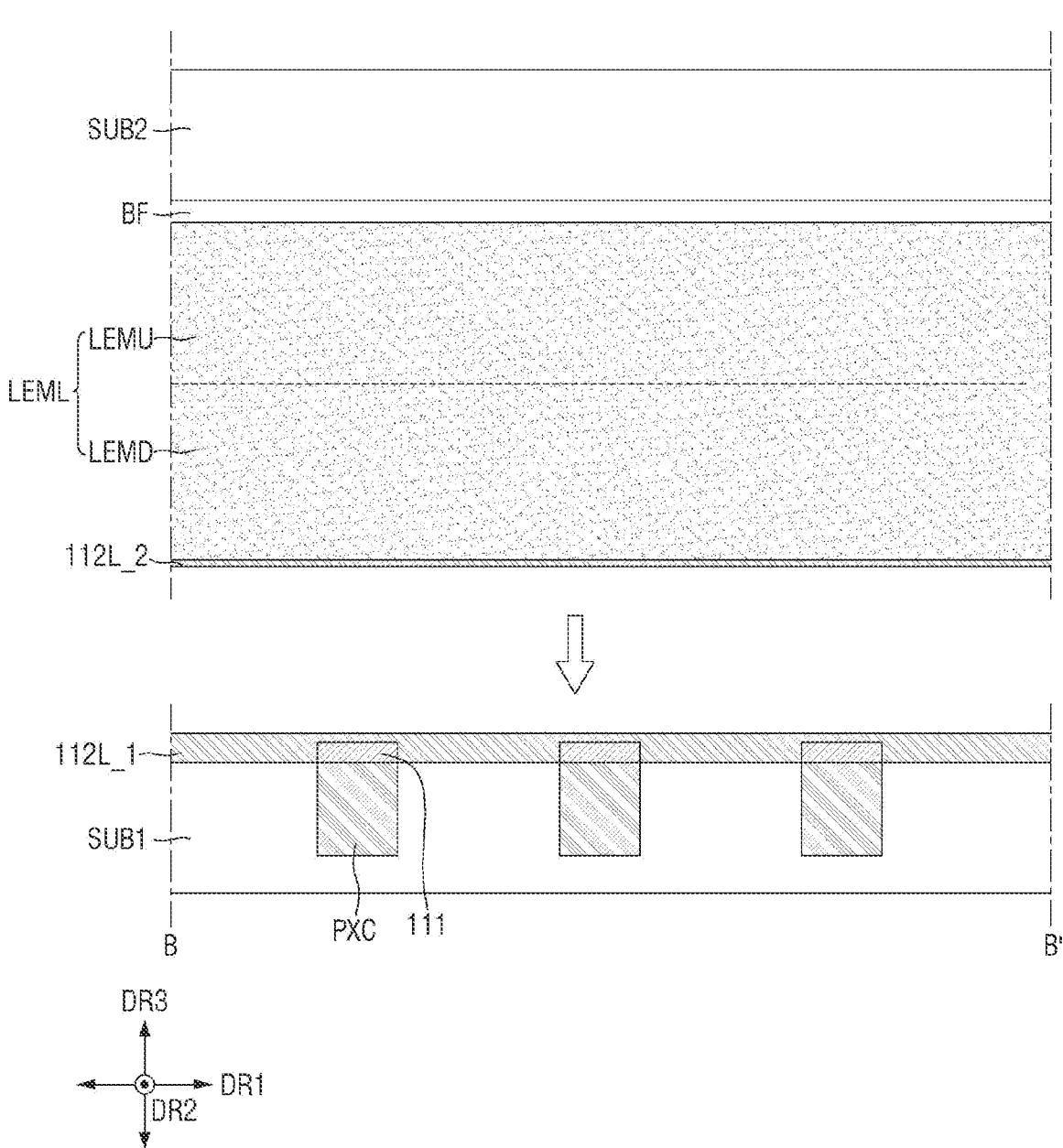
FIGS. 44 to 52 are cross-sectional views illustrating a method for fabricating a display panel according to an embodiment of the present disclosure.

First, as shown in FIG. 44, a separate first insulating film INS1 is not formed on the first semiconductor material layer LEMD. The second connection electrode layer 112L_2 may be deposited on the first semiconductor material layer LEMD (S110 of FIG. 21).

Figure 45:
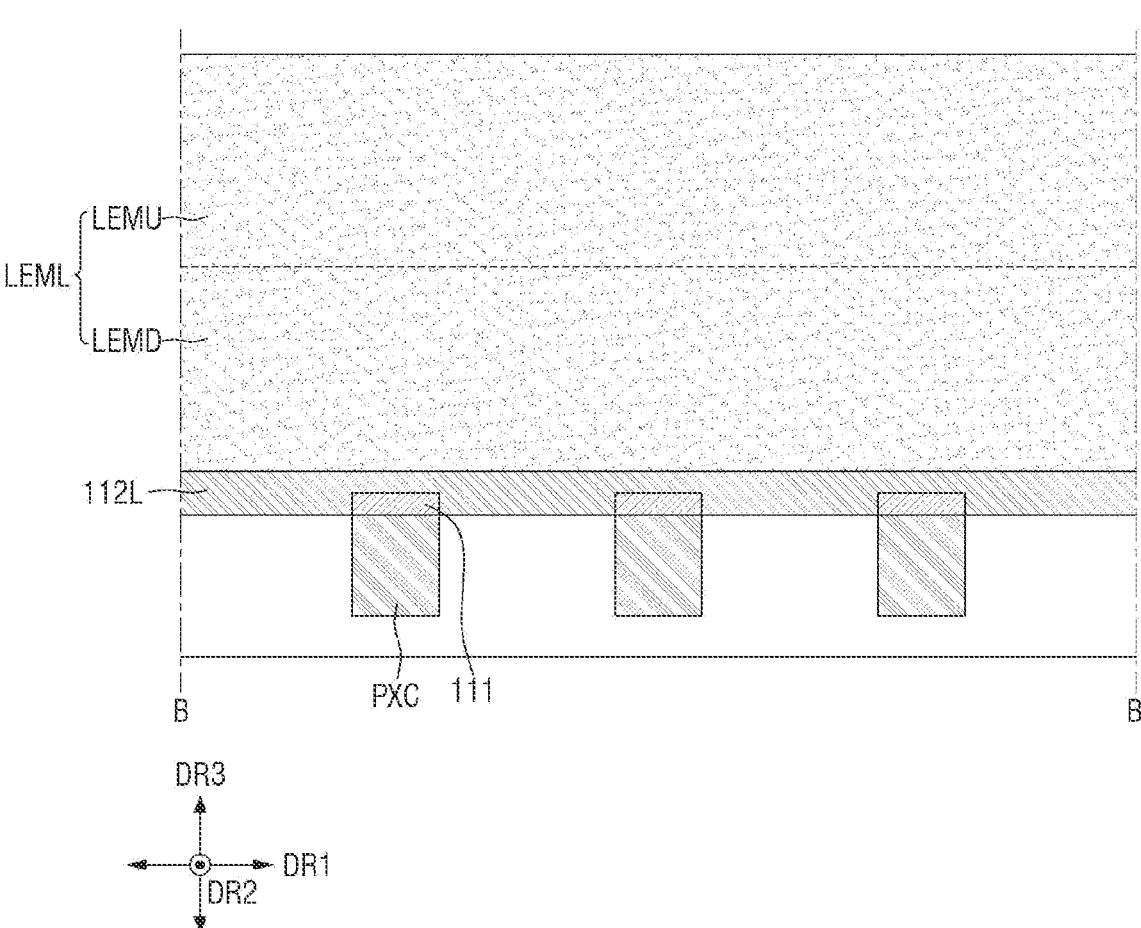

Then, as shown in FIG. 45, the first connection electrode layer 112L_1 and the second connection electrode layer 112L_2 are adhered to each other, and the second substrate SUB2 and the buffer layer BF are removed (S210 of FIG. 21).

Figure 46:
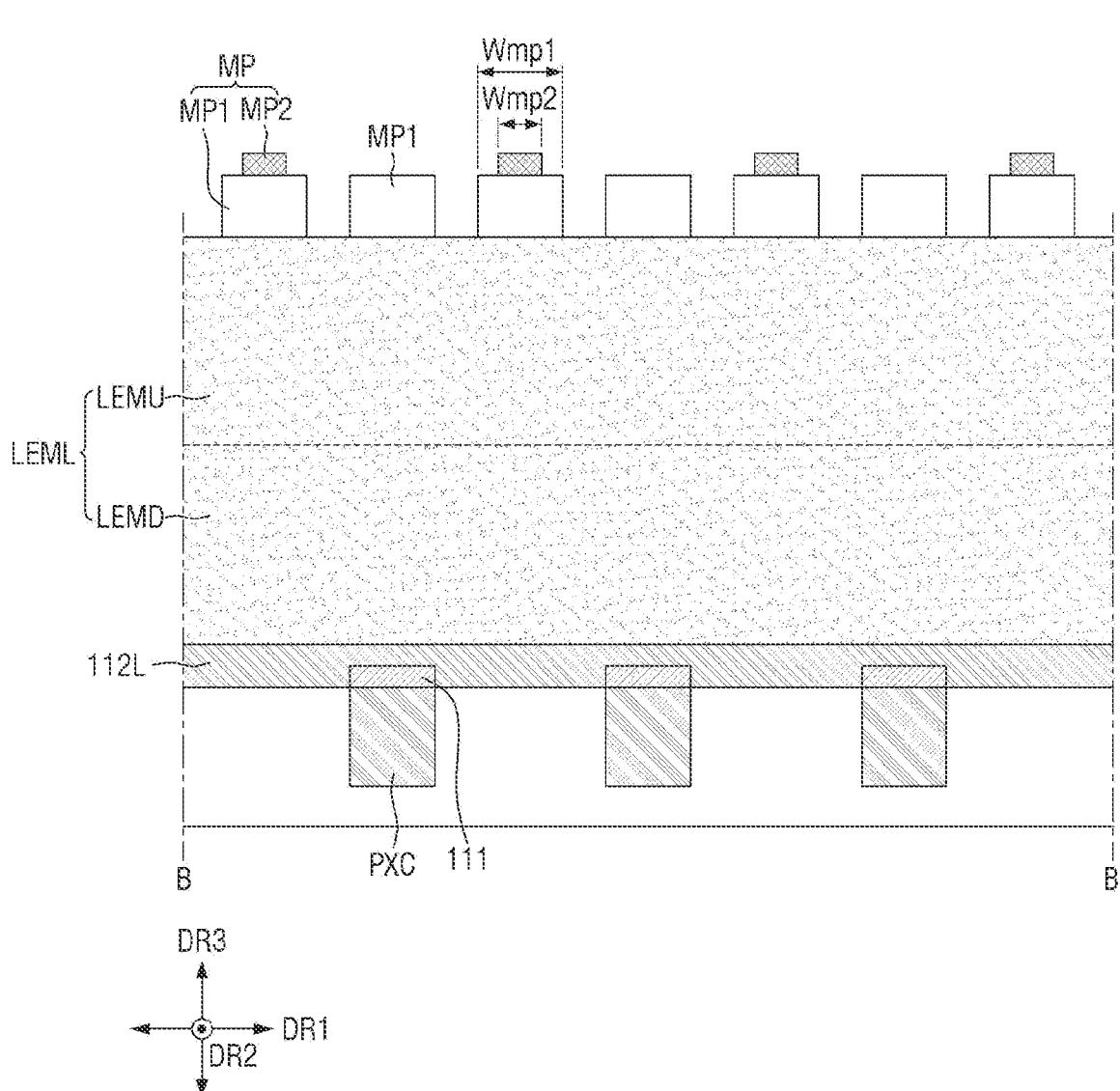

Then, as shown in FIG. 46, the first mask patterns MP1 are formed on an upper surface of the light emitting material layer LEML. The second mask pattern MP2 may be disposed on each of some of the first mask patterns MP1. At this time, a width Wmp2 of the second mask pattern MP2 may be less than a width Wmp1 of the first mask pattern MP1 overlapped with the second mask pattern MP2 (S310 of FIG. 21) in the third direction DR3.

Figure 47:
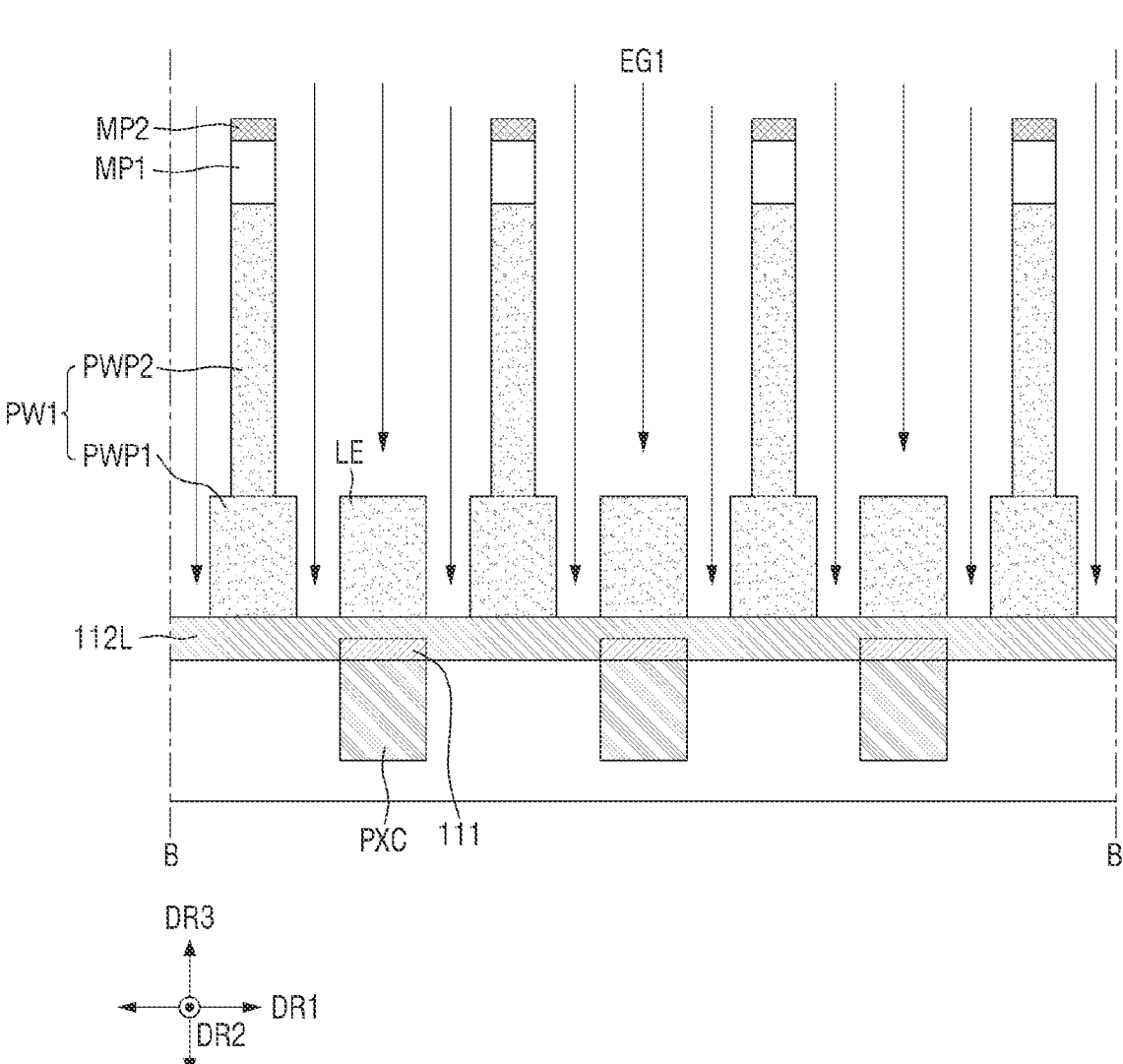

Then, as shown in FIG. 47, the second mask pattern MP2 may not be etched by the first etching material EG1 for etching the light emitting material layer LEML. For this reason, the light emitting material layer LEML of the area where the second mask pattern MP2 is disposed may not be etched by the first etching material EG1. Therefore, the second portion PWP2 of the first partition wall PW1 may be formed in the area where the second mask pattern MP2 is disposed.

The etching ratio of the light emitting material layer LEML by the first etching material EG1 may be higher than that of the first mask pattern MP1. Therefore, the light emitting elements LE and the first portion PWP1 of the first partition wall PW1 may be formed in the area where the first mask pattern MP1 is disposed. For this reason, the upper surface of the first portion PWP1 of the first partition wall PW1 may be exposed without being covered by the second portion PWP2, and the height Tle of each of the light emitting elements LE may substantially be the same as the height Tpwp1 of the first portion PWP1.

The light emitting material layer LEML may be completely removed by the first etching material EG1 in the area where the first mask pattern MP1 and the second mask pattern MP2 are not disposed.

Figure 48:
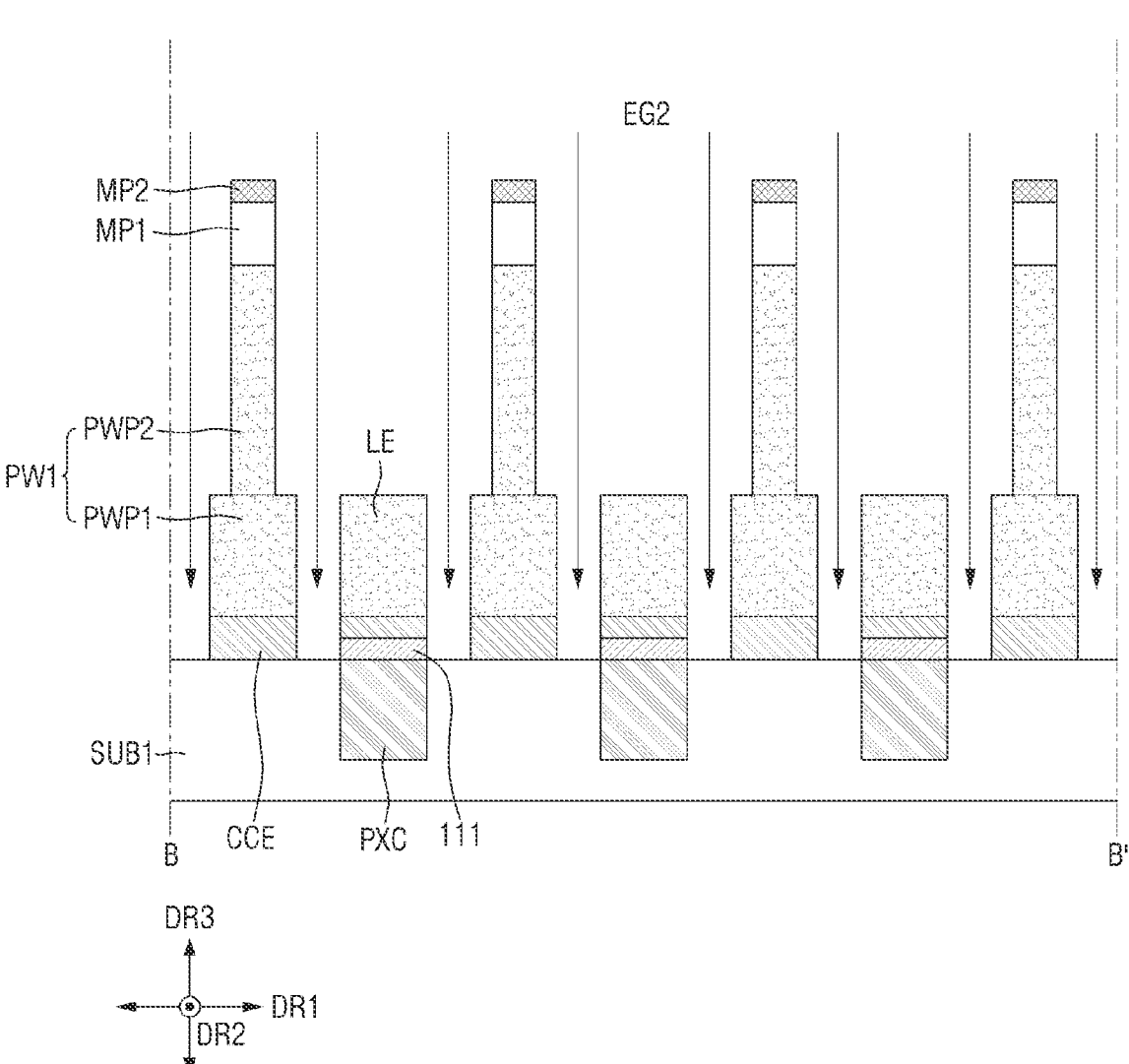

Then, as shown in FIG. 48, the second mask pattern MP2, the light emitting elements LE, and the first portion PWP1 of the first partition wall PW1 may not be etched by the second etching material EG2 for etching the connection electrode layer 112L. For this reason, the second mask pattern MP2, the light emitting elements LE, and the connection electrode layer 112L disposed below the first portion PWP1 of the first partition wall PW1 may not be etched by the second etching material EG2. Therefore, the connection electrode 112 disposed below each of the light emitting element LE and the common connection electrode CCE disposed below the first portion PWP1 of the first partition wall PW1 may be formed.

The first mask pattern MP1 and the second mask pattern MP2 that are not etched by the first etching material EG1 and the second etching material EG2 may remain as the second partition wall PW2 and the third partition wall PW3, respectively (S410 of FIG. 21).

Figure 49:
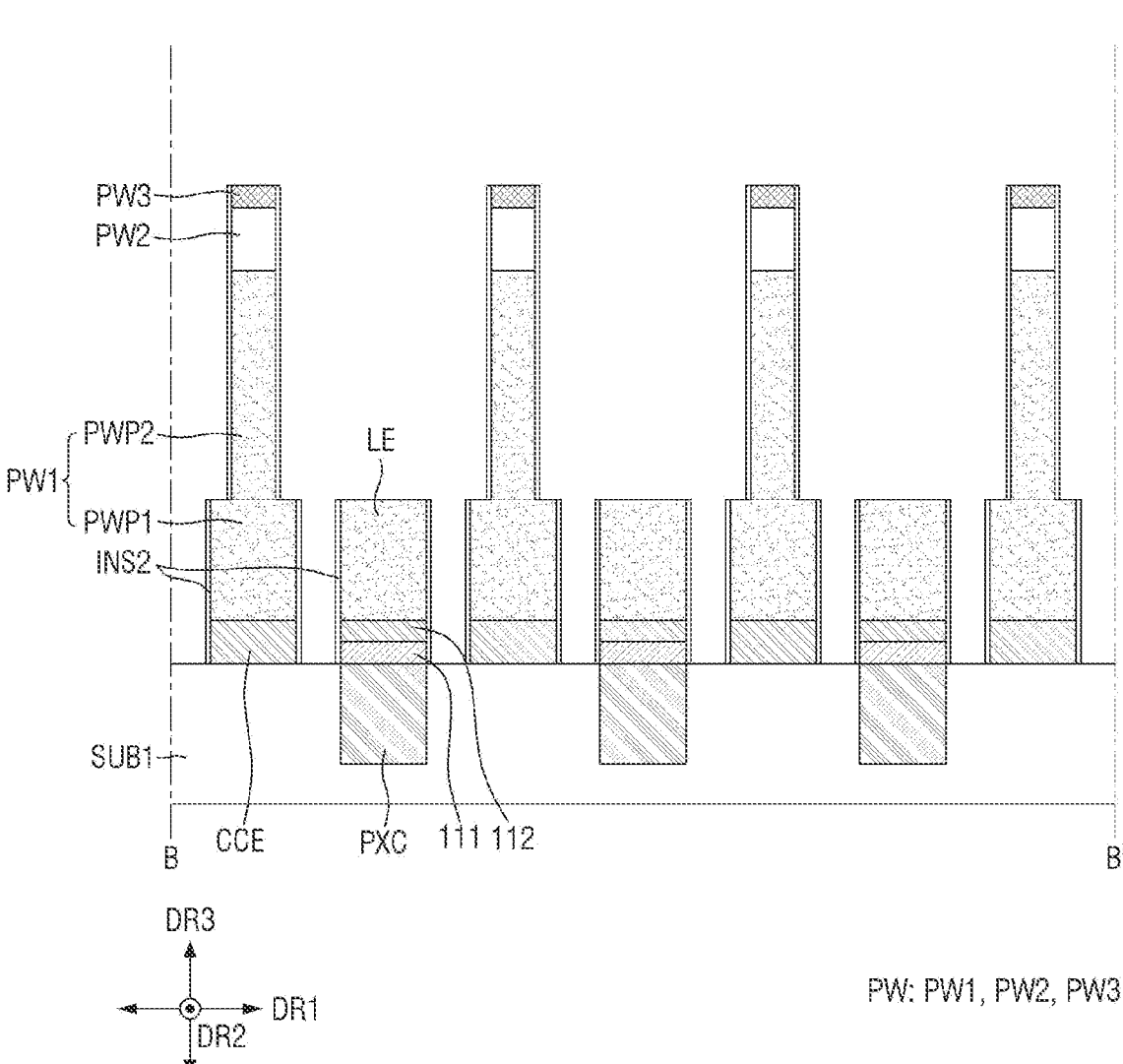

Then, as shown in FIG. 49, a second insulating film layer is deposited to cover the light emitting elements LE and the partition wall PW. In one or more embodiments, a second insulating film layer disposed on the upper surface of each of the light emitting elements LE and the upper surface of the partition wall PW is etched. For this reason, the second insulating film INS2 may be formed on the side of the common connection electrode CCE, the side of the first portion PWP1 of the first partition wall PW1, the side of the second partition wall PW2, the side of the third partition wall PW3, the side of each of the pixel electrodes 111, and the side of each of the connection electrodes 112, and the side of each of the light emitting elements LE (S510 of FIG. 21).

Figure 50:
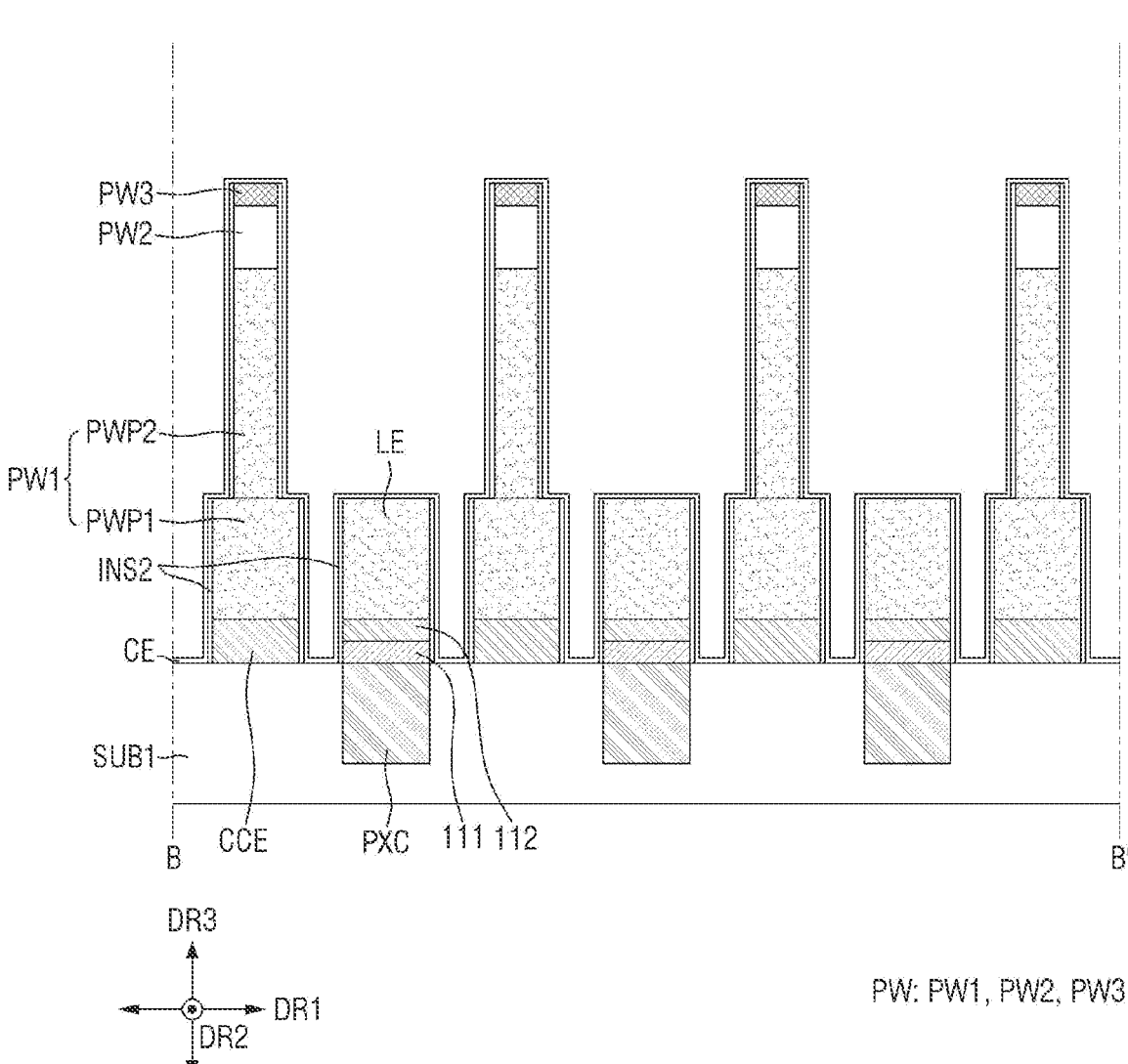

Then, as shown in FIG. 50, the common electrode CE is deposited on the light emitting elements LE and the partition wall PW.

The common electrode CE may be disposed on the side of the common connection electrode CCE, the upper surface of the first portion PWP1 of the first partition wall PW1, and the upper surface of the first substrate SUB1 disposed between the pixel electrode 111 and the common connection electrode CCE. Also, the common electrode CE may be disposed on the second insulating film INS2 (S610 of FIG. 21).

Figure 51:
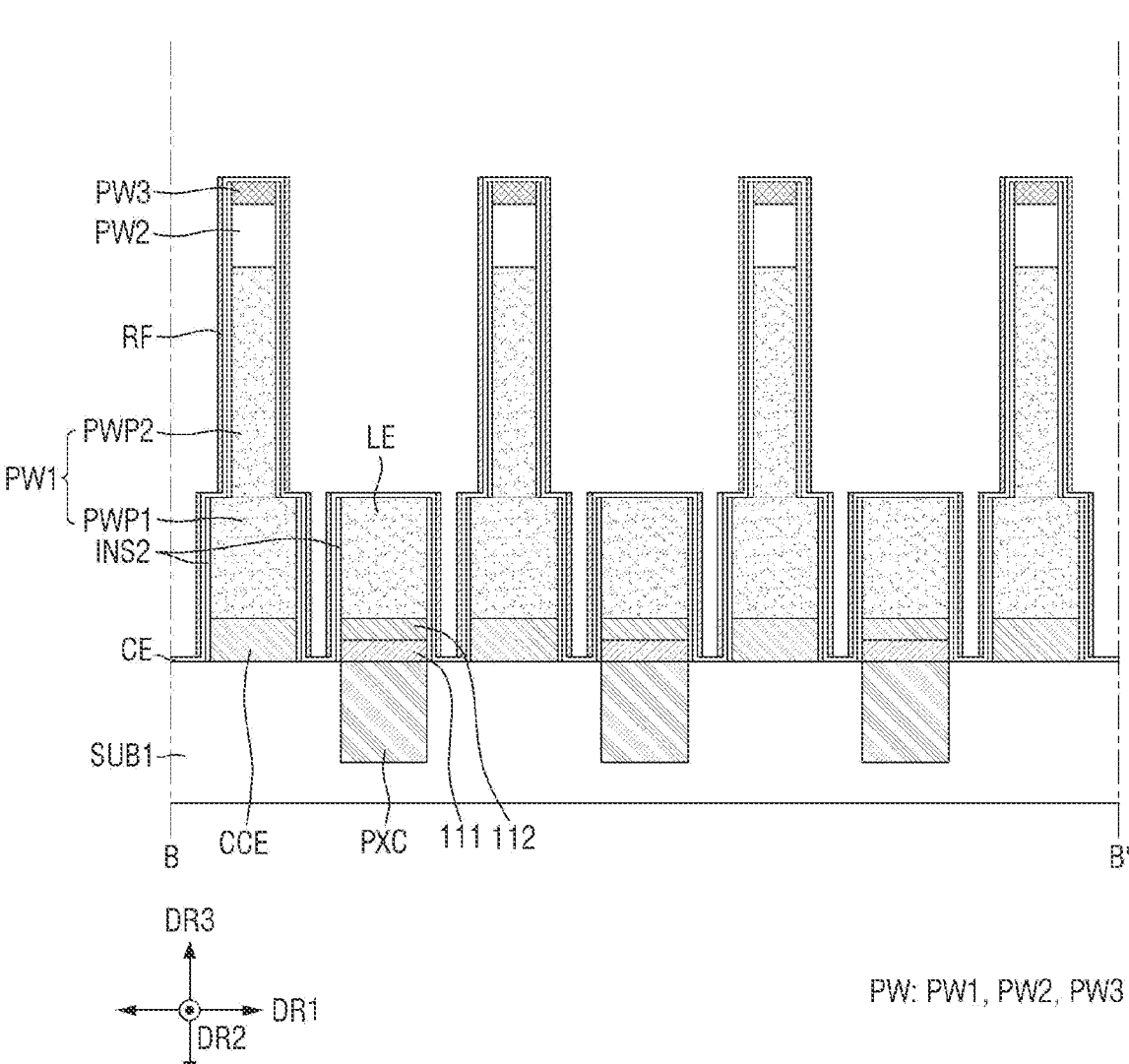

Then, as shown in FIG. 51, a reflection layer is deposited to cover the light emitting elements LE and the partition wall PW. In one or more embodiments, a reflective layer disposed on the upper surface of each of the light emitting elements LE and the upper surface of the partition wall PW is etched. For this reason, the reflection film RF may be formed on the side of the common connection electrode CCE, the side of the first portion PWP1 and the second portion PWP2 of the first partition wall PW1, the side of the second partition wall PW2, the side of the third partition wall PW3, the side of each of the pixel electrodes 111, the side of each of the connection electrodes 112, and the common electrode CE disposed on the side of each of the light emitting elements LE (S710 of FIG. 21).

Figure 52:
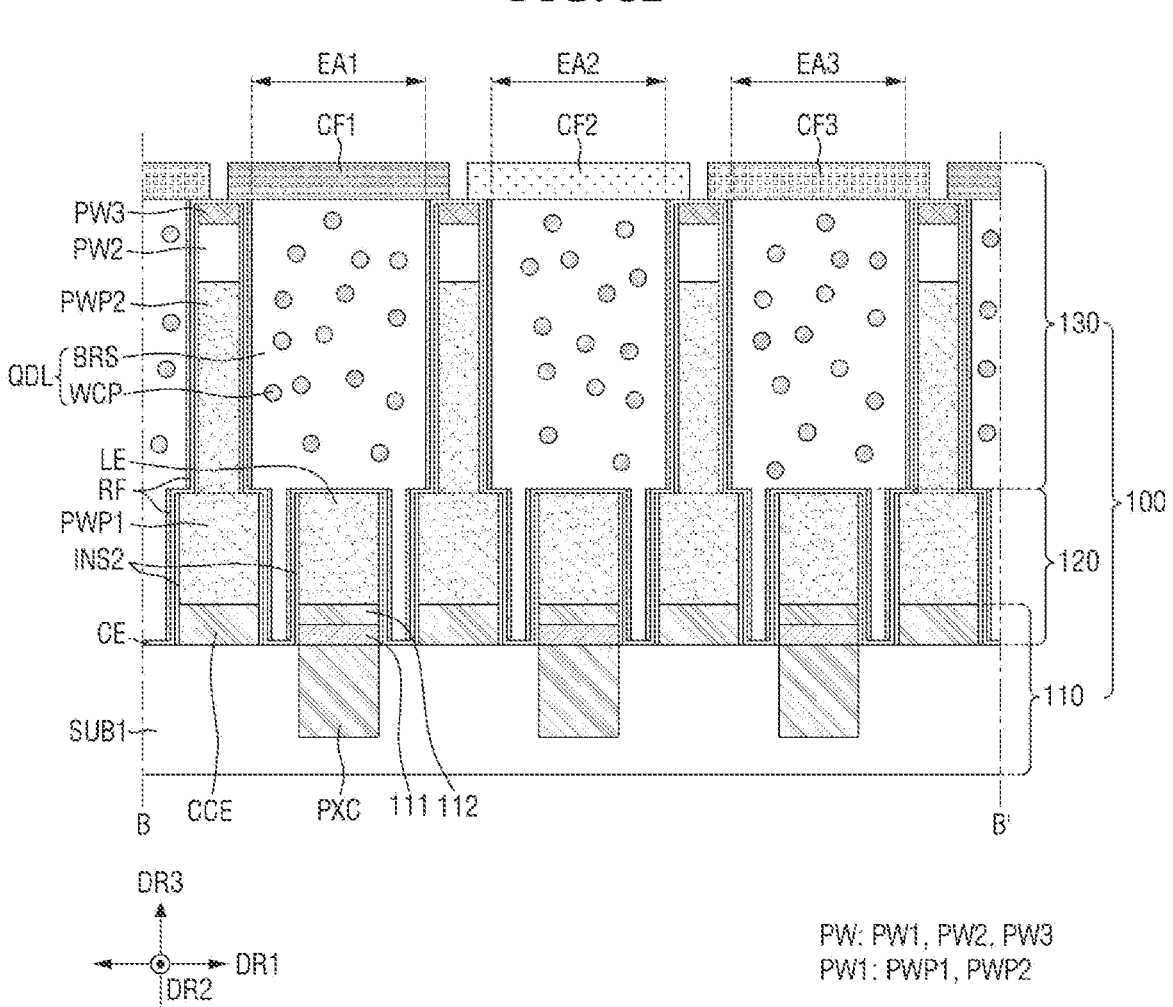

Then, as shown in FIG. 52, the wavelength conversion layer QDL is formed in each of the plurality of light emission areas EA1, EA2, and EA3 partitioned by the partition wall PW, and color filters CF1, CF2, and CF3 are formed on the wavelength conversion layer QDL (S810 of FIG. 21).

As shown in FIGS. 44 to 52, because the first insulating film INS1 is removed, the first partition wall PW1 serves as a conductive connector for connecting the common connection electrode CCE with the common electrode CE. That is, due to the removal of the first insulating film INS1, the process of etching the first insulating film INS1 disposed at the edge of the upper surface of the common connection electrode CCE may be omitted, whereby the fabricating process may be simplified.

Figure 53:
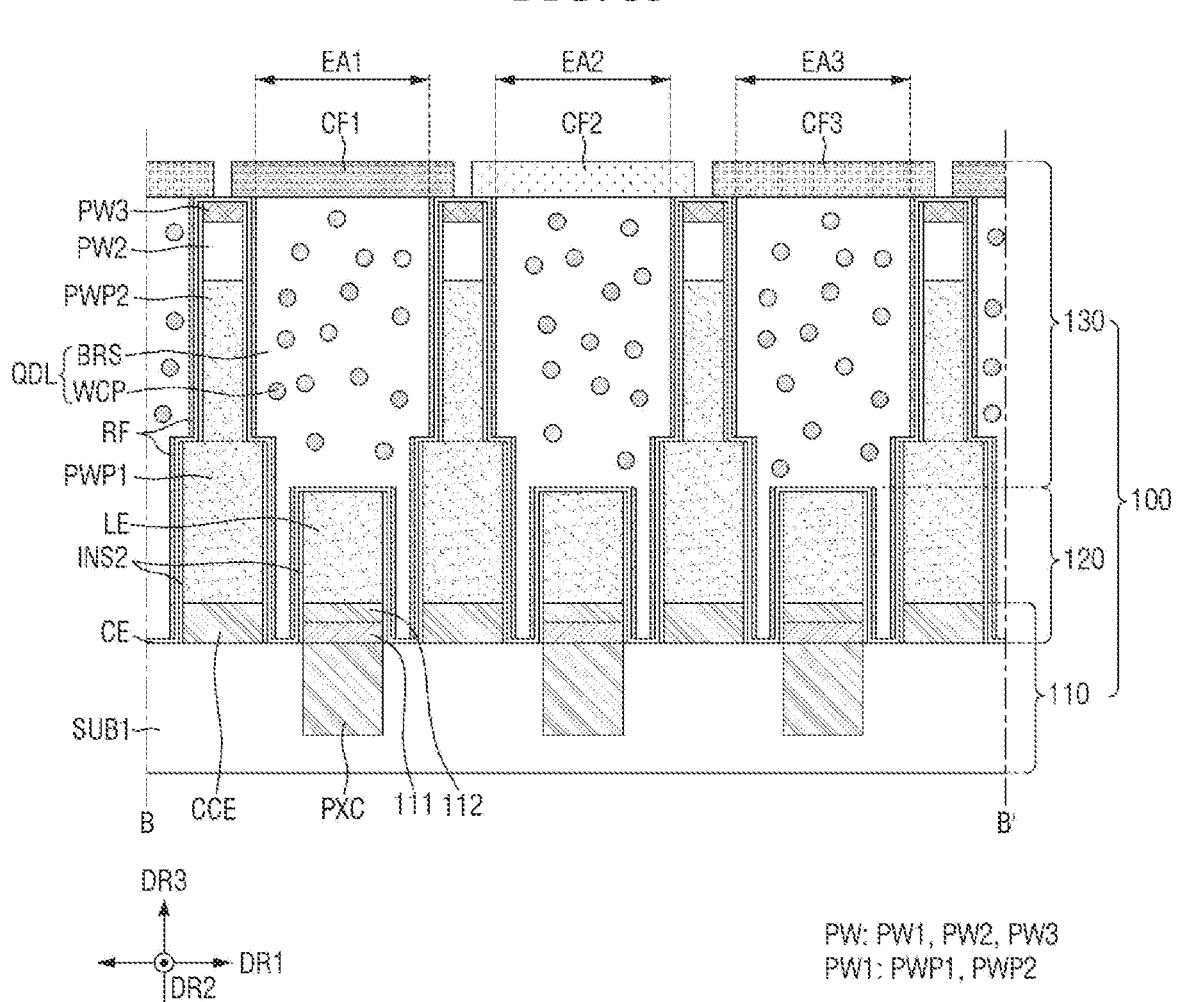
FIG. 53 is a cross-sectional view illustrating an example of a display panel taken along the line B-B' of FIG. 3.
Figure 54:
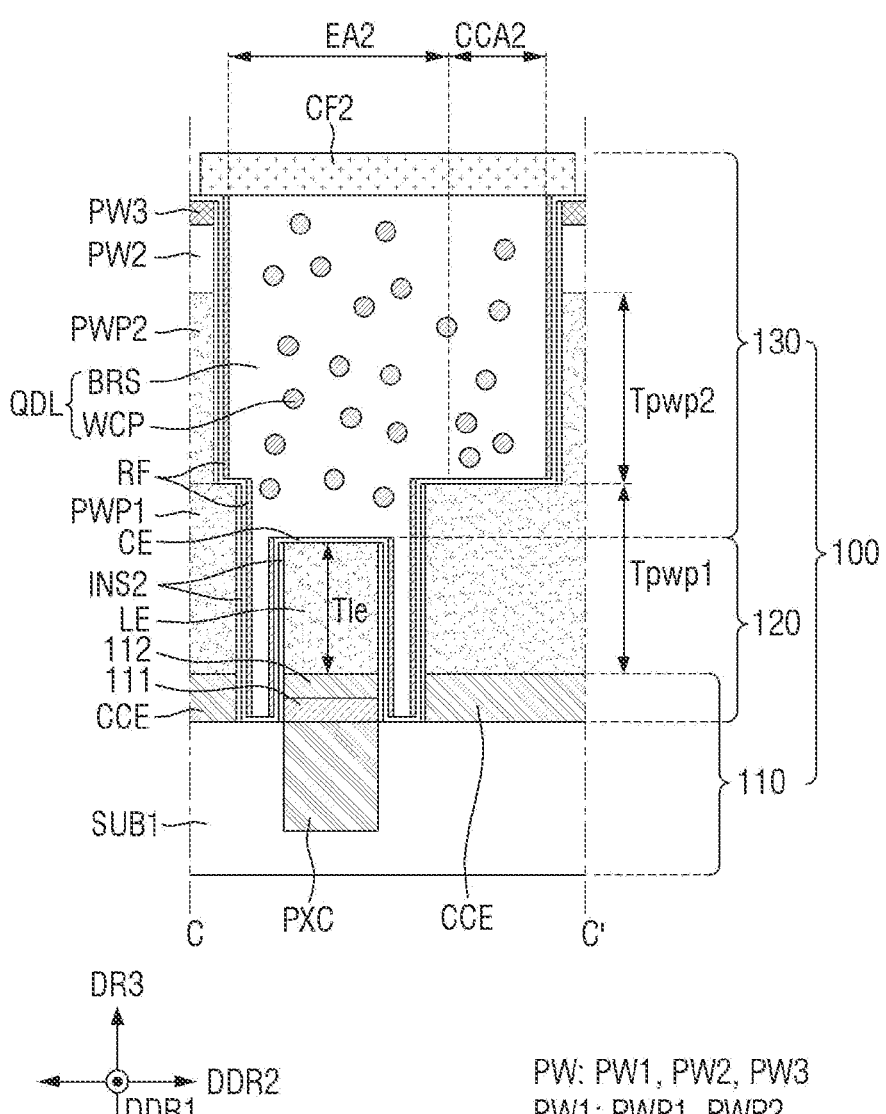
FIG. 54 is a cross-sectional view illustrating an example of a display panel taken along the line C-C' of FIG. 3.
Figure 55:
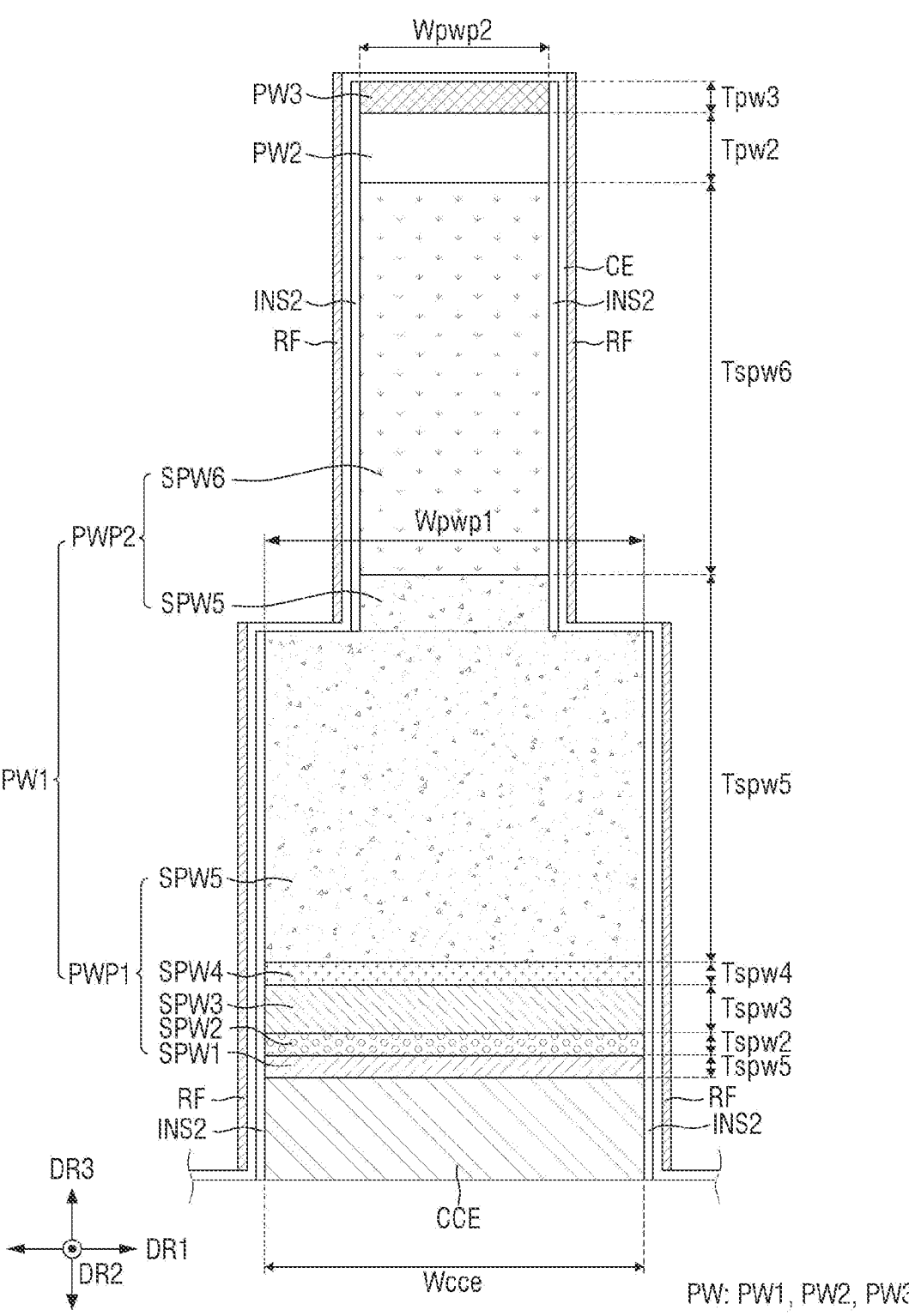
FIG. 55 is an enlarged cross-sectional view illustrating an example of a partition wall of FIG. 54.

FIG. 53 is a cross-sectional view illustrating an example of a display panel taken along the line B-B' of FIG. 3. FIG. 54 is a cross-sectional view illustrating an example of a display panel taken along the line C-C' of FIG. 3. FIG. 55 is an enlarged cross-sectional view illustrating an example of a partition wall of FIG. 54.

The embodiment of FIGS. 53 to 55 is different from the embodiment of FIGS. 41 to 43 in that the height Tpwp1 of the first portion PWP1 of the first partition wall PW1 is greater than the height Tle of the light emitting element LE, and thus the detailed description of FIGS. 53 to 55 will be omitted.

Figure 56:
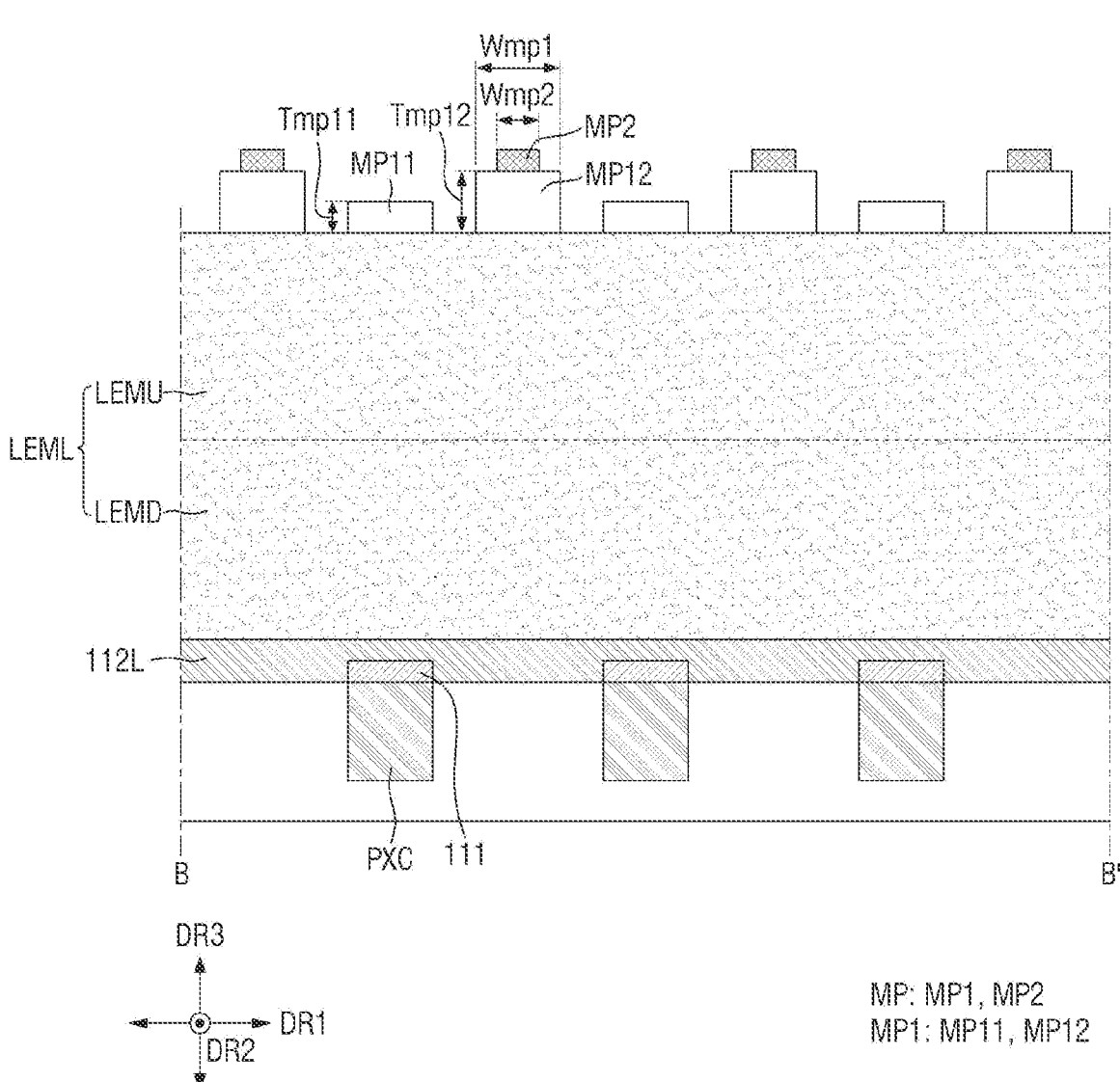
FIGS. 56 and 57 are cross-sectional views illustrating S210 and S310 of FIG. 21.
Figure 57:
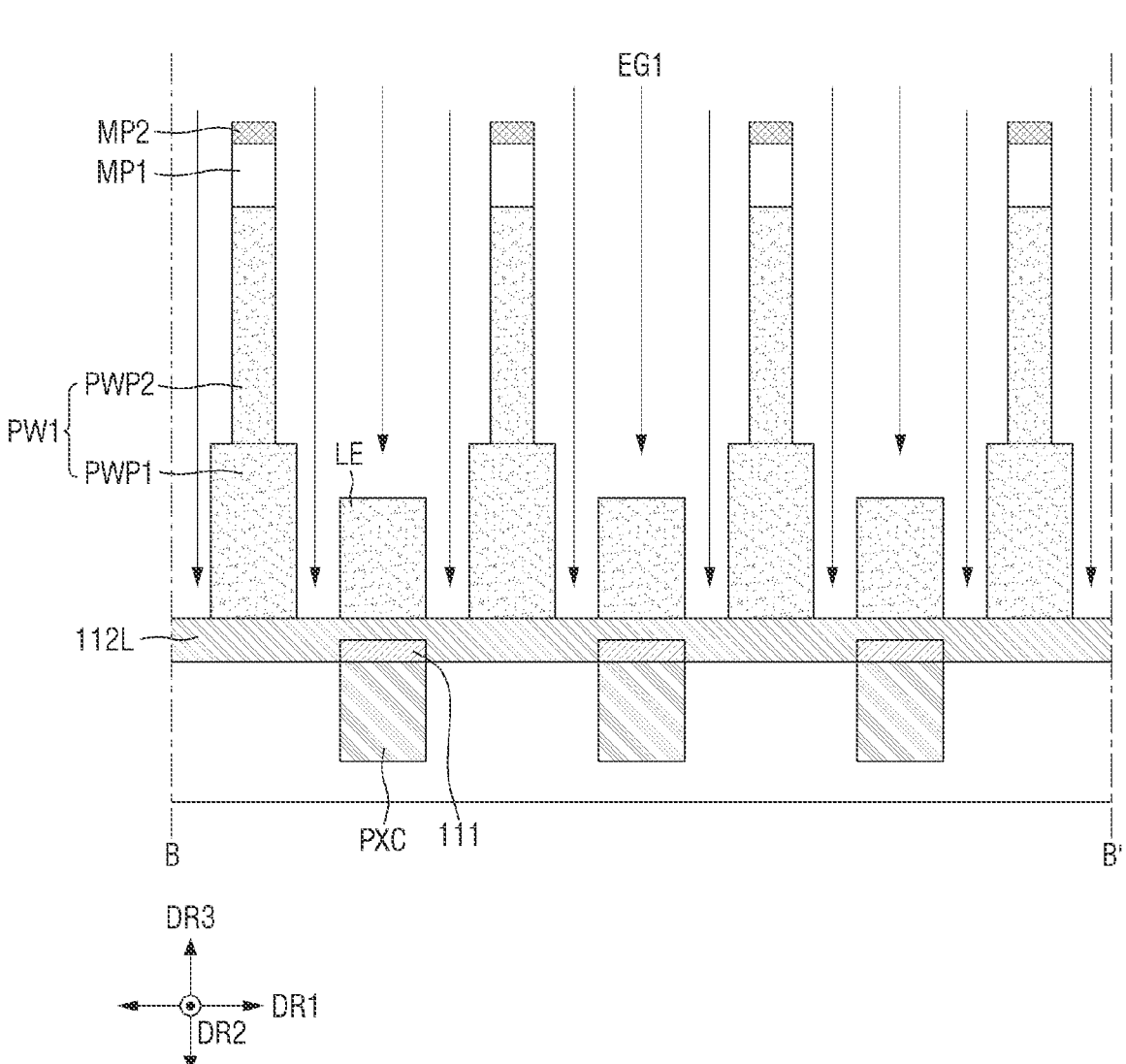

FIGS. 56 and 57 are cross-sectional views illustrating S210 and S310 of FIG. 21.

First, as shown in FIG. 56, the second mask pattern MP2 may not be etched by the first etching material EG1 for etching the light emitting material layer LEML. For this reason, the light emitting material layer LEML of the area where the second mask pattern MP2 is disposed may not be etched by the first etching material EG1. Therefore, the second portion PWP2 of the first partition wall PW1 may be formed in the area where the second mask pattern MP2 is disposed.

As shown in FIG. 57, the etching ratio of the light emitting material layer LEML by the first etching material EG1 may be higher than that of the first mask pattern MP1. At this time, a thickness Tmp11 of a first sub-mask pattern MP11 of the first mask pattern MP1 may be less than a thickness Tmp12 of a second sub-mask pattern MP12. Therefore, the light emitting material layer LEML in which the first sub-mask pattern MP11 is disposed may be slightly more etched than the light emitting material layer LEML in which the second sub-mask pattern MP12 is disposed. Therefore, the light emitting element LE may be disposed in the area where the first sub-mask pattern MP11 is disposed, and the first portion PWP1 of the first partition wall PW1 having a height Tpwp1 greater than the height Tle of the light emitting element LE may be formed in the area where the first sub-mask pattern MP11 is not disposed. As a result, the upper surface of the first portion PWP1 of the first partition wall PW1 may be exposed without being covered by the second portion PWP2.

The light emitting material layer LEML may be completely removed by the first etching material EG1 in the area where the first mask pattern MP1 and the second mask pattern MP2 are not disposed.

Then, as shown in FIG. 48, the second mask pattern MP2, the light emitting elements LE, and the first portion PWP1 of the first partition wall PW1 may not be etched by the second etching material EG2 for etching the connection electrode layer 112L. For this reason, the second mask pattern MP2, the light emitting elements LE, and the connection electrode layer 112L disposed below the first portion PWP1 of the first partition wall PW1 may not be etched by the second etching material EG2. Therefore, the connection electrode 112 disposed below each of the light emitting element LE and the common connection electrode CCE disposed below the first portion PWP1 of the first partition wall PW1 may be formed.

The first mask pattern MP1 and the second mask pattern MP2 that are not etched by the first etching material EG1 and the second etching material EG2 may remain as the second partition wall PW2 and the third partition wall PW3, respectively (S410 of FIG. 21).

As shown in FIGS. 56 and 57, because the first insulating film INS1 is removed, the first partition wall PW1 serves as a conductive connector for connecting the common connection electrode CCE with the common electrode CE. That is, due to the removal of the first insulating film INS1, the process of etching the first insulating film INS1 disposed at the edge of the upper surface of the common connection electrode CCE may be omitted, whereby the fabricating process may be simplified.

However, the aspects and features of embodiments of the present disclosure are not restricted to the one set forth herein. The above and other aspects and features of embodiments of the present disclosure will become more apparent to one of daily skill in the art to which the present disclosure pertains by referencing the claims, with functional equivalents thereof to be included therein.

What is claimed is:

1. A display device comprising:
a substrate;
a partition wall on the substrate;
a pixel electrode located at each of a plurality of light emitting areas partitioned by the partition wall on the substrate;

a light emitting element on the pixel electrode in each of the plurality of light emitting areas and extending in a thickness direction of the substrate;
a common electrode on the light emitting element and the partition wall; and
a common connection electrode located between the substrate and the partition wall,
wherein the common electrode is in contact with an upper surface of the common connection electrode that is not covered by the partition wall,
wherein the partition wall comprises:
a first partition wall including a partial area comprising a same material as that of the light emitting element;
a second partition wall on the first partition wall and comprising an insulating material; and
a third partition wall on the second partition wall, the third partition wall being conductive, and
wherein the first partition wall, the second partition wall, and the third partition wall overlap each other in the thickness direction of the substrate.

2. The display device of claim 1, wherein a width of the common connection electrode overlapped with the partition wall in the thickness direction of the substrate is wider than that of the partition wall.

3. The display device of claim 1, further comprising a first insulating film located between the common connection electrode and the partition wall.

4. The display device of claim 1, further comprising a connection electrode located between the pixel electrode and the light emitting element.

5. The display device of claim 4, wherein the common connection electrode comprises a same material as that of the connection electrode.

6. The display device of claim 1, wherein the light emitting element comprises:
a first semiconductor layer on a connection electrode located between the pixel electrode and the light emitting element;
an active layer on the first semiconductor layer; and
a second semiconductor layer on the active layer.

7. The display device of claim 6, wherein the first partition wall comprises a first sub-partition wall comprising a same material as that of the first semiconductor layer, a second sub-partition wall comprising a same material as that of the active layer, and a third sub-partition wall comprising a same material as that of the second semiconductor layer.

8. The display device of claim 7, wherein a thickness of the third sub-partition wall is greater than a thickness of the second semiconductor layer.

9. The display device of claim 7, wherein the first partition wall further comprises a fourth sub-partition wall on the third sub-partition wall, the fourth sub-partition wall comprising an undoped semiconductor material.

10. The display device of claim 9, wherein a thickness of the fourth sub-partition wall is greater than a thickness of the second semiconductor layer.

11. The display device of claim 1, wherein a thickness of the second partition wall is greater than a thickness of the third partition wall.

12. The display device of claim 1, further comprising a second insulating film on a side of the partition wall, a side of the light emitting element, a side of the common connection electrode, and a side of the pixel electrode.

13. A display device comprising:
a first light emission area emitting first light;
a second light emission area emitting second light;
a third light emission area emitting third light;

a common connection area comprising a common connection electrode;

a partition wall partitioning the first light emission area, the second light emission area, and the third light emission area;

a pixel electrode located at each of the first light emission area, the second light emission area, and the third light emission area;

a light emitting element on the pixel electrode in each of the first light emission area, the second light emission area, and the third light emission area; and a common electrode on the light emitting element in each of the first light emission area, the second light emission area, and the third light emission area, the common electrode being in contact with an upper surface of the common connection electrode in the common connection area, wherein the partition wall comprises:

a first partition wall including a partial area comprising a same material as that of the light emitting element;

a second partition wall on the first partition wall and comprising an insulating material; and a third partition wall on the second partition wall, the third partition wall being conductive, and wherein the first partition wall, the second partition wall, and the third partition wall overlap each other in a thickness direction of a substrate of the display device.

14. The display device of claim 13, wherein the common connection area is protruded from each of the first light emission area, the second light emission area, and the third light emission area.

15. The display device of claim 13, wherein the common connection area includes a hole exposing the common connection electrode by passing through the partition wall.

16. The display device of claim 13, wherein the common connection electrode is located at an edge of each of the first light emission area, the second light emission area, and the third light emission area.

* * * * *